(12) United States Patent
Yamazaki et al.

(10) Patent No.: US 7,692,232 B2
(45) Date of Patent: Apr. 6, 2010

(54) NONVOLATILE SEMICONDUCTOR MEMORY DEVICE

(75) Inventors: Shunpei Yamazaki, Setagaya (JP); Yoshinobu Asami, Atsugi (JP); Tamae Takano, Atsugi (JP); Makoto Furuno, Atsugi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 234 days.

(21) Appl. No.: 11/723,482

(22) Filed: Mar. 20, 2007

(65) Prior Publication Data

US 2007/0221985 A1 Sep. 27, 2007

(30) Foreign Application Priority Data

Mar. 21, 2006 (JP) .............................. 2006-077897

(51) Int. Cl.
   *H01L 29/76* (2006.01)
(52) U.S. Cl. ..................................... 257/314
(58) Field of Classification Search ............... 257/288, 257/314, 315, 510
   See application file for complete search history.

(56) References Cited

U.S. PATENT DOCUMENTS

| | | | |
|---|---|---|---|
| 3,878,549 A | 4/1975 | Yamazaki et al. |
| 5,448,513 A | 9/1995 | Hu et al. |
| 5,808,336 A | 9/1998 | Miyawaki |
| 6,324,101 B1 | 11/2001 | Miyawaki |
| 6,417,538 B1 | 7/2002 | Choi |
| 6,498,369 B1 | 12/2002 | Yamazaki et al. |
| 6,518,594 B1 | 2/2003 | Nakajima et al. |
| 6,551,948 B2 | 4/2003 | Ohmi et al. |
| 6,597,034 B2 | 7/2003 | Yamazaki et al. |
| 6,613,630 B2 | 9/2003 | Lee |
| 6,699,754 B2 | 3/2004 | Huang |
| 6,713,834 B2 | 3/2004 | Mori et al. |
| 6,812,086 B2 | 11/2004 | Murthy et al. |

(Continued)

FOREIGN PATENT DOCUMENTS

CN          1744330          3/2006

(Continued)

OTHER PUBLICATIONS

European Search Report (Application No. 07005513.2) dated Jul. 10, 2007.

(Continued)

*Primary Examiner*—Calvin Lee
(74) *Attorney, Agent, or Firm*—Eric J. Robinson; Robinson Intellectual Property Law Office, P.C.

(57) ABSTRACT

A nonvolatile semiconductor memory device which is superior in writing and charge holding properties, including a semiconductor substrate in which a channel formation region is formed between a pair of impurity regions formed with an interval, and a first insulating layer, a floating gate, a second insulating layer, and a control gate over an upper layer portion of the semiconductor substrate. It is preferable that a band gap of a semiconductor material forming the floating gate be smaller than that of the semiconductor substrate. For example, it is preferable that the band gap of the semiconductor material forming the floating gate be smaller than that of the channel formation region in the semiconductor substrate by 0.1 eV or more. This is because, by decreasing the bottom energy level of a conduction band of the floating gate electrode to be lower than that of the channel formation region in the semiconductor substrate, carrier injecting and charge holding properties are improved.

32 Claims, 41 Drawing Sheets

U.S. PATENT DOCUMENTS

| | | | |
|---|---|---|---|
| 6,828,623 | B1 | 12/2004 | Guo et al. |
| 6,861,689 | B2 | 3/2005 | Burnett |
| 7,098,504 | B2 | 8/2006 | Kawashima et al. |
| 7,245,010 | B2 | 7/2007 | Powell et al. |
| 7,482,651 | B2 | 1/2009 | Bhattacharyya |
| 7,485,526 | B2 | 2/2009 | Mouli et al. |
| 7,554,854 | B2 | 6/2009 | Osame et al. |
| 2002/0079533 | A1 | 6/2002 | Horiguchi et al. |
| 2002/0093073 | A1* | 7/2002 | Mori et al. ............... 257/510 |
| 2002/0175376 | A1 | 11/2002 | Ohtani et al. |
| 2003/0049900 | A1 | 3/2003 | Forbes et al. |
| 2003/0107077 | A1 | 6/2003 | Yamazaki et al. |
| 2004/0043638 | A1 | 3/2004 | Nansei et al. |
| 2004/0104426 | A1 | 6/2004 | Forbes et al. |
| 2004/0119110 | A1 | 6/2004 | Park |
| 2005/0023577 | A1* | 2/2005 | Ito ............................ 257/288 |
| 2005/0095786 | A1 | 5/2005 | Chang et al. |
| 2005/0112820 | A1 | 5/2005 | Chen et al. |
| 2005/0230743 | A1 | 10/2005 | Nakagawa et al. |
| 2006/0003531 | A1 | 1/2006 | Chang et al. |
| 2006/0043463 | A1 | 3/2006 | Liu et al. |
| 2006/0118858 | A1 | 6/2006 | Jeon et al. |
| 2006/0186458 | A1 | 8/2006 | Forbes et al. |
| 2006/0246738 | A1 | 11/2006 | Isobe et al. |
| 2007/0132004 | A1* | 6/2007 | Yasuda et al. ............... 257/315 |
| 2007/0200167 | A1 | 8/2007 | Yamazaki |
| 2007/0221971 | A1 | 9/2007 | Yamazaki et al. |
| 2007/0228448 | A1 | 10/2007 | Yamazaki et al. |
| 2007/0228449 | A1 | 10/2007 | Takano et al. |
| 2007/0228452 | A1* | 10/2007 | Asami ...................... 257/315 |
| 2007/0228453 | A1 | 10/2007 | Yamazaki et al. |
| 2007/0230254 | A1* | 10/2007 | Osame et al. .......... 365/185.29 |
| 2007/0235793 | A1 | 10/2007 | Yamazaki et al. |
| 2007/0235794 | A1 | 10/2007 | Yamazaki et al. |
| 2009/0257283 | A1 | 10/2009 | Osame et al. |

FOREIGN PATENT DOCUMENTS

| | | |
|---|---|---|
| EP | 0 682 370 | 9/2000 |
| JP | 51-007036 | 3/1976 |
| JP | 52-023532 | 6/1977 |
| JP | 55-015869 | 4/1980 |
| JP | 03-119765 | 5/1991 |
| JP | 06-097454 | 4/1994 |
| JP | 06-244432 | 9/1994 |
| JP | 08-097307 | 4/1996 |
| JP | 02-656986 | 9/1997 |
| JP | 10-135357 | 5/1998 |
| JP | 11-040682 | 2/1999 |
| JP | 2000-058685 | 2/2000 |
| JP | 2004-221448 | 8/2004 |
| JP | 2005-347328 | 12/2005 |
| JP | 2006-114905 | 4/2006 |

OTHER PUBLICATIONS

Office Action (Application No. 200710087896.1) Dated Sep. 11, 2009.

* cited by examiner

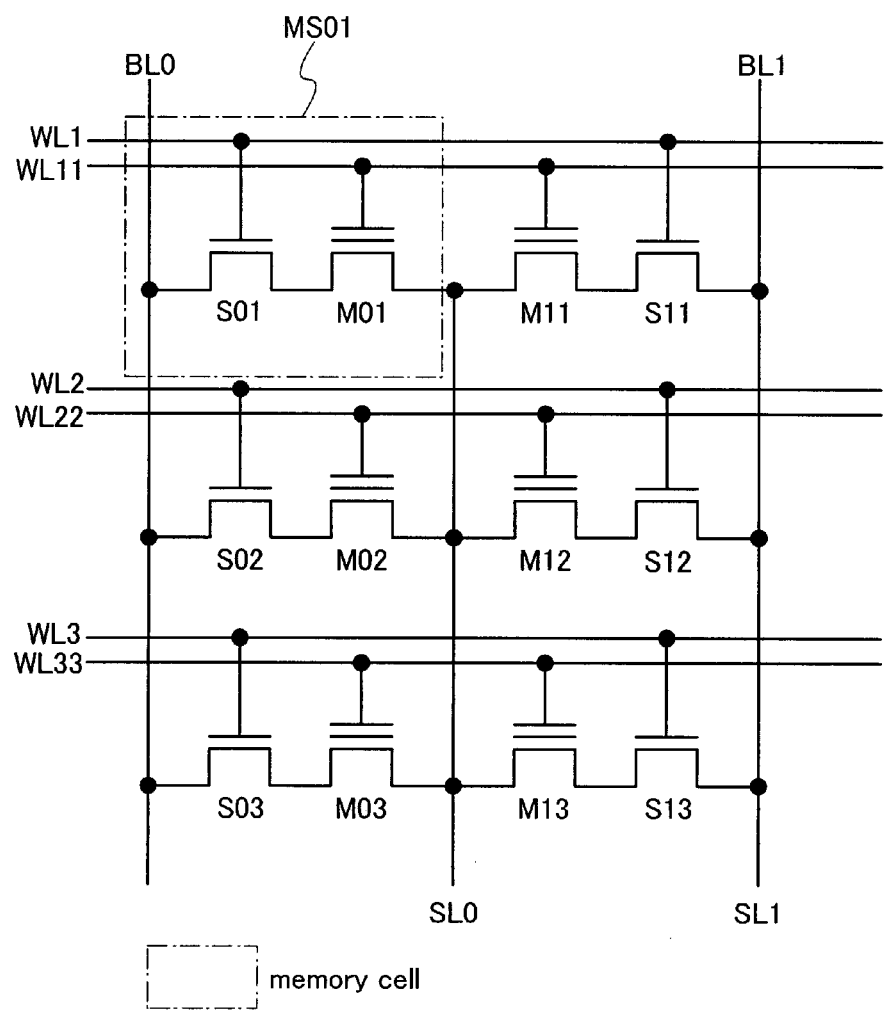

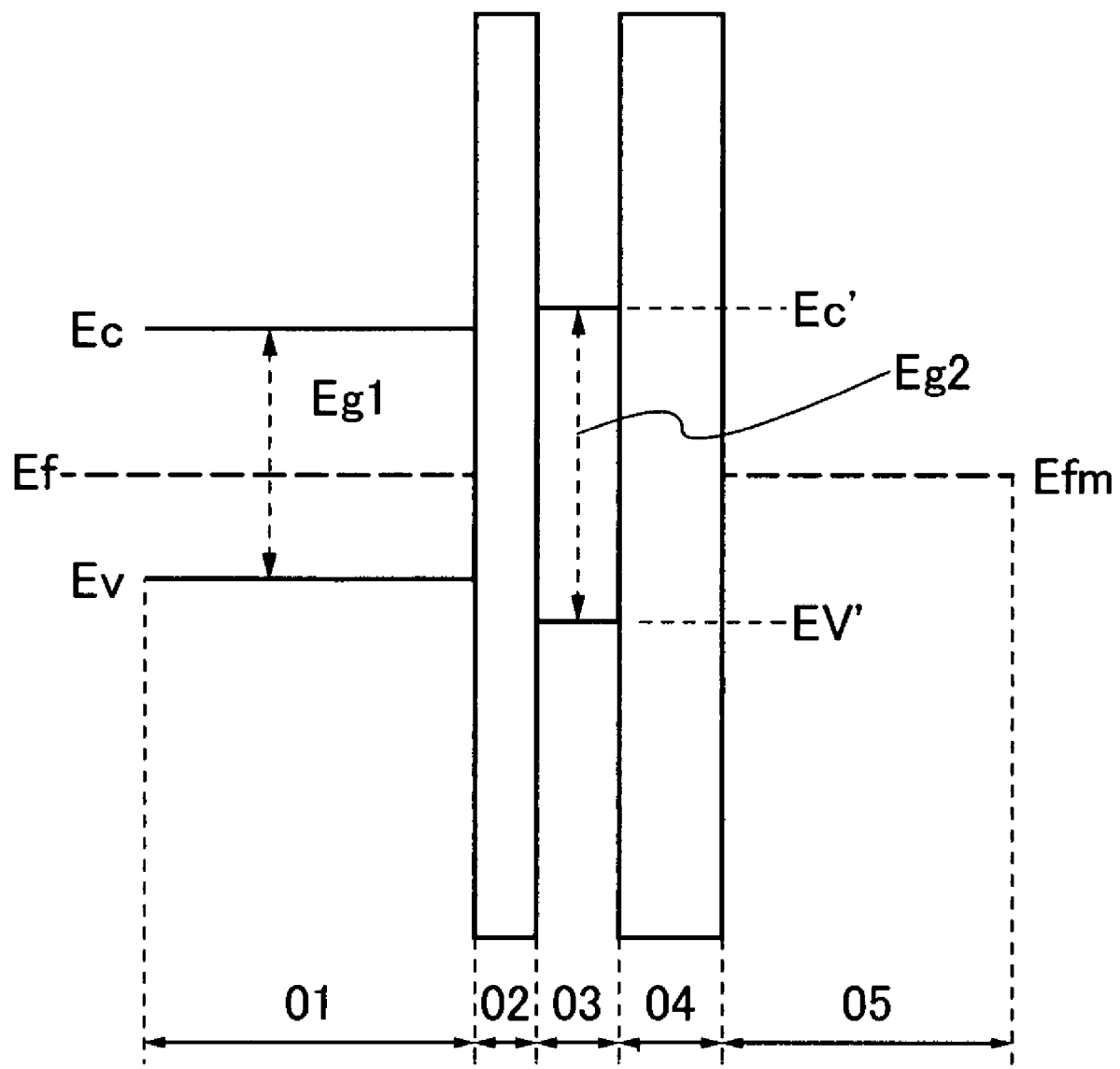

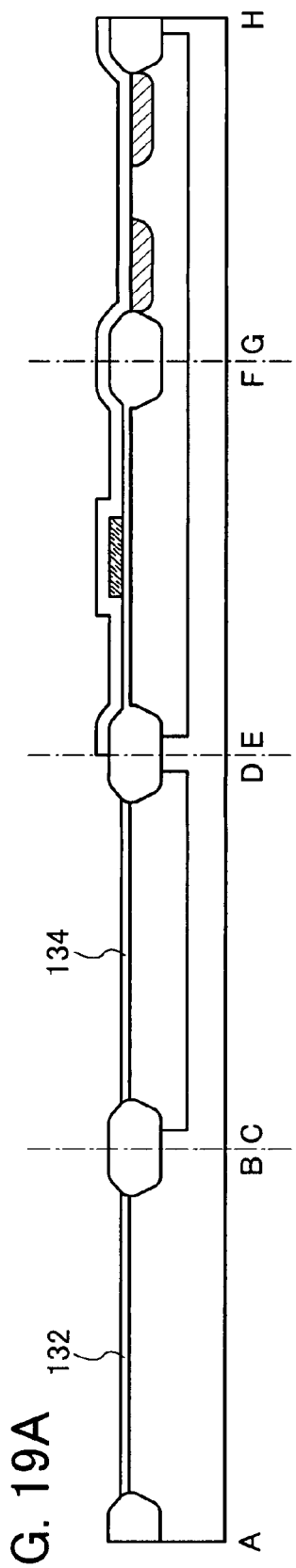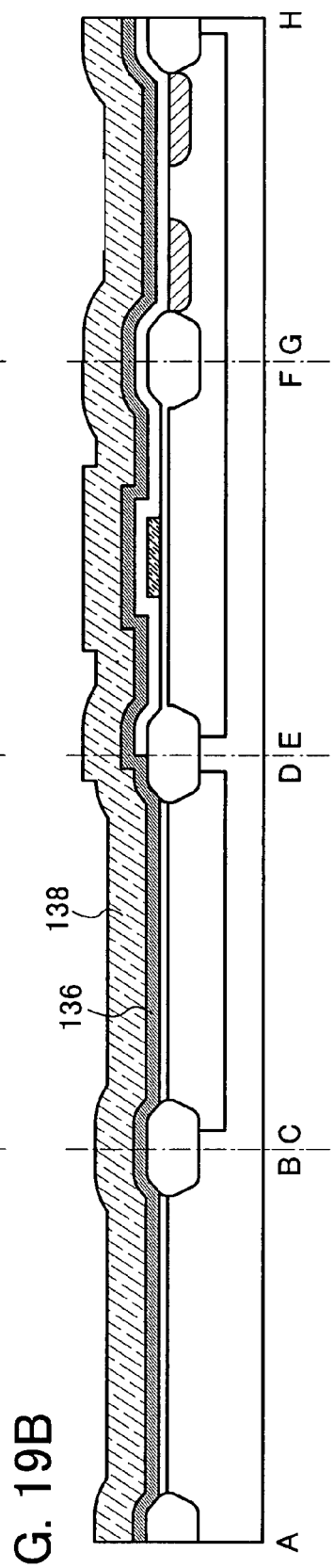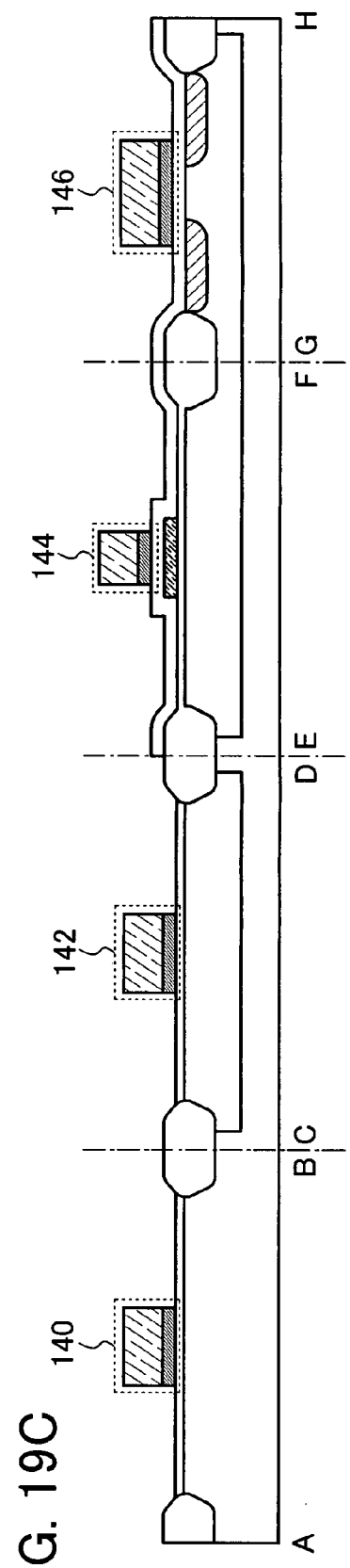

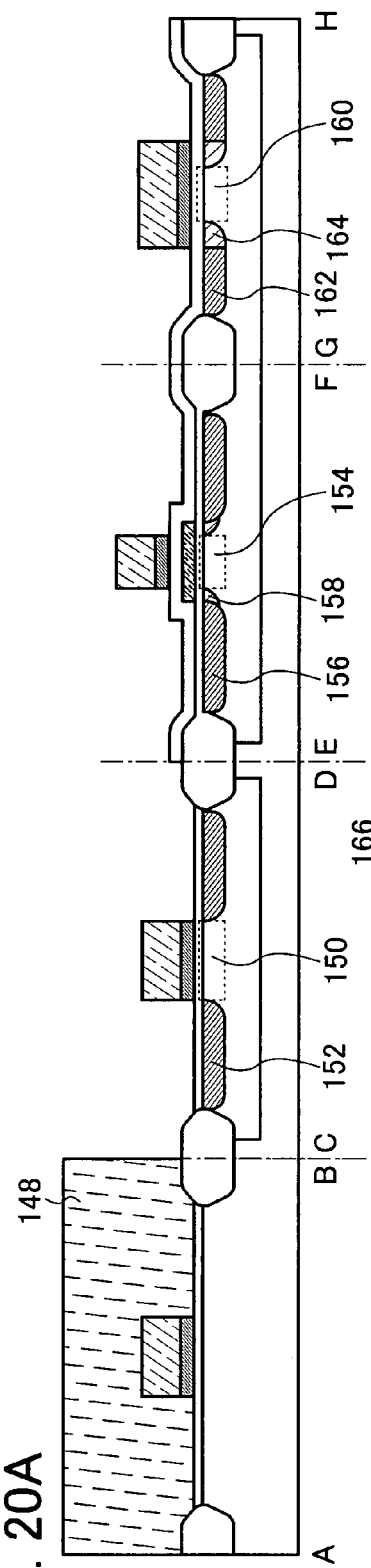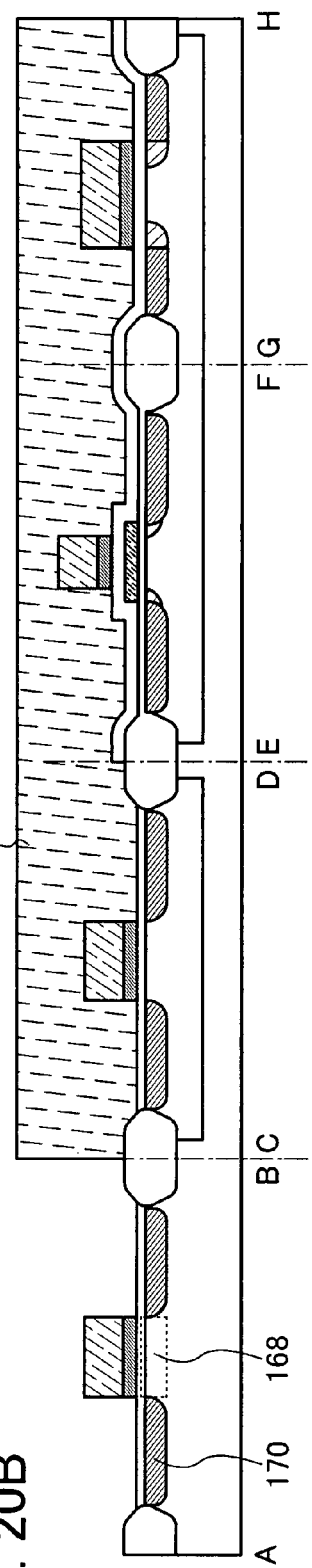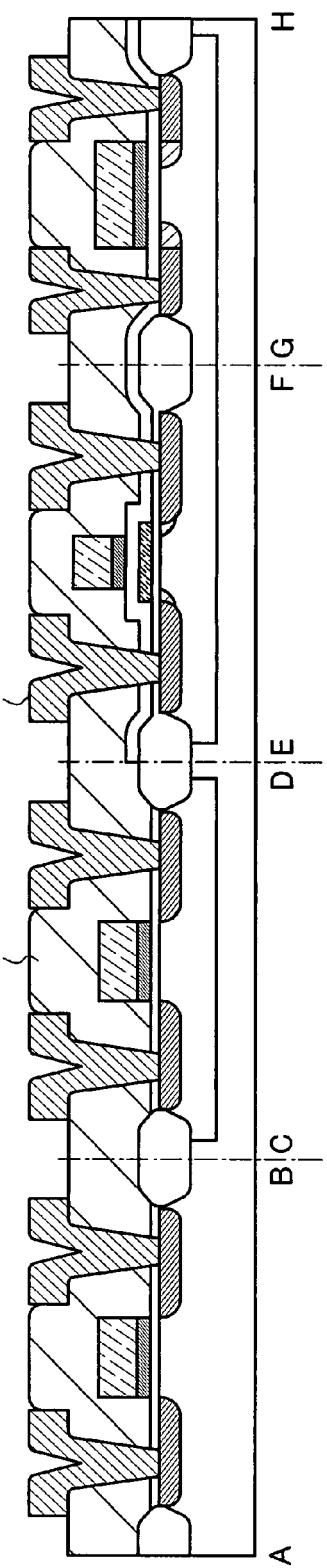

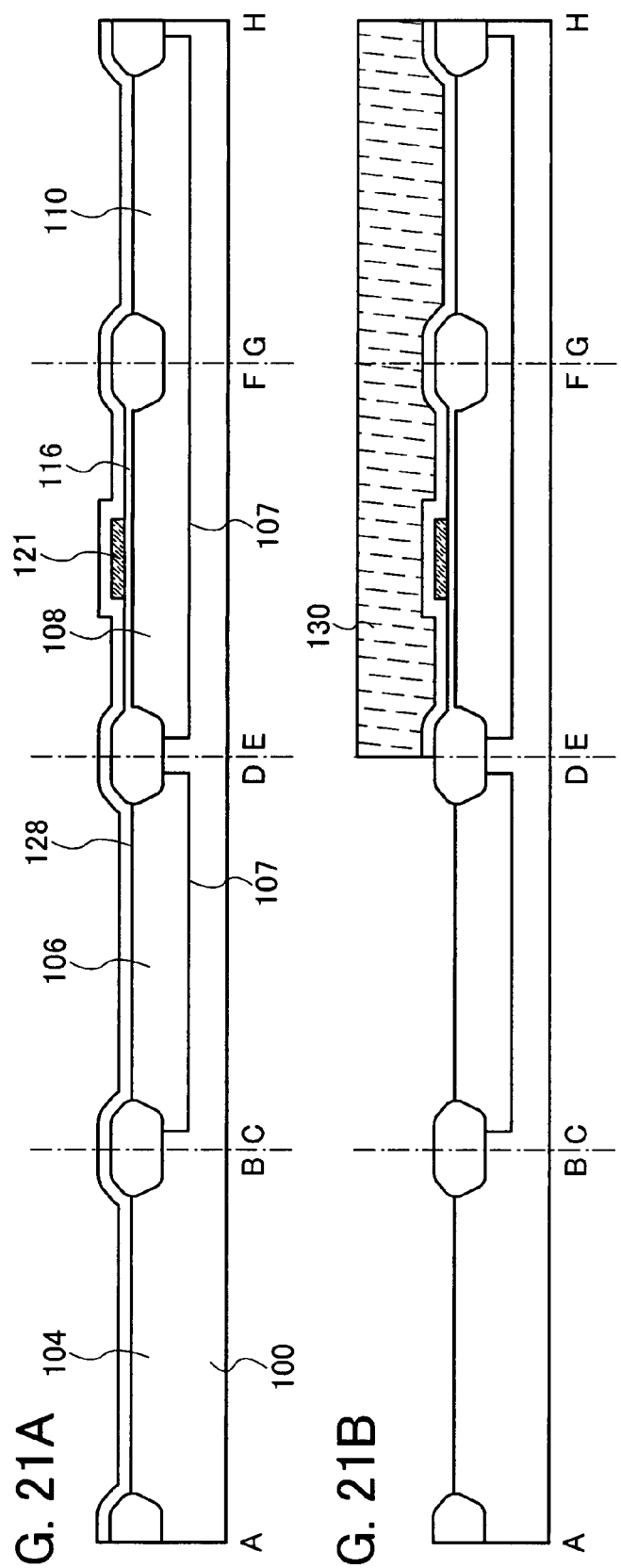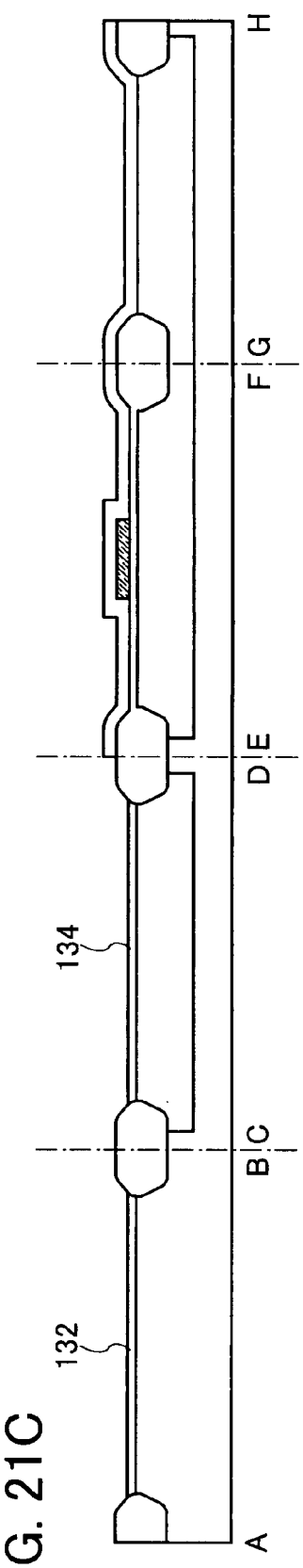
FIG. 21A
FIG. 21B
FIG. 21C

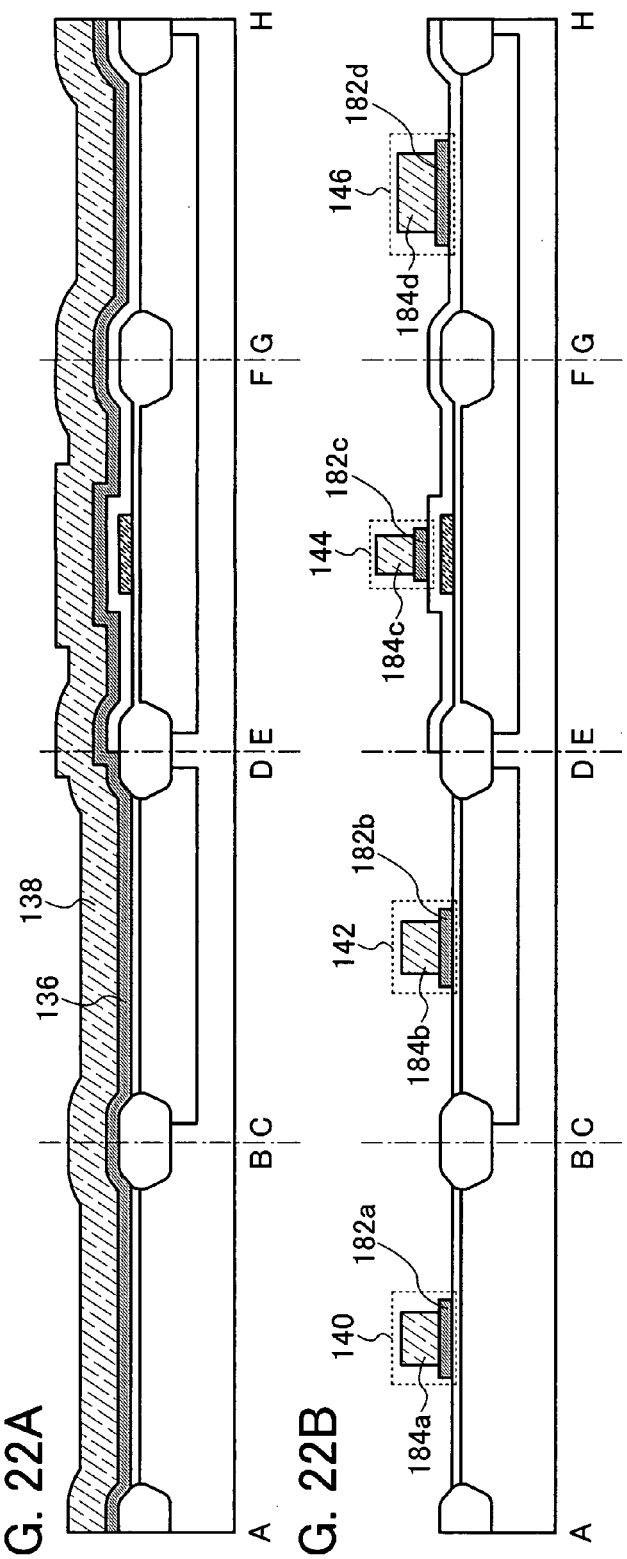

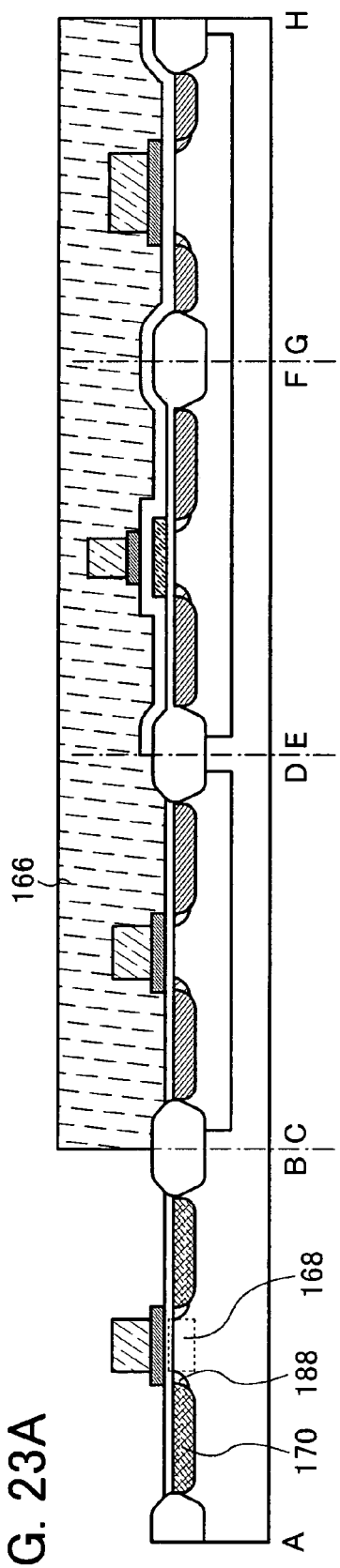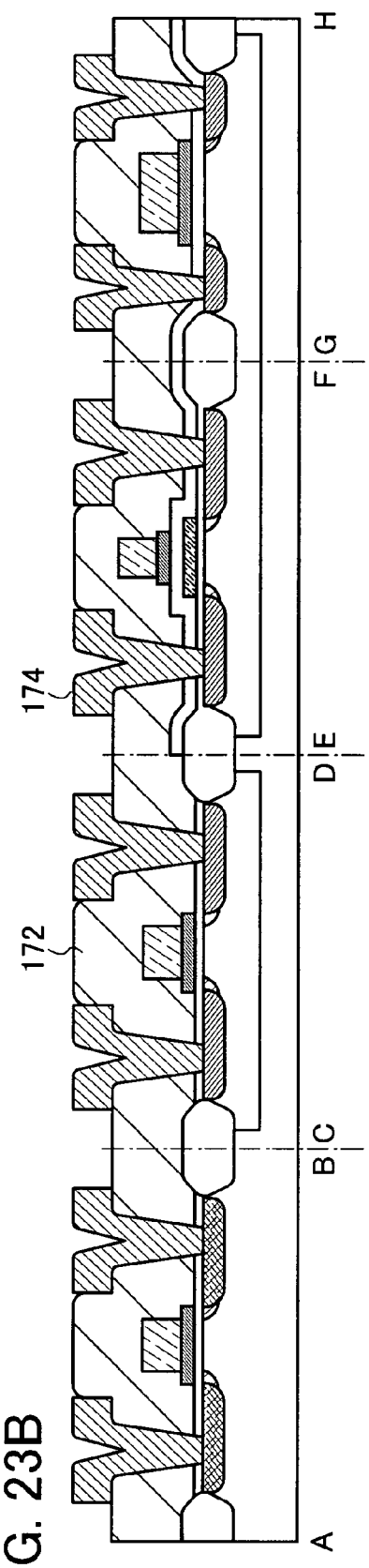

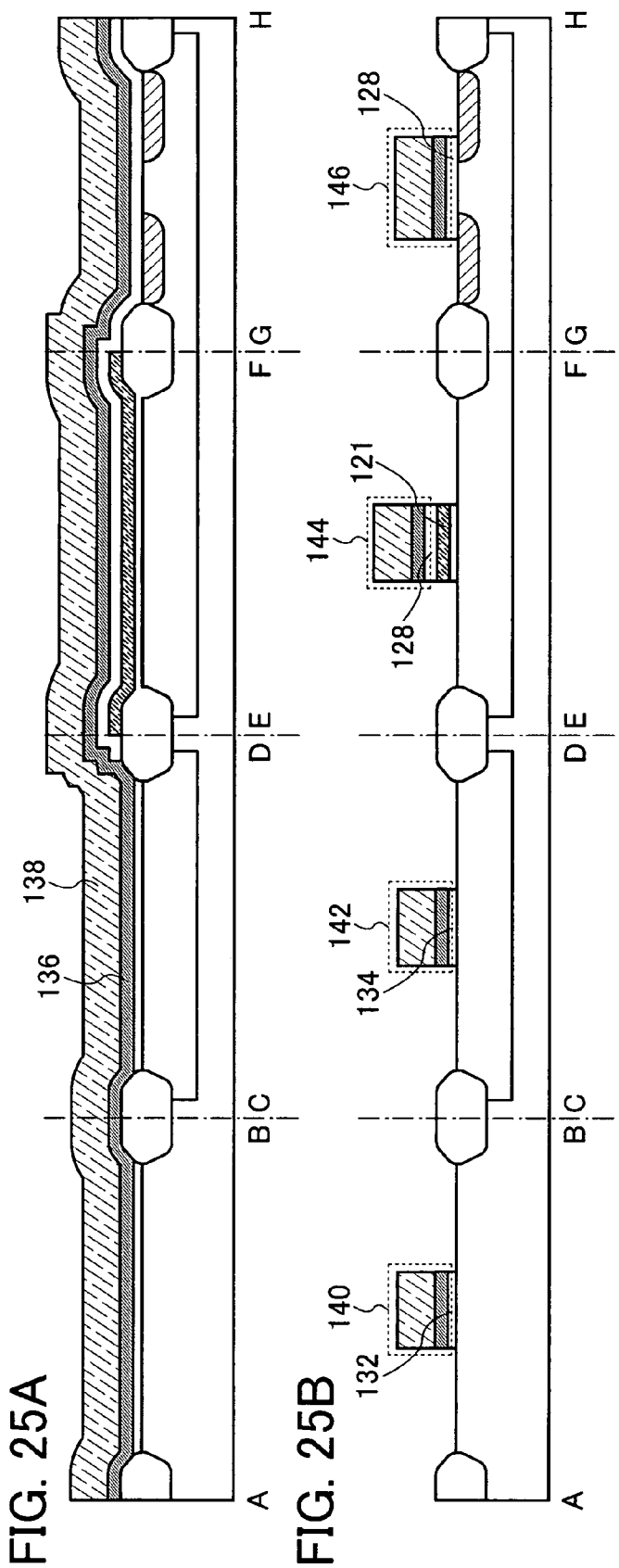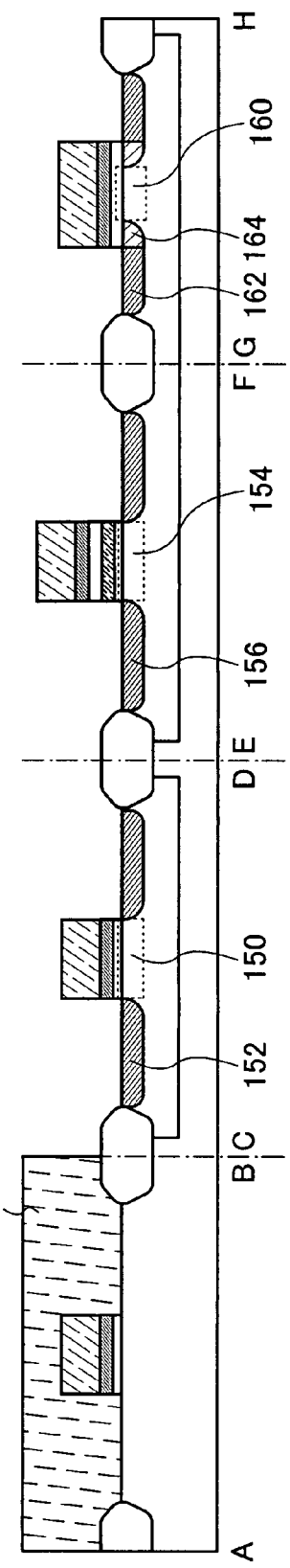
FIG. 25A
FIG. 25B
FIG. 25C

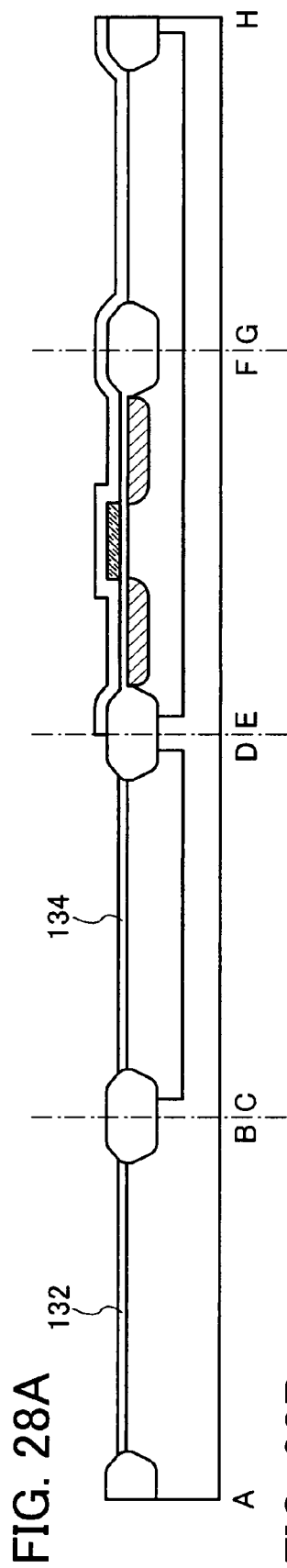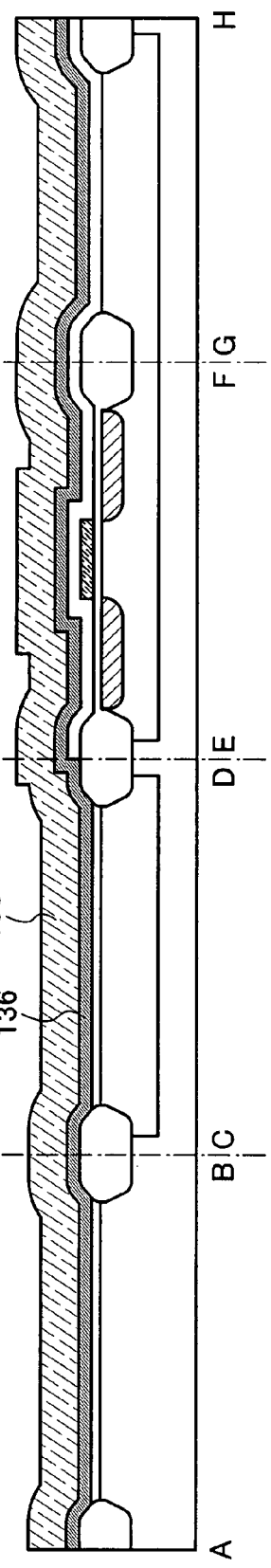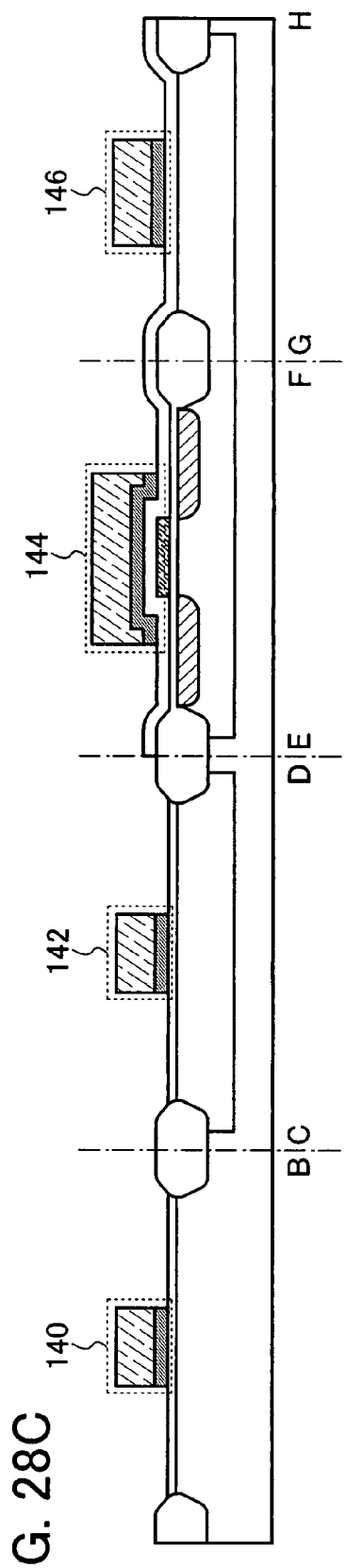

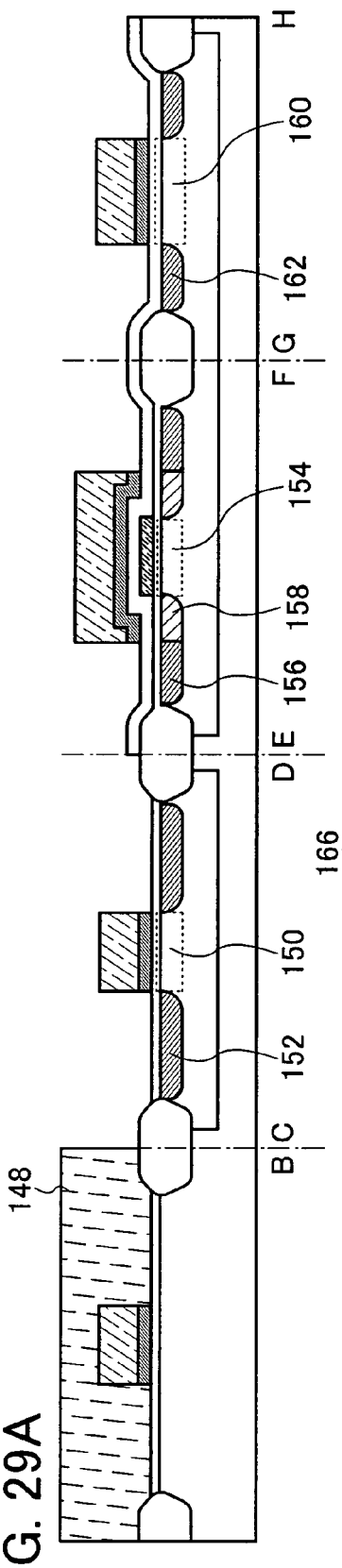
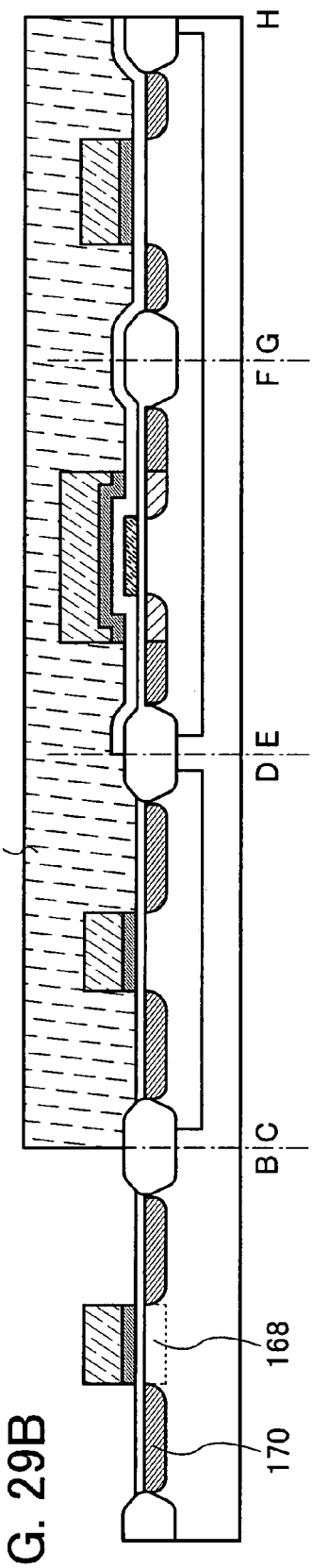
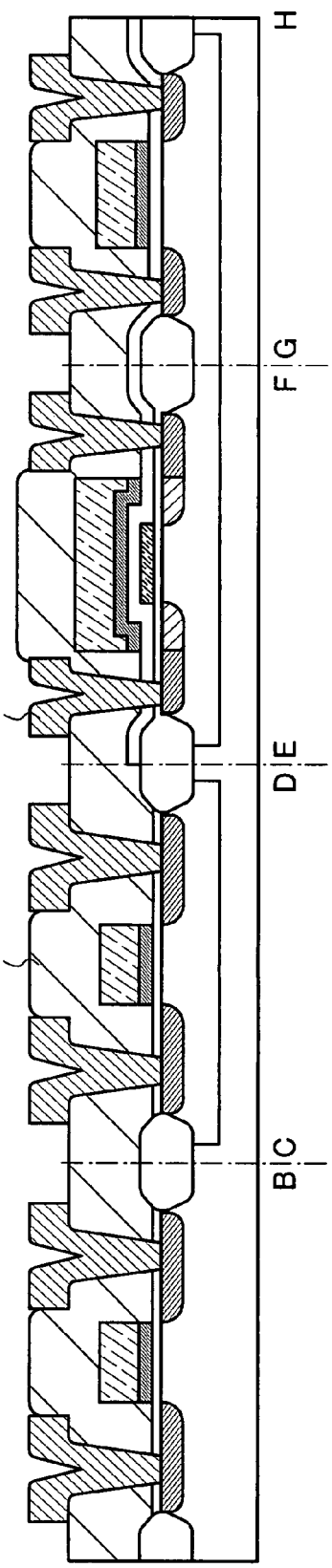
FIG. 29A
FIG. 29B
FIG. 29C

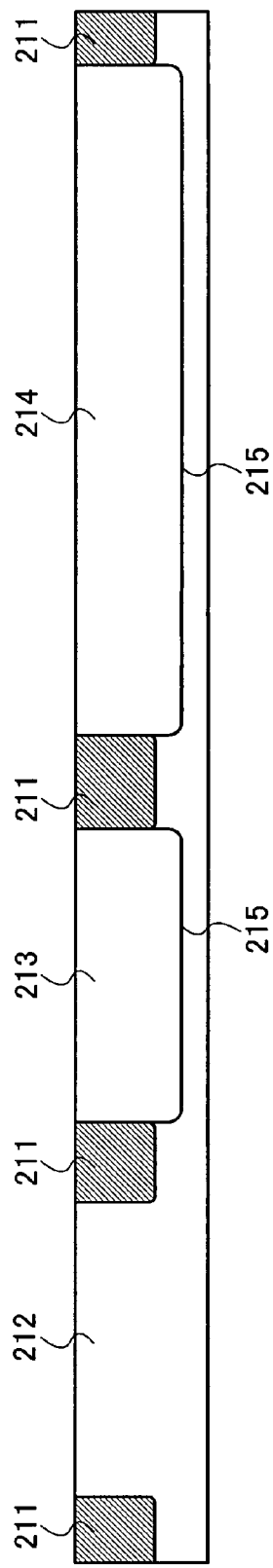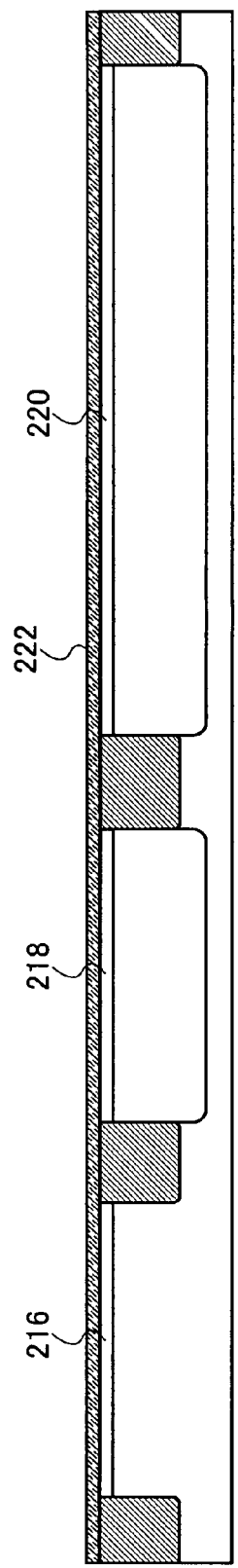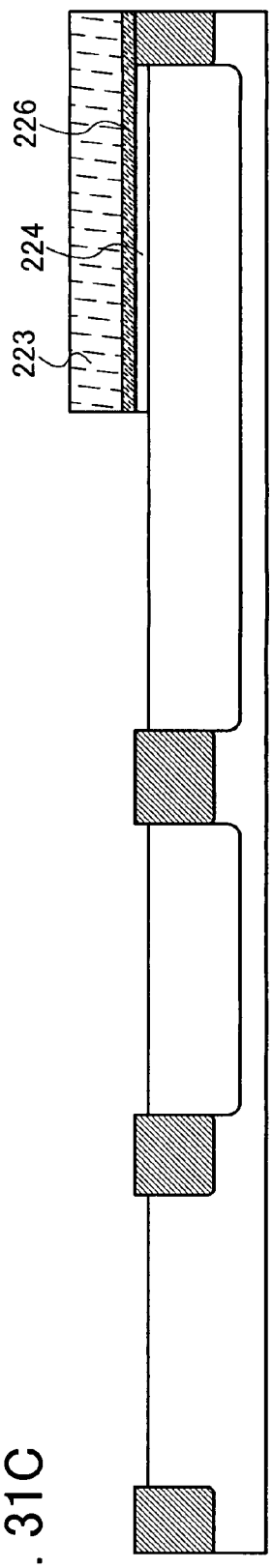

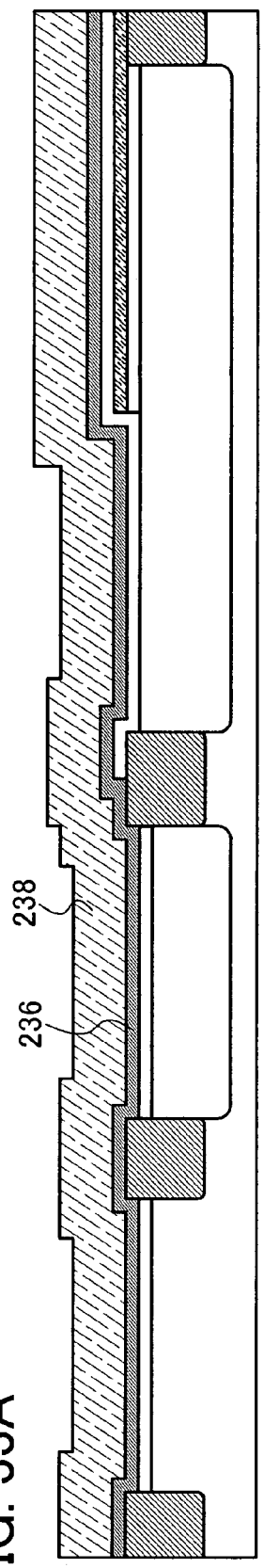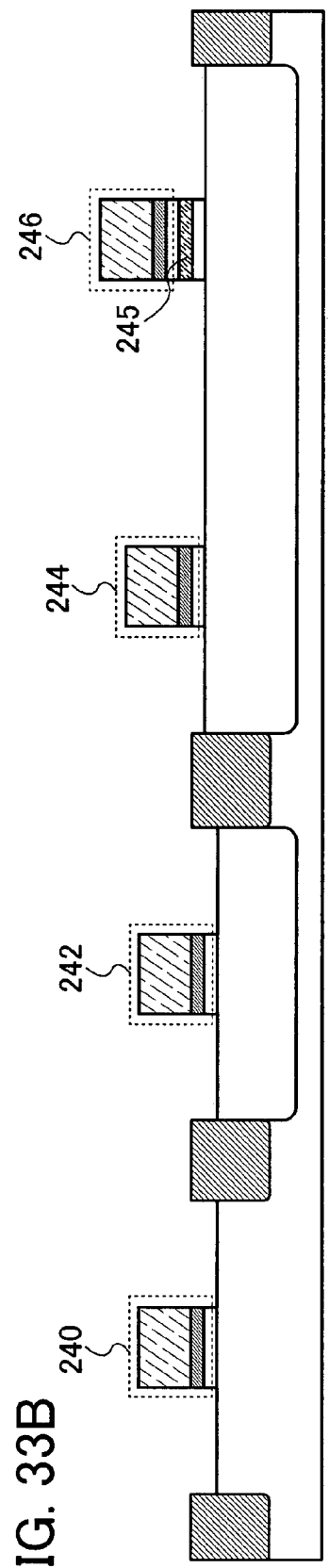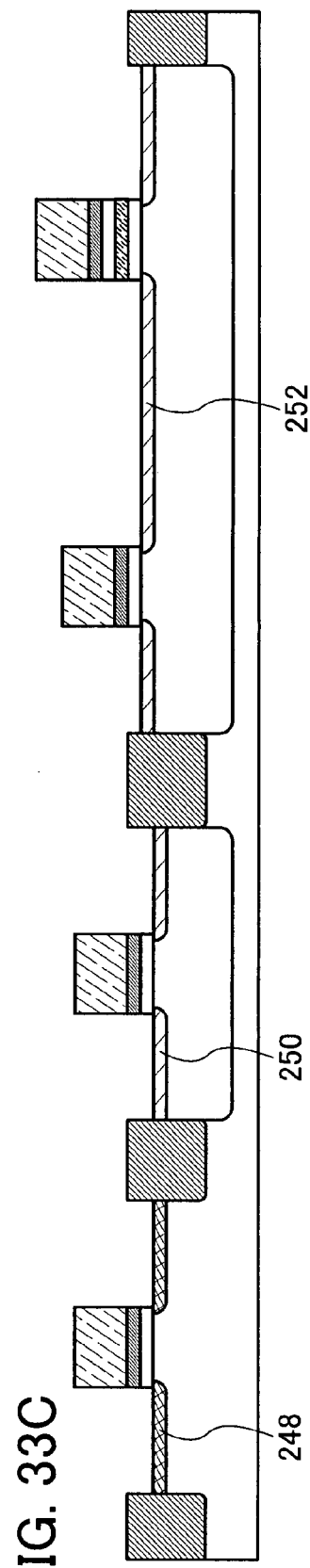

NONVOLATILE SEMICONDUCTOR MEMORY DEVICE

BACKGROUND OF THE INVENTION

1. Field of the Invention

The present invention relates to a nonvolatile semiconductor memory device capable of electrical writing, reading, and erasing, and a manufacturing method thereof. In particular, the present invention relates to a structure of a floating gate in the nonvolatile semiconductor memory device.

2. Description of the Related Art

The market has been expanding for nonvolatile memories in which data can be electrically rewritten and data can be kept stored even after the power is turned off. Features of a nonvolatile memory are that its structure is similar to that of a MOSFET (Metal Oxide Semiconductor Field Effect Transistor) and a region capable of accumulating charges for a long period of time is provided over a channel formation region. This charge accumulation region which is formed over an insulating layer and is isolated and separated from the surround is also called a floating gate. Since the floating gate is surrounded with an insulator to be electrically isolated from the surround, the floating gate has a characteristic of holding charges after the charges are injected into the floating gate. Over the floating gate, a gate electrode called a control gate is further provided with an insulating layer interposed therebetween. The control gate is distinguished from the floating gate in that a predetermined voltage is applied when data is read or written.

A so-called floating-gate-type nonvolatile memory having such a structure has a mechanism in which data is stored by electrically controlling charge injection into and charge ejection from the floating gate. Specifically, the charge injection into and charge ejection from the floating gate are performed by applying a high voltage between a semiconductor layer for forming the channel formation region and the control gate. It is said that, at this time, a Fowler-Nordheim type (F-N type) tunnel current (in the case of an NAND type) or a hot electron (in the case of an NOR type) flows into the insulating layer over the channel formation region. For this reason, this insulating layer is also called a tunnel insulating layer.

The floating-gate-type nonvolatile memory is required to have a characteristic of holding charges accumulated in the floating gate for ten years or more of time in order to assure the reliability. Therefore, as for the tunnel insulating layer, it is required to form at a thickness with which the tunnel current can flow and have a high insulating property so as not to leak charges.

In addition, the floating gate formed over the tunnel insulating layer has been formed of silicon which is the same semiconductor material as that of the semiconductor for forming the channel formation region. For example, a method of forming the floating gate by using polycrystalline silicon has been spread, such as a floating gate formed by stacking a polysilicon film with a thickness of 400 nm (see page 7 and FIG. 7 in Japanese Published Patent Application No. 2000-58685)

SUMMARY OF THE INVENTION

The floating gate of the nonvolatile memory which is formed of polycrystalline silicon has the same bottom energy level of a conduction band as that in the channel formation region of the semiconductor substrate. Furthermore, when the thickness of the polycrystalline silicon of the floating gate is decreased, the bottom energy level of the conduction band of the floating gate gets higher than that of the semiconductor layer for forming the channel formation region. If such a state is formed, it becomes difficult to inject electrons from the semiconductor substrate to the floating gate, so that a writing voltage is required to be increased. In order to reduce the writing voltage as much as possible, in the nonvolatile memory in which the floating gate is formed of polycrystalline silicon, the Fermi level is required to be shifted toward the conduction band by adding an n-type impurity element such as phosphorus or arsenic into the floating gate.

As for the gate insulating layer provided between the floating gate and the semiconductor substrate, the thickness thereof is required to be small sequentially to inject charges to the floating gate by a low voltage. On the other hand, in order to hold charges stably for a long period of time, the thickness thereof is required to be large so that charge leakage or impurity penetration is prevented.

After all, the conventional nonvolatile memory requires a high writing voltage, and ensures the reliability against degradation of a charge holding property due to a repeat of writing, by performing a treatment such as error detection and error correction with a redundant memory cell provided or a controller devised.

In view of the foregoing, it is an object of the present invention to provide a nonvolatile semiconductor memory device which is superior in writing property and charge holding property.

The present invention relates to a nonvolatile semiconductor memory device including a semiconductor substrate in which a channel formation region is formed between a pair of impurity regions formed with an interval, and a first insulating layer, a floating gate, a second insulating layer, and a control gate which are provided at a position of an upper layer portion of the semiconductor substrate and about overlapped with the channel formation region. In the present invention, the floating gate is formed of a semiconductor material. The semiconductor material can be selected from plural kinds of materials depending on a semiconductor material forming the channel formation region.

The semiconductor material forming the floating gate which satisfies one or a plurality of the following conditions can be selected. It is preferable that a band gap of the semiconductor material forming the floating gate be smaller than that of the channel formation region in the semiconductor substrate. For example, it is preferable that there be a difference of 0.1 eV or more between the band gap of the semiconductor material forming the floating gate and that of the channel formation region in the semiconductor substrate, and the former be smaller than the latter.

In addition, it is preferable that the semiconductor material have a higher electron affinity than the material forming the semiconductor substrate. As for the semiconductor material, it is preferable that a barrier energy with respect to electrons of the floating gate, formed from the first insulating layer be higher than that with respect to electrons of the channel formation region in the semiconductor substrate, formed from the first insulating layer.

It is preferable that the semiconductor material forming the floating gate be typically germanium or a germanium compound.

The floating gate which is applied to a nonvolatile semiconductor memory device of the present invention in order to accumulate charges is not limited to germanium or a germanium compound as long as the similar function is provided, namely it functions as charge accumulating layer, and can also be replaced with oxide or nitride of the germanium or the germanium compound, or an oxide layer or a nitride layer containing the germanium or the germanium compound.

When a floating gate is formed over a semiconductor substrate with a first insulating layer which functions as a tunnel insulating layer interposed therebetween, by forming the floating gate of a semiconductor material at least containing germanium, it becomes easy to inject charges from the channel formation region in the semiconductor substrate to the floating gate, and a charge holding property in the floating gate can be improved.

Further, by forming the floating gate of a material having similar characteristics to those of silicon, a nonvolatile semiconductor memory device with superior properties can be manufactured without decrease in productivity. Germanium which is a material of Group 14 in the Periodic Table of the Elements that is the same as silicon and is a semiconductor enables microfabrication of a thin film without imposing a burden on a manufacturing apparatus.

BRIEF DESCRIPTION OF DRAWINGS

FIG. 8 is a diagram showing one example of an equivalent circuit of a nonvolatile memory cell array.

FIG. 16 is a band diagram of a conventional nonvolatile memory.

FIGS. 19A to 19C are diagrams showing one example of a manufacturing method of a nonvolatile semiconductor memory device of the present invention.

FIGS. 20A to 20C are diagrams showing one example of a manufacturing method of a nonvolatile semiconductor memory device of the present invention.

FIGS. 21A to 21C are diagrams showing one example of a manufacturing method of a nonvolatile semiconductor memory device of the present invention.

FIGS. 22A to 22C are diagrams showing one example of a manufacturing method of a nonvolatile semiconductor memory device of the present invention.

FIGS. 23A and 23B are diagrams showing one example of a manufacturing method of a nonvolatile semiconductor memory device of the present invention.

FIGS. 25A to 25C are diagrams showing one example of a manufacturing method of a nonvolatile semiconductor memory device of the present invention.

FIGS. 28A to 28C are diagrams showing one example of a manufacturing method of a nonvolatile semiconductor memory device of the present invention.

FIGS. 29A to 29C are diagrams showing one example of a manufacturing method of a nonvolatile semiconductor memory device of the present invention.

FIGS. 31A to 31C are diagrams showing one example of a manufacturing method of a nonvolatile semiconductor memory device of the present invention.

FIGS. 33A to 33C are diagrams showing one example of a manufacturing method of a nonvolatile semiconductor memory device of the present invention.

DETAILED DESCRIPTION OF THE INVENTION

Although the present invention will be fully described by way of an embodiment mode and embodiments with reference to the accompanying drawings, the present invention is not limited to the description and it is to be understood that various changes and modifications will be apparent to those skilled in the art. Therefore, unless such changes and modifications depart from the scope of the present invention, they should be construed as being included therein. Note that the same ones may be denoted by the same reference symbols throughout the drawings in each structure of the present invention described below.

Embodiment Mode 1

Figure 1:
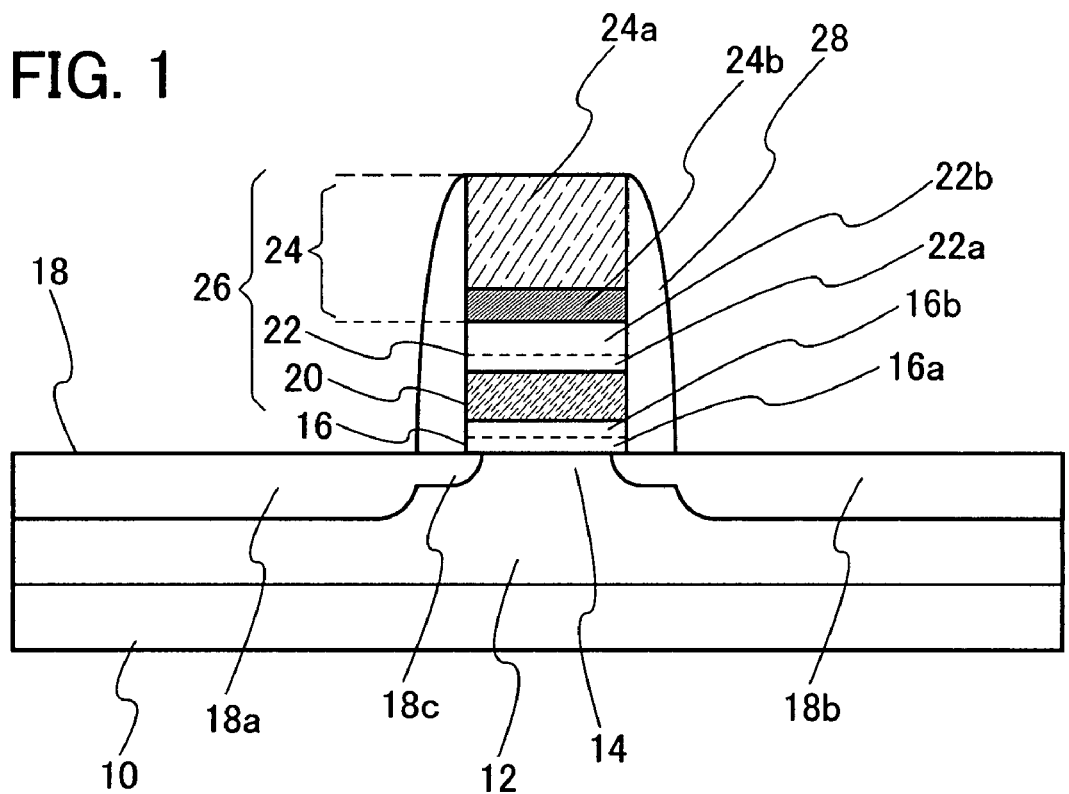
FIG. 1 is a cross-sectional diagram for describing a main structure of a nonvolatile semiconductor memory device of the present invention.

FIG. 1 is a cross-sectional diagram for describing a main structure of a nonvolatile semiconductor memory device of the present invention. FIG. 1 particularly illustrates a substantial part of the nonvolatile memory element. This nonvolatile memory element is manufactured using a semiconductor substrate 10. As the semiconductor substrate 10, a single crystalline silicon substrate (silicon wafer) is preferably used. Alternatively, an SOI (Si-On-Insulator) substrate can be used. As the SOI substrate, a so-called SIMOX (Separation by Implanted Oxygen) substrate may be used which is manufactured by implanting oxygen ions into a mirror-polished wafer and then performing high-temperature annealing so that an oxide film layer is formed at a position with a certain depth from a top surface as well as a defect occurred in a top surface layer is vanished.

In the case where the substrate 10 is of an n-type, a p-well 12 into which a p-type impurity is injected is formed. As the p-type impurity, boron is, for example, used and added at a concentration of approximately $5 \times 10^{15}$ cm$^{-3}$ to $1 \times 10^{16}$ cm$^{-3}$. By forming the p-well 12, an n-channel transistor can be formed in this region. Further, the p-type impurity added into the p-well 12 also has an effect of controlling the threshold voltage of a transistor. A channel formation region 14 which is formed in the semiconductor substrate 10 is formed in a region almost corresponding to a gate 26 described later, and is located between a pair of impurity regions 18 formed in the semiconductor substrate 10.

The pair of impurity regions 18 are regions which function as a source and a drain in a nonvolatile memory element. The pair of impurity regions 18 are formed by adding phosphorus or arsenic which is an n-type impurity at a concentration of about $1 \times 10^{19}$ cm$^{-3}$ to $1 \times 10^{21}$ cm$^{-3}$.

A spacer 28 is formed on a side wall of the gate 26, which has an effect of preventing a leakage current (e.g., a current which flows between a floating gate electrode 20 and a control gate electrode 24) at an end portion of the gate 26. Further, by utilizing this spacer 28, low-concentration impurity regions 18c can be formed at both ends of the gate 26 in the channel-length direction. The low-concentration impurity regions 18c function as low-concentration drains (LDDs). Although the low-concentration impurity regions 18c are not necessarily provided, by providing the regions, an electrical field on a drain edge can be alleviated so that degradation caused by repeat writing and erasing can be suppressed.

Over the semiconductor substrate 10, a first insulating layer 16, the floating gate electrode 20, a second insulating layer 22, and a control gate electrode 24 are formed. In this specification, the stacked-layer structure from the floating gate electrode 20 to the control gate electrode 24 may be called the gate 26.

The first insulating layer 16 can be formed of silicon oxide or with a stacked-layer structure of silicon oxide and silicon nitride. The first insulating layer 16 may be formed by oxidizing a surface of the semiconductor substrate 10 by thermal oxidation; however, the first insulating layer 16 is preferably formed by solid-phase oxidation or solid-phase nitridation with plasma treatment. This is because an insulating layer which is formed by oxidizing or nitriding the surface of the semiconductor substrate 10 with plasma treatment is dense, high in withstand voltage, and superior in reliability. Since the first insulating layer 16 is used as a tunnel insulating layer for injecting charges into the floating gate electrode 20, such a strong insulating layer is preferable. This first insulating layer 16 is preferably formed with a thickness of 1 nm to 20 nm inclusive, more preferably 3 nm to 6 nm inclusive. For example, when the gate length is 600 nm, the first insulating layer 16 can be formed with a thickness of 3 nm to 6 nm inclusive.

In the solid-phase oxidation treatment or the solid-phase nitridation treatment with plasma treatment, it is preferable to use plasma which is excited with a microwave (typically, 2.45 GHz), of which the electron density is $1 \times 10^{11}$ cm$^{-3}$ or more and $1 \times 10^{13}$ cm$^{-3}$ or less, and the electron temperature is 0.5 eV or more and 1.5 eV or less. This is because a practical reaction rate can be obtained as well as a dense insulating layer can be formed at a temperature of 500° C. or less in the solid-phase oxidation treatment or the solid-phase nitridation treatment.

The oxidation of the surface of the semiconductor substrate 10 with this plasma treatment is performed in an oxygen atmosphere (e.g., in an atmosphere containing oxygen (O$_2$) or dinitrogen monoxide (N$_2$O) and a rare gas (containing at least one of He, Ne, Ar, Kr, and Xe) or in an atmosphere containing oxygen or dinitrogen monoxide and hydrogen (H$_2$) and a rare gas). The nitridation of the surface of the semiconductor substrate 10 with this plasma treatment is performed in a nitrogen atmosphere (e.g., in an atmosphere containing nitrogen (N$_2$) and a rare gas (containing at least one of He, Ne, Ar, Kr, and Xe), in an atmosphere containing nitrogen, hydrogen, and a rare gas, or in an atmosphere containing NH$_3$ and a rare gas). As the rare gas, Ar can be used for example. Further, a gas in which Ar and Kr are mixed may also be used.

Figure 15:
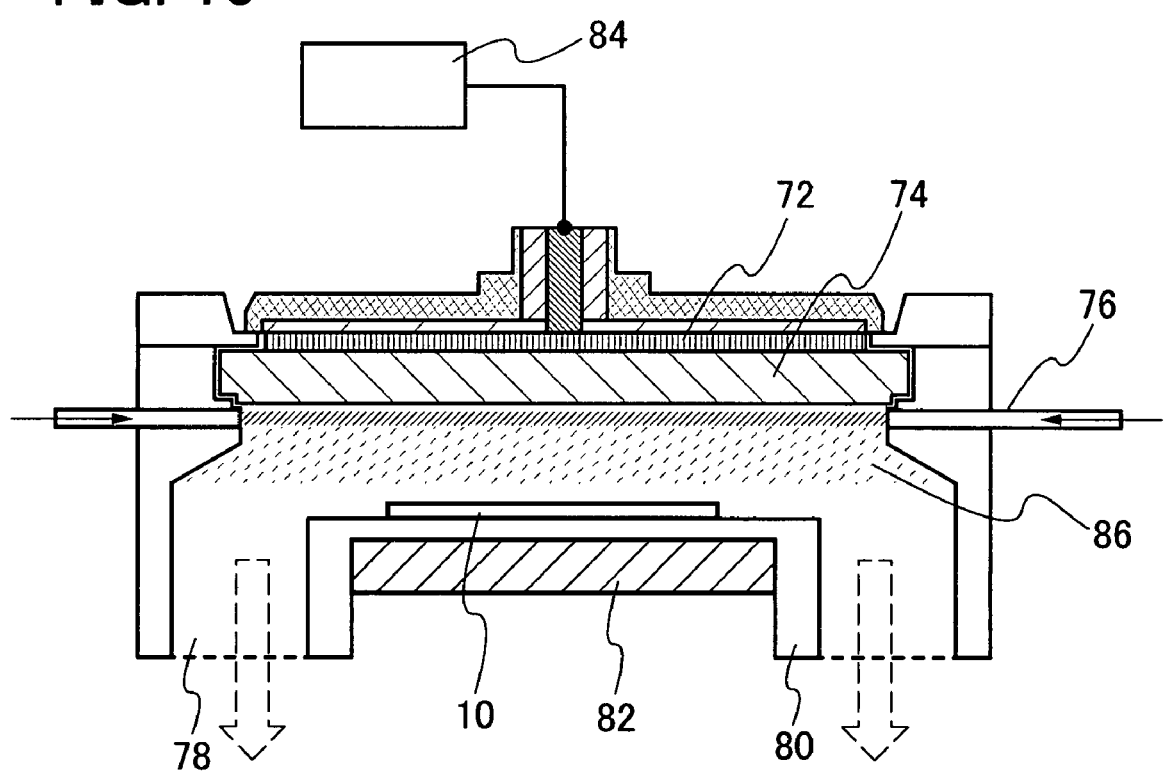
FIG. 15 is a diagram describing a structure of a plasma treatment apparatus.

FIG. 15 shows a structural example of an apparatus for performing plasma treatment. This plasma treatment apparatus includes a supporting base 80 for disposing the semiconductor substrate 10, a gas supplying portion 76 for introducing a gas, an exhaust outlet 78 connected to a vacuum pump for exhausting a gas, an antenna 72, a dielectric plate 74, and a microwave supplying portion 84 for supplying a microwave for generating plasma. In addition, by providing a temperature controlling portion 82 for the supporting base 80, the temperature of the semiconductor substrate 10 can also be controlled.

Plasma treatment will be described below. Note that the plasma treatment includes oxidation treatment, nitridation treatment, oxynitridation treatment, hydrogenation treatment, and surface reforming treatment to a semiconductor substrate, an insulating layer, and a conductive layer. In each treatment, a gas supplied from the gas supplying portion 76 can be selected in accordance with its purpose.

Oxidation treatment or nitridation treatment may be performed as follows. First, a treatment chamber is evacuated, and a plasma treatment gas containing oxygen or nitrogen is introduced from the gas supplying portion 76. The semiconductor substrate 10 is heated to room temperature or a temperature of 100° C. to 550° C. by the temperature controlling portion 82. Note that the distance between the semiconductor substrate 10 and the dielectric plate 74 is approximately 20 mm to 80 mm (preferably, 20 mm to 60 mm). Next, microwaves are supplied to the antenna 72 from the microwave supplying portion 84. Then, the microwaves are introduced into the treatment chamber from the antenna 72 through the dielectric plate 74, thereby plasma 86 is generated. By exciting plasma with microwave introduction, plasma with a low electron temperature (3 eV or less, preferably 1.5 eV or less) and a high electron density ($1\times10^{11}$ cm$^{-3}$ or more) can be generated. With oxygen radicals (which may include OH radicals) and/or nitrogen radicals (which may include NH radicals) generated by this high-density plasma, the surface of the semiconductor substrate can be oxidized and/or nitrided. By mixing a rare gas such as argon into the plasma treatment gas, oxygen radicals or nitrogen radicals can be effectively generated by excited species of the rare gas. This method enables solid-phase oxidation, solid-phase nitridation, or solid-phase oxynitridation, or nitridation of an oxidized layer at a low temperature of 500° C. or less by efficiently utilizing the active radicals excited with the plasma.

In FIG. 1, one preferable mode of the first insulating layer 16 formed by plasma treatment is a stacked-layer structure where a silicon oxide layer 16a is formed with a thickness of 3 nm to 6 nm inclusive on the surface of the semiconductor substrate 10 by plasma treatment in an oxygen atmosphere and then a silicon nitride layer 16b is formed by nitriding a surface of the silicon oxide layer 16a in a nitrogen atmosphere. As a typical example of the first insulating layer 16, by oxidizing the surface of the semiconductor substrate 10 by plasma treatment, a dense oxide film without distortion can be formed. Furthermore, by nitriding the oxide film by plasma treatment so that oxygen in the top layer portion is replaced with nitrogen to form a nitride layer, the density can be further improved. Consequently, an insulating layer which is high in withstand voltage can be formed.

The floating gate electrode 20 is formed over the first insulating layer 16. For the floating gate electrode 20, a semiconductor material is preferably used, and a semiconductor material which satisfies one or a plurality of the following conditions can be selected.

It is preferable that a band gap of the semiconductor material forming the floating gate electrode 20 be smaller than that of the semiconductor substrate 10 (here the channel formation region). For example, it is preferable that there be a difference of 0.1 eV or more between the band gap of the semiconductor material forming the floating gate and that of the channel formation region in the semiconductor substrate 10, and the former be smaller than the latter. This is because, by decreasing the bottom energy level of a conduction band of the floating gate electrode 20 to be lower than that of the channel formation region in the semiconductor substrate 10, a carrier (electron) injecting property is improved and a charge holding property is improved.

It is preferable that the semiconductor material forming the floating gate electrode 20 have a higher electron affinity than the material forming the semiconductor substrate 10. This is because, by decreasing the bottom energy level of the conduction band of the floating gate electrode 20 to be lower than that of the channel formation region in the semiconductor substrate 10, the carrier (electron) injecting property is improved and the charge holding property is improved. The electron affinity is, in the case of a semiconductor, an energy difference from the bottom of the conduction band to the vacuum.

As for the material forming the floating gate electrode 20, it is preferable that a barrier energy with respect to electrons of the floating gate electrode 20, formed from the first insulating layer 16 be higher than that with respect to electrons of the channel formation region in the semiconductor substrate 10, formed from the first insulating layer 16. This is because it becomes easy to inject charges (electrons) from particularly the channel formation region in the semiconductor substrate 10 into the floating gate electrode and charges are prevented from being vanished from the floating gate electrode 20.

As the semiconductor material which satisfies the over conditions, germanium or a germanium compound can be typically selected. As a typical example of the germanium compound, silicon-germanium can be given, and which preferably contains germanium at 10 atomic % or more with respect to silicon in this case. This is because an effect as a constituting element is weakened and the band gap does not become small effectively if the concentration of the germanium is less than 10 atomic %.

It is needless to say that another material can also be used for forming the floating gate electrode 20 as long as the similar effect is developed. For example, a ternary semiconductor material containing germanium can be used. The semiconductor material can also be hydrogenated. Further, as long as a function as a charge accumulating layer of a nonvolatile memory element is provided, it can also be replaced with oxide or nitride of the germanium or the germanium compound, or an oxide layer or a nitride layer containing the germanium or the germanium compound.

The second insulating layer 22 is formed of a single layer or a plurality of layers of silicon oxide, silicon oxynitride ($SiO_xN_y(x>y)$), silicon nitride ($SiN_x$), silicon nitride oxide ($SiN_xO_y(x>y)$), aluminum oxide ($Al_xO_y$), or the like by low-pressure CVD, plasma CVD, or the like. The thickness of the second insulating layer 22 is 1 nm or more and 20 nm or less, preferably 5 nm or more and 10 nm or less. For example, a stack of a silicon nitride layer 22a with a thickness of 3 nm and a silicon oxide layer 22b with a thickness of 5 nm can be used. Further, a nitride film may also be formed by performing plasma treatment to the floating gate electrode 20 to perform nitridation treatment to a surface of the floating gate electrode 20 (e.g., germanium nitride in the case where germanium is used for the floating gate electrode 20). In either case, by providing a nitride film or a layer to which nitridation treatment is performed on the one side or both sides of the first insulating layer 16 and the second insulating layer 22, contacted with the floating gate electrode 20, oxidation of the floating gate electrode 20 can be prevented.

The control gate electrode 24 is preferably formed of a metal selected from tantalum (Ta), tungsten (W), titanium (Ti), molybdenum (Mo), chromium (Cr), silicon (Si), or the like, or an alloy material or a compound material containing the metal as a main component. Further, polycrystalline silicon added with an impurity element such as phosphorus can also be used. Further alternatively, a staked-layer structure of a metal nitride layer 24a including one layer or a plurality of layers and a metal layer 24b described above may also be formed as the control gate electrode 24. As the metal nitride, tungsten nitride, molybdenum nitride, or titanium nitride can be used. By providing the metal nitride layer 24a, adhesion of the metal layer 24b can be improved and layer peeling can be prevented. Further, since the metal nitride such as tantalum nitride has a high work function, the first insulating layer 16 can be formed thick as a joint result with the second insulating layer 22.

An operation mechanism of the nonvolatile memory element shown in FIG. 1 will be described with reference to band diagrams. In the band diagrams described below, the same elements as those in FIG. 1 are denoted by the same reference symbols.

Figure 2:
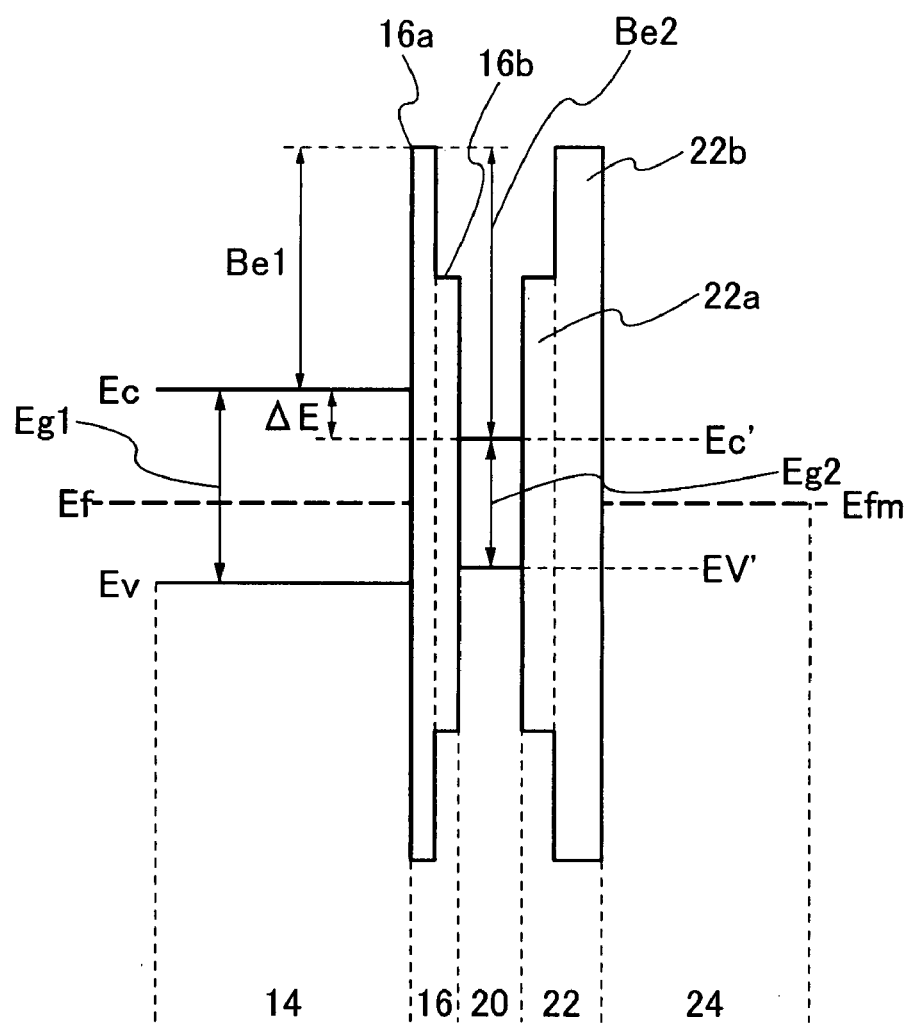
FIG. 2 is a band diagram of a nonvolatile memory.

FIG. 2 shows the state where the channel formation region in the semiconductor substrate 10, the first insulating layer 16, the floating gate electrode 20, the second insulating layer 22, and the control gate electrode 24 are stacked. FIG. 2 shows the case where no voltage is applied to the control gate electrode 24 and a Fermi level Ef of the channel formation region in the semiconductor substrate 10 and a Fermi level Efm of the control gate electrode 24 are equal to each other.

The semiconductor substrate 10 and the floating gate electrode 20 are formed of different materials with the first insulating layer 16 interposed therebetween. They are combined such that a band gap Eg1 (an energy difference between a bottom end Ec of a conduction band and a top end Ev of a valence band) of the channel formation region in the semiconductor substrate 10 is different from a band gap Eg2 of the floating gate electrode 20 and the latter band gap is smaller. For example, silicon (1.12 eV) for the channel formation region in the semiconductor substrate 10, and germanium (0.72 eV) or silicon-germanium (0.73 eV to 1.0 eV) for the floating gate electrode 20 can be combined. Note that the first insulating layer 16 is illustrated by the silicon oxide layer 16a (about 8 eV) and the silicon nitride layer 16b (about 5 eV) which is obtained by nitriding the silicon oxide with plasma treatment. Further, the second insulating layer 22 also has the state where the silicon nitride layer 22a and the silicon oxide layer 22b are stacked on the floating gate electrode 20 side.

Note that in the case where the vacuum level is 0 eV, the energy level of conduction band of silicon is −4.05 eV and the energy level of conduction band of germanium is −4.1 eV. Further, the energy level of conduction band of silicon oxide is −0.9 eV. Therefore, by thus combining the channel formation region in the semiconductor substrate 10 and the floating gate electrode 20 with each other, a barrier energy (Be2) with respect to electrons of the floating gate electrode 20, formed from the first insulating layer 16 can be higher than a barrier energy (Be1) with respect to electrons of the channel formation region in the semiconductor substrate 10, formed from the first insulating layer 16. That is, barrier energies with respect to electrons, namely the first barrier energy Be1 and the second barrier energy Be2 have different values where the relationship of Be2>Be1 can be satisfied.

Further, at this state, the band gap Eg1 of silicon of the channel formation region in the semiconductor substrate 10 and the band gap Eg2 of germanium of the floating gate electrode 20 satisfy a relationship of Eg1>Eg2. Further, when considering the electron affinity as described above, an energy difference $\Delta E$ of the bottom energy of the conduction band between the channel formation region in the semiconductor substrate 10 and the floating gate electrode 20 occurs. As described later, this energy difference $\Delta E$, which acts so as to accelerate electrons when the electrons are injected from the channel formation region in the semiconductor substrate 10 to the floating gate electrode 20, contributes to decrease in a writing voltage.

For comparison, a band diagram in the case where a channel formation region in a semiconductor substrate and a floating gate electrode are formed of the same semiconductor material is shown in FIG. 16. This band diagram shows the state where a semiconductor substrate 01, a first insulating layer 02, a floating gate electrode 03, a second insulating layer 04, and a control gate electrode 05 are stacked sequentially.

Basically, the thickness of the floating gate electrode 03 is preferably made as thin as the channel length, or more preferably made thinner than the channel length, in order to form a fine pattern at the submicron level. This is because a fine pattern cannot be formed with respect to the gate length if the thickness is large. However, as the floating gate electrode 03 becomes thinner, the band gap gets larger in the case where the floating gate electrode 03 is formed of the same silicon semiconductor as a channel formation region in the semiconductor substrate. That is, the bottom energy level of conduction band of the floating gate electrode 03 gets higher than that of the channel formation region in the semiconductor substrate.

FIG. 16 shows this state. The band gap of the channel formation region in the semiconductor substrate 01 is denoted by Eg1 and the band gap of the floating gate electrode 03 is denoted by Eg2. It is said that the band gap of silicon is increased to be approximately 1.4 eV in the state of a thin film from 1.12 eV in the bulk state. Consequently, an energy difference $\Delta E$ so as to decelerate injection of electrons occurs between the semiconductor substrate 01 and the floating gate electrode 03. In this state, a high voltage is required to inject electrons from the semiconductor substrate 01 to the floating gate electrode 03. That is, in order to decrease the writing voltage, the floating gate electrode 03 is required to be doped with phosphorus or arsenic as an n-type impurity at a high concentration; this is a problem of a conventional nonvolatile memory.

However, as shown in FIG. 2, in the case of using germanium for the floating gate electrode 20, the band gap itself is as small as 0.72 eV which is smaller than silicon. The band gap of germanium becomes at most approximately 1 eV even if the band gap is increased by thinning its film, which keeps the state smaller than the band gap of the channel formation region in the semiconductor substrate 10. Consequently, with respect to electrons injected from the channel formation region, a self-bias generated from the bottom energy difference between the conduction bands acts so as to accelerate the injection of the electrons into the floating gate electrode 20. By adding phosphorus or arsenic which is an n-type impurity into the germanium, the action can be further promoted.

Accordingly, by using germanium or a germanium compound for forming the floating gate electrode 20, the thickness can be made small and a finer structure can be manufactured. In particular, in the case where the channel length of a nonvolatile memory element is 100 nm or less, preferably 20 nm or more and 50 nm or less, the thickness of the floating gate electrode of germanium or a germanium compound which may be doped with an n-type impurity can be small, which is desirable for ultra-high integration.

In addition, since addition of an n-type impurity at a high concentration into the floating gate electrode tends to decrease the withstand voltage, such a high concentration is not preferable. Accordingly, it is preferable to use germanium or a germanium compound having conductive properties into which an n-type or a p-type impurity is not added intentionally or an n-type impurity is added at a concentration of $1\times10^{18}$ cm$^{-3}$ to $2\times10^{20}$ cm$^{-3}$. In view of this, it is preferable that the concentration of carbon (C), nitrogen (N), or oxygen (O) which is an impurity tending to insulate the layer including germanium, contained in the floating gate electrode formed of germanium or a germanium compound, be $5\times10^{19}$ cm$^{-3}$ or less, more preferably be $2\times10^{19}$ cm$^{-3}$ or less.

There are the following methods for injecting electrons into the floating gate electrode 20: a method utilizing hot electrons and a method utilizing FN tunnel currents. In the case of utilizing hot electrons, a positive voltage is applied to the control gate electrode 24 and a high voltage is applied to a drain to generate hot electrons. Thus the hot electrons can be injected into the floating gate electrode 20. In the case of utilizing FN tunnel currents, a positive voltage is applied to the control gate electrode 24 so that electrons are injected into the floating gate electrode 20 from the channel formation region in the semiconductor substrate 10 by using FN tunnel currents.

Figure 6A:
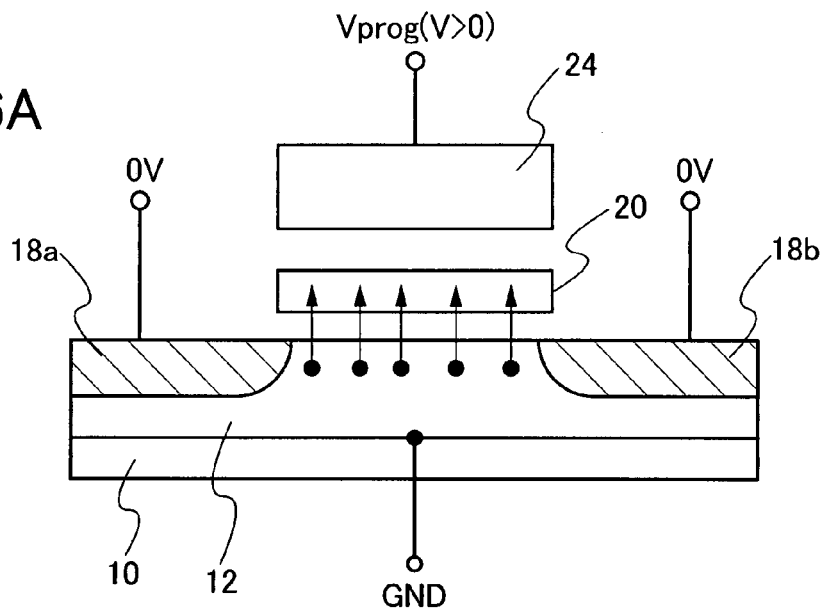
FIGS. 6A and 6B are diagrams describing writing and reading operations of a nonvolatile memory.

Voltages which are applied when electron injection into the floating gate electrode 20 is performed by using FN tunnel currents are shown in FIG. 6A. The p-well 12 of the semiconductor substrate 10 is grounded, a positive high voltage (10 V to 20 V) is applied to the control gate electrode 24, and 0 V is applied to a source region 18a and a drain region 18b. A band diagram at this time is FIG. 3. Electrons in the channel formation region in the semiconductor substrate 10 are injected into the first insulating layer 16 by a high electrical field, and FN tunnel currents flow. As described in FIG. 2, the relationship between the band gap Eg1 of the channel formation region in the semiconductor substrate 10 and the band gap Eg2 of the floating gate electrode 20 is Eg1>Eg2. This difference acts as a self-bias so as to accelerate electrons injected from the channel formation region toward the floating gate electrode. Accordingly, an injecting property of electrons can be improved.

The bottom energy level of conduction band of the floating gate electrode 20 is lower than the bottom energy level of conduction band of the channel formation region in the semiconductor substrate 10 by $\Delta E$. Therefore, an internal electrical field caused by this energy difference acts when injecting electrons into the floating gate electrode 20; this is realized by the above-described combination of the channel formation region in the semiconductor substrate 10 and the floating gate electrode 20. That is, it becomes easy to inject electrons from the channel formation region in the semiconductor substrate 10 into the floating gate electrode 20 so that a writing property in the nonvolatile memory element can be improved. This effect is similar also to the case of electron injection into the floating gate electrode 20 by utilizing hot electrons.

Figure 4:
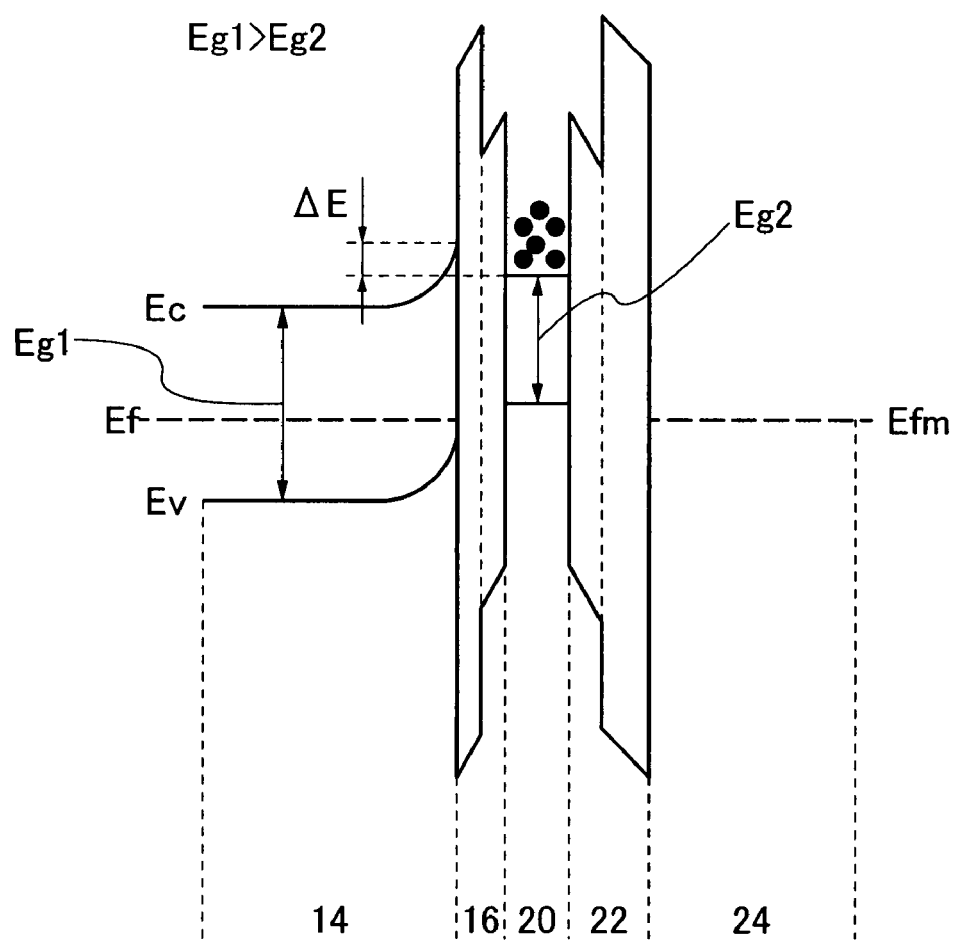
FIG. 4 is a band diagram of a nonvolatile memory in the state of charge holding.

During a period in which electrons are held in the floating gate electrode 20, the threshold voltage of the nonvolatile memory element is shifted in a positive direction. This state can be denoted by a state where data "0" is written. FIG. 4 is a band diagram in the state of charge holding. Electrons of the floating gate electrode 20 which are sandwiched between the first insulating layer 16 and the second insulating layer 22 are kept in energetically. Although the potential is increased by the carriers (electrons) accumulated in the floating gate electrode 20, the electrons are not discharged from the floating gate electrode 20 unless an energy which is higher than the barrier energy is provided for the electrons. Further, since the bottom energy level of conduction band of the floating gate electrode 20 is lower than the bottom energy level of conduction band of the channel formation region in the semiconductor substrate 10 by $\Delta E$, a barrier energy with respect to electrons is formed. Due to this barrier energy, the electrons can be prevented from being discharged into the semiconductor substrate 10 by tunnel currents. That is, also in the reliability test while leaving at a constant temperature of 150° C., charges accumulated in the floating gate electrode can be held.

Figure 6B:
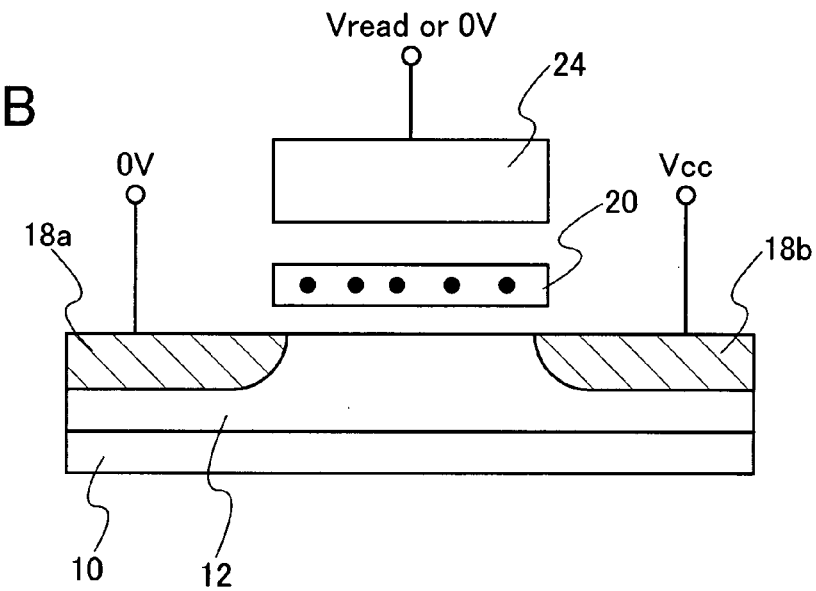

The state where data "0" is written can be detected by such detection with a circuit that the transistor is not turned on when applying a midpoint potential $V_{read}$ to the control gate electrode 24. The midpoint potential is a midpoint potential between a threshold voltage Vth1 in the case where data is "1" and a threshold voltage Vth2 in the case where data is "0" (in this case, Vth1<$V_{read}$<Vth2). Alternatively, it can be judged by whether the nonvolatile memory element is turned on or not when a bias is applied between the source region 18a and the drain region 18b and 0 V or a midpoint potential $V_{read}$ of the threshold values of data "0" and data "1" is applied to the control gate electrode 24 as shown in FIG. 6B.

Figure 7A:
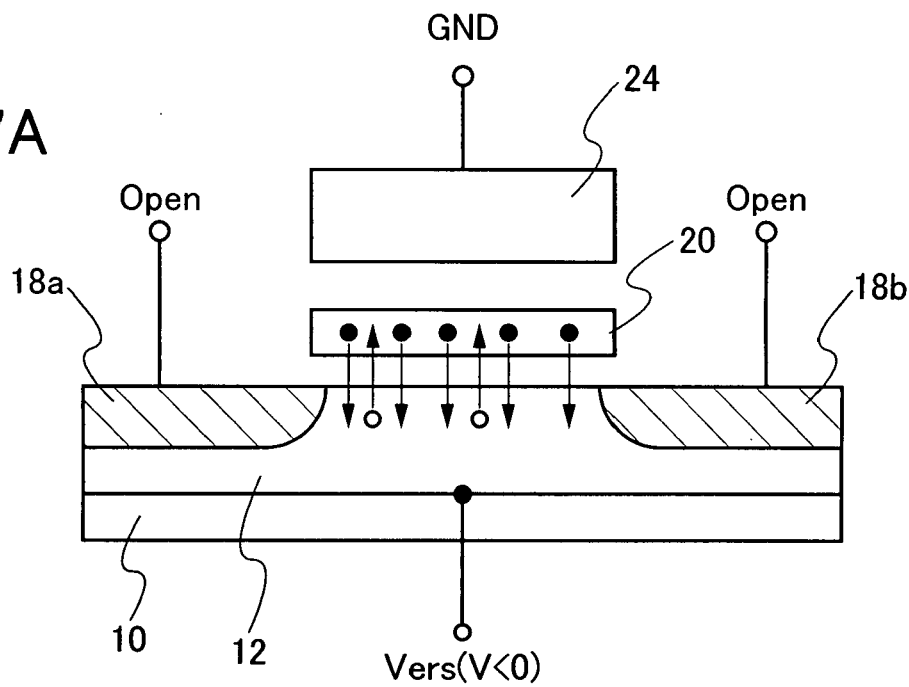
FIGS. 7A and 7B are diagrams describing an erasing operation of a nonvolatile memory.
Figure 7B:
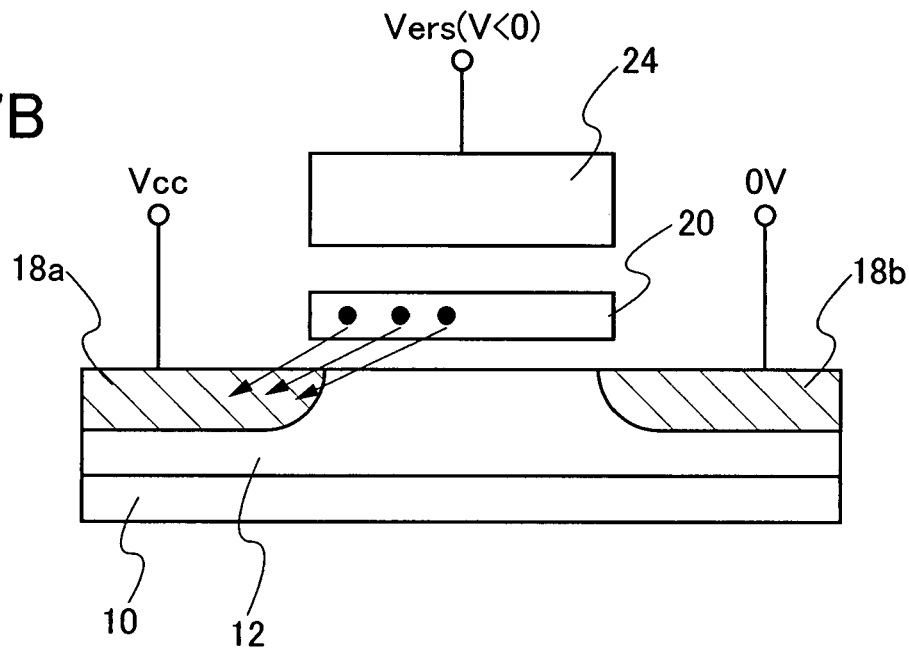

FIG. 7A shows the state where charges are discharged from the floating gate electrode 20 so that data is erased from the nonvolatile memory element. In this case, the control gate electrode 24 is grounded and a negative bias is applied to the p-well 12 of the semiconductor substrate 10, so that FN tunnel currents flow between the channel formation region in the semiconductor substrate 10 and the floating gate electrode 20. Alternatively, as shown in FIG. 7B, a negative bias may be applied to the control gate electrode 24 and a positive high voltage may be applied to the source region 18a; so that FN tunnel currents may be generated to extract electrons from the source region 18a side.

Figure 5:
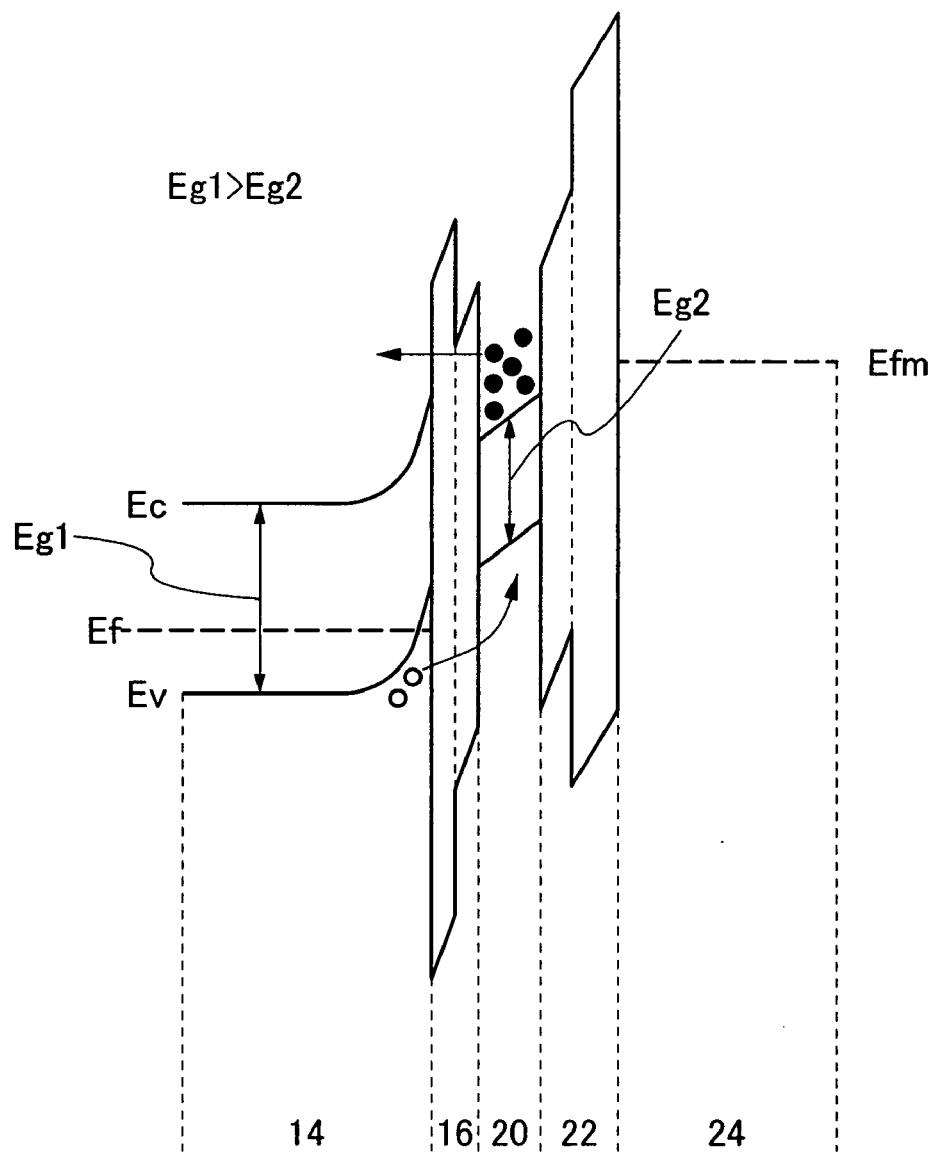
FIG. 5 is a band diagram of a nonvolatile memory in the state of erasing.

FIG. 5 is a band diagram of this erasing state. Since the first insulating layer 16 can be formed thin, electrons of the floating gate electrode 20 can be discharged toward the semiconductor substrate 10 side by FN tunnel currents in an erasing operation. In addition, holes are injected more easily from the channel formation region in the semiconductor substrate 10, and by injecting the holes into the floating gate electrode 20, a substantial erasing operation can be performed.

By forming the floating gate electrode 20 by using germanium or a germanium compound, the first insulating layer 16 can be made thin. Consequently, it becomes easy to inject electrons into the floating gate electrode 20 through the first insulating layer 16 with tunnel currents, so that an operation can be performed at a low voltage. Further, charges can be held at a low energy level, so that such a significant effect that charges can be held at a stable state can be provided.

Figure 3:
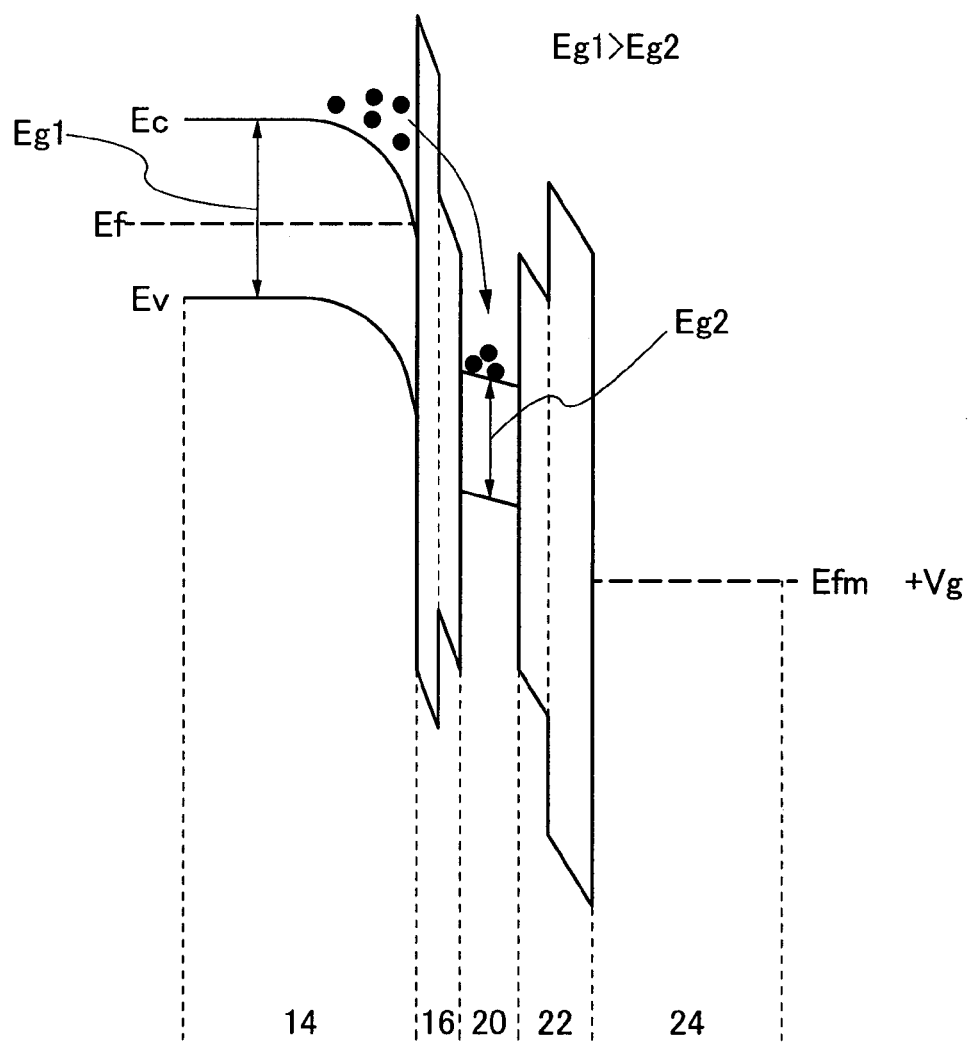
FIG. 3 is a band diagram of a nonvolatile memory in the state of writing.

As shown in FIGS. 2 and 3, the nonvolatile memory element of the present invention is structured such that the channel formation region in the semiconductor substrate 10 and the floating gate electrode 20 have the relationship of Eg1>Eg2 to generate a self-bias therebetween. This relationship is extremely important and acts so as to easily inject carriers from the channel formation region in the semiconductor substrate into the floating gate electrode. That is, the writing voltage can be reduced. To the contrary, it is made difficult to discharge carriers from the floating gate electrode; this acts so as to improve the memory holding property of the nonvolatile memory element. Further, by adding an n-type impurity into a germanium layer as the floating gate electrode, the bottom energy level of conduction band thereof can be further reduced, thereby the self-bias can be acted so as to further easily inject carriers into the floating gate electrode. That is, the writing voltage can be reduced and the memory holding property of the nonvolatile memory element can be improved.

As set forth over, in the nonvolatile memory element of the present invention, charges can be injected easily from the semiconductor substrate into the floating gate electrode and charges can be prevented from being vanished from the floating gate electrode. That is, in the case of operating as a memory, highly efficient writing at a low voltage can be performed and the charge holding property can be improved.

By using such a nonvolatile memory element, nonvolatile semiconductor memory devices having various modes can be obtained. FIG. 8 shows one example of an equivalent circuit of a nonvolatile memory cell array. A memory cell MS01 of storing 1-bit data includes a selecting transistor S01 and a nonvolatile memory element M01. The selecting transistor S01 is disposed in series between a bit line BL0 and the nonvolatile memory element M01, and a gate thereof is connected to a word line WL1. A gate of the nonvolatile memory element M01 is connected to a word line WL11. When data is written into the nonvolatile memory element M01, potentials of the word line WL1 and the bit line BL0 are set at H level while a potential of a bit line BL1 is set at L level, and a high voltage is applied to the word line WL11, so that charges are accumulated in a floating gate as described above. When data is erased, the potentials of the word line WL1 and the bit line BL0 may be set at H level while a negative high voltage may be applied to the word line WL11.

Figure 9:
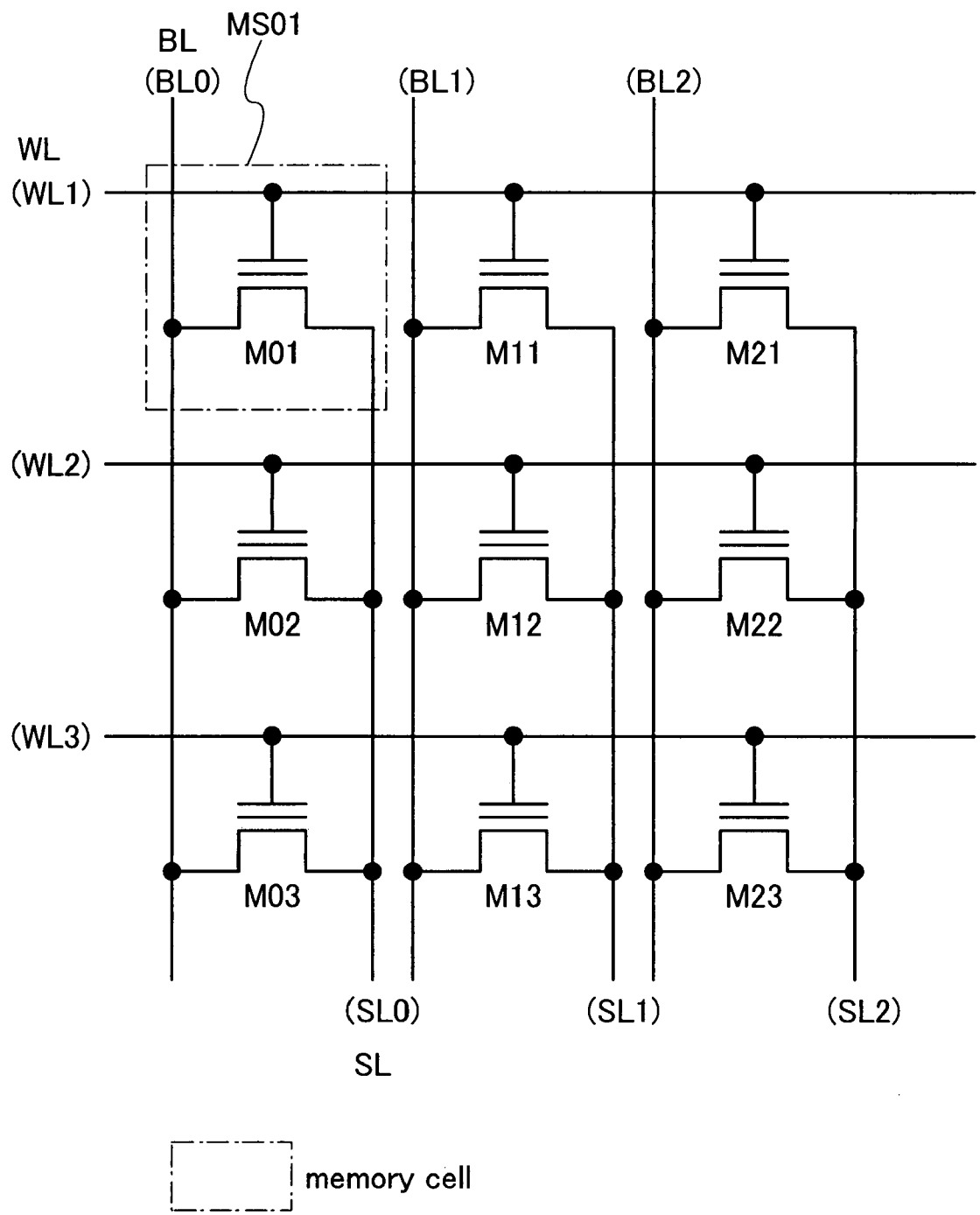
FIG. 9 is a diagram showing one example of an equivalent circuit of a NOR-type nonvolatile memory cell array.

FIG. 9 shows an equivalent circuit of a NOR type in which a nonvolatile memory element is directly connected to a bit line. In this memory cell array, word lines WL and bit lines BL are disposed so as to cross each other, and the nonvolatile memory element is disposed at each intersection. In the case of a NOR type, drains of the nonvolatile memory elements are connected to the bit lines BL. Sources of the nonvolatile memory elements are connected to the source lines SL in common.

Operations of the NOR type are, for example, as follows. When data is written, 0 V is set at the source lines SL, a high voltage is applied to a word line WL selected for data writing, and respective potentials corresponding to data "0" and data "1" are supplied to the bit lines BL. For example, a H-level potential and a L-level potential corresponding to data "0" and data "1" respectively are supplied to the bit lines BL. In each nonvolatile memory element applied with the H-level potential for writing data "0", hot electrons are generated near the drain, and are injected into the floating gate. Such an electron injection is not generated in the case of data "1".

In a memory cell to which data "0" is supplied, hot electrons are generated near the drain by a strong lateral direction electrical field between the source and the drain, and are injected into the floating gate. A state where the threshold voltage is increased by the electron injection into the floating gate is "0". In the case of data "1", hot electrons are not generated and electrons are not injected into the floating gate, thereby the state where the threshold voltage is low, namely an erasing state is kept.

When data is erased, a positive voltage of approximately 10 V is applied to the source lines SL and the bit lines BL are set in a floating state. Then a negative high voltage is applied to the word lines WL (a negative high voltage is applied to each control gate), thereby electrons are extracted from each floating gate. In this manner, the erasing state of data "1" can be obtained.

When data is read, whether current of the nonvolatile memory element has been drawn or not is judged with a sense amplifier connected to the bit lines BL, by setting 0 V to the source lines SL and approximately 0.8 V to the bit lines BL, and supplying a reading voltage which is set at an intermediate value of threshold values of the data "0" and the data "1" to a selected word line WL.

Figure 10:
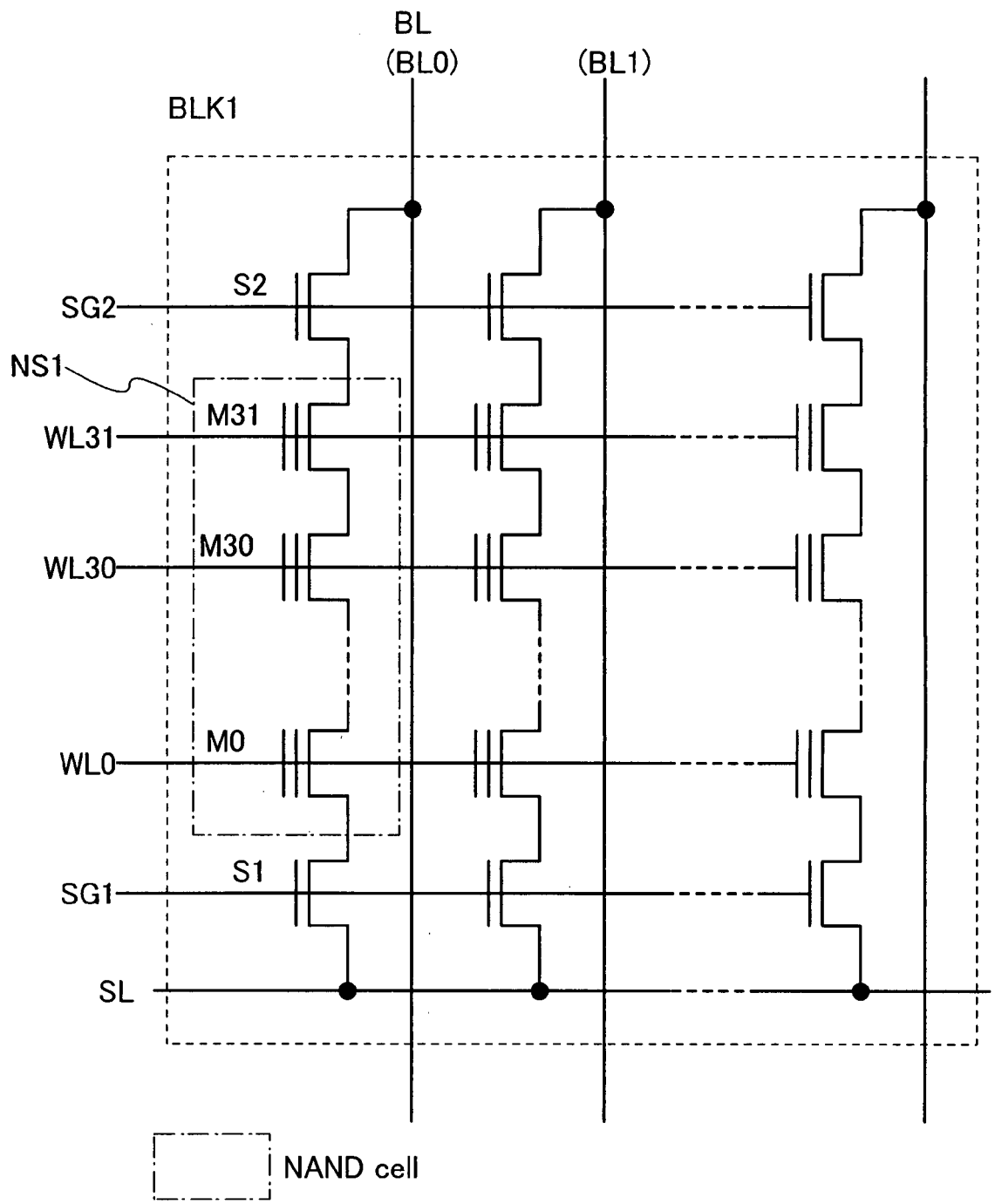
FIG. 10 is a diagram showing one example of an equivalent circuit of a NAND-type nonvolatile memory cell array.

FIG. 10 shows an equivalent circuit of a NAND type memory cell array. A NAND cell NS1 in which a plurality of nonvolatile memory elements are connected in series is connected to each bit line BL. A block BLK includes a plurality of NAND cells. The number of word lines in a block BLK1 shown in FIG. 10 is 32 (word lines WL0 to WL31). Nonvolatile memory elements disposed at the same row in the block BLK1 are connected to the common word line corresponding to this row.

A writing operation is carried out after the NAND cell NS1 is made in the erasing state, namely the threshold value of each nonvolatile memory element in the NAND cell NS1 is made in a negative voltage state. Writing is performed sequentially from a memory element M0 on the source line SL side. Description will be made about on the writing operation below using writing into the memory element M0 as an example.

Figure 11A:
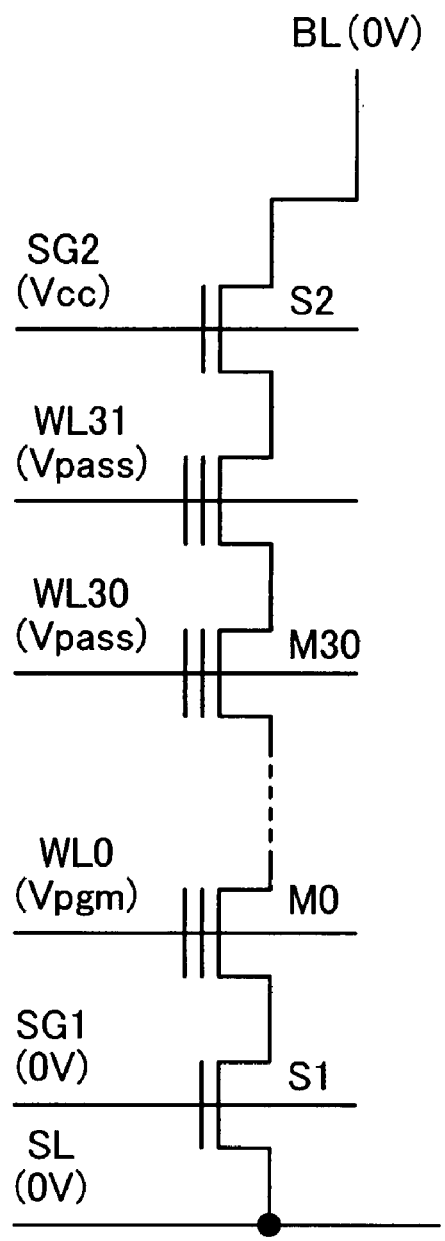
FIGS. 11A and 11B are diagrams describing writing operations of a NAND-type nonvolatile memory.

Writing is carried out after the NAND cell is made in the erasing state, namely the threshold value of each memory element in the NAND cell is made in a negative voltage state. In the case of writing "0", as shown in FIG. 11A, Vcc (power source voltage) is, for example, applied to a selection gate line SG2 to turn on a selecting transistor S2, and 0 V (ground voltage) is set to a bit line BL0. 0 V is set to a selection gate line GL1 to turn off a selecting transistor S1. Next, a high voltage $V_{pgm}$ (approximately 20 V) is set to the word line WL0 of a memory cell MC0 and a midpoint voltage (approximately 10 V) is set to the other word lines. Since the voltage of the bit line BL0 is 0 V, the potential of the channel formation region of the selected nonvolatile memory element M0 is 0 V. Since the potential difference between the word line WL0 and the channel formation region is large, electrons are injected into the floating gate of the nonvolatile memory element M0 by FN tunnel currents as described above. In this manner, the state in which the threshold voltage of the nonvolatile memory element M0 is positive (the state in which "0" is written) is obtained.

Figure 11B:
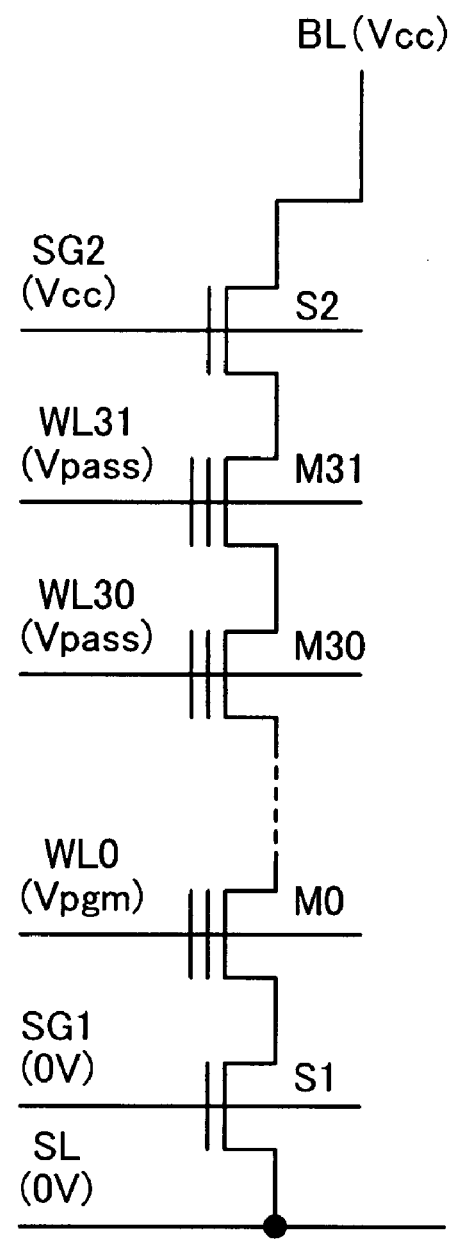

In the case of writing "1", as shown in FIG. 11B, Vcc (power source voltage) is, for example, applied to the bit line BL0. Since the voltage of the selection gate line SG2 is Vcc, the selecting transistor S2 is cut off when the voltage of the channel formation region becomes (Vcc-Vth) with respect to the threshold voltage Vth of the selecting transistor S2. Consequently, the channel formation region of the nonvolatile memory element M0 is made into a floating state. Next, a high voltage Vpgm (approximately 20 V) is applied to the word line WL0 while a midpoint voltage Vpass (approximately 10 V) is applied to the other word lines, so that the voltage of the channel formation region is increased from (Vcc-Vth) to, for example, approximately 8 V by capacitive coupling between each word line and each channel formation region. Since the voltage of the channel formation region is increased to such a high voltage, the potential difference between the word line WL0 and the channel formation region is small unlike the case of writing "0". Therefore, electron injection by FN tunnel currents does not occur into the floating gate of the nonvolatile memory element M0. In this manner, the state where the threshold voltage of the nonvolatile memory element M0 is negative (the state in which "1" is written) is kept.

Figure 12A:
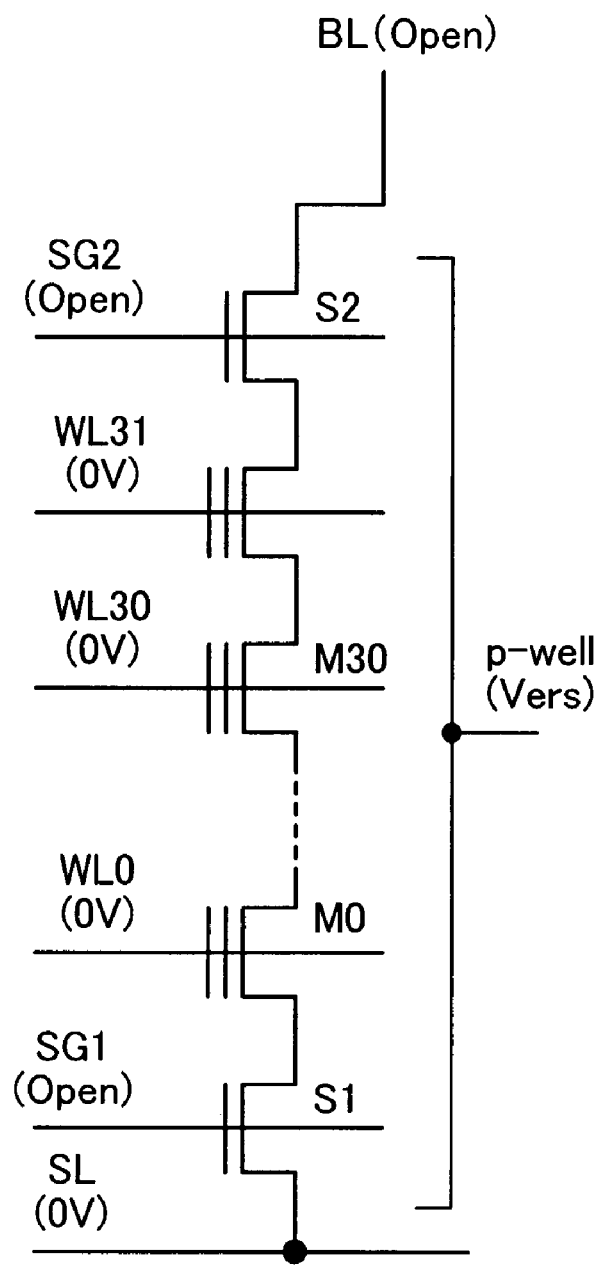
FIGS. 12A and 12B are diagrams describing erasing and reading operations of a NAND-type nonvolatile memory.

In the case of performing an erasing operation, as shown in FIG. 12A, all the word lines included in the selected block are set at 0 V, and a negative high voltage (Vers) is applied to the p-well. The bit line BL and the source line SL are set in the floating state. As a result of this, electrons in the floating gate are discharged into the semiconductor substrate by tunnel currents in all the memory cells in the block. Consequently, each threshold voltage of the memory cells is shifted in the negative direction.

Figure 12B:
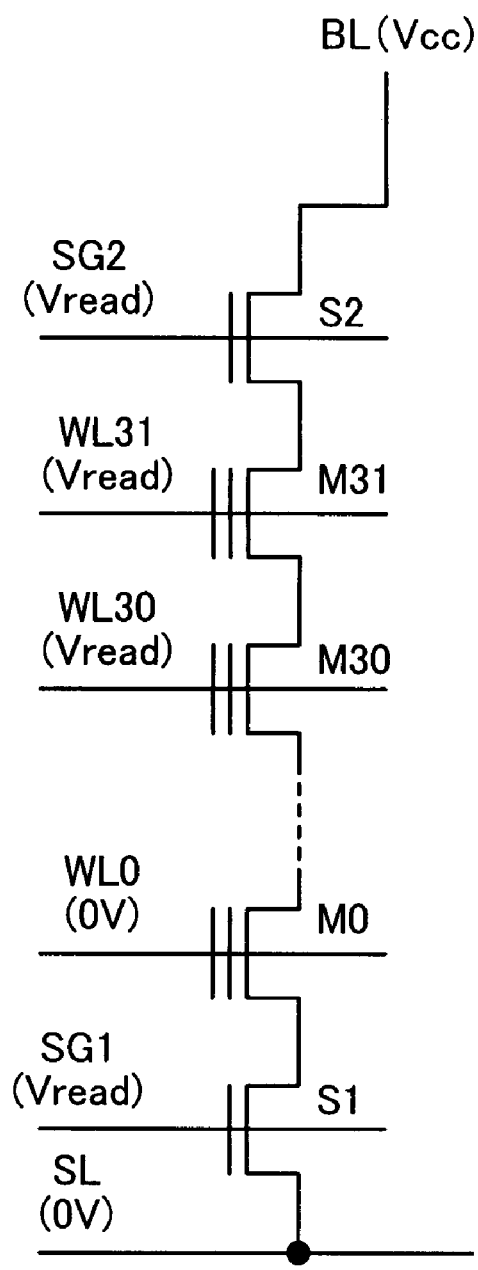
Figure 13:
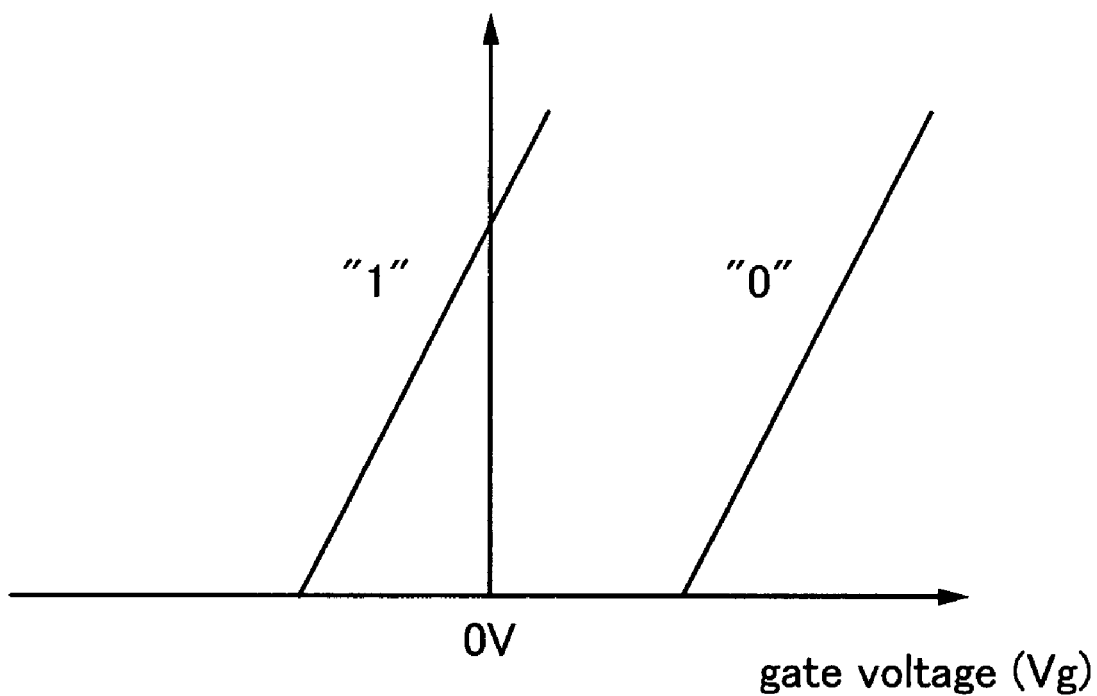
FIG. 13 is a graph showing changes of threshold voltage of a nonvolatile memory in the case of "0" where charges are accumulated and the case of "1" where charges are erased.

In a writing operation shown in FIG. 12B, a voltage $V_r$ (e.g., 0 V) is set to the word line WL0 of the nonvolatile memory element M0 selected for reading, and a reading midpoint voltage Vread which is a little higher than the power source voltage is set to the word lines WL1 to WL31 of unselected memory cells and the selection gate lines SG1 and SG2. That is, as shown in FIG. 13, the memory elements other than the selected memory element function as transfer transistors. In this way, whether a current flows or not through the nonvolatile memory element M0 selected for reading is detected. That is, in the case where the data stored in a memory cell MC1 is "0", the bit line BL is not discharged since the nonvolatile memory element M0 is off; whereas in the case where the data stored in the memory cell MC1 is "1", the bit line BL is discharged since the nonvolatile memory element M0 is on.

Figure 14:
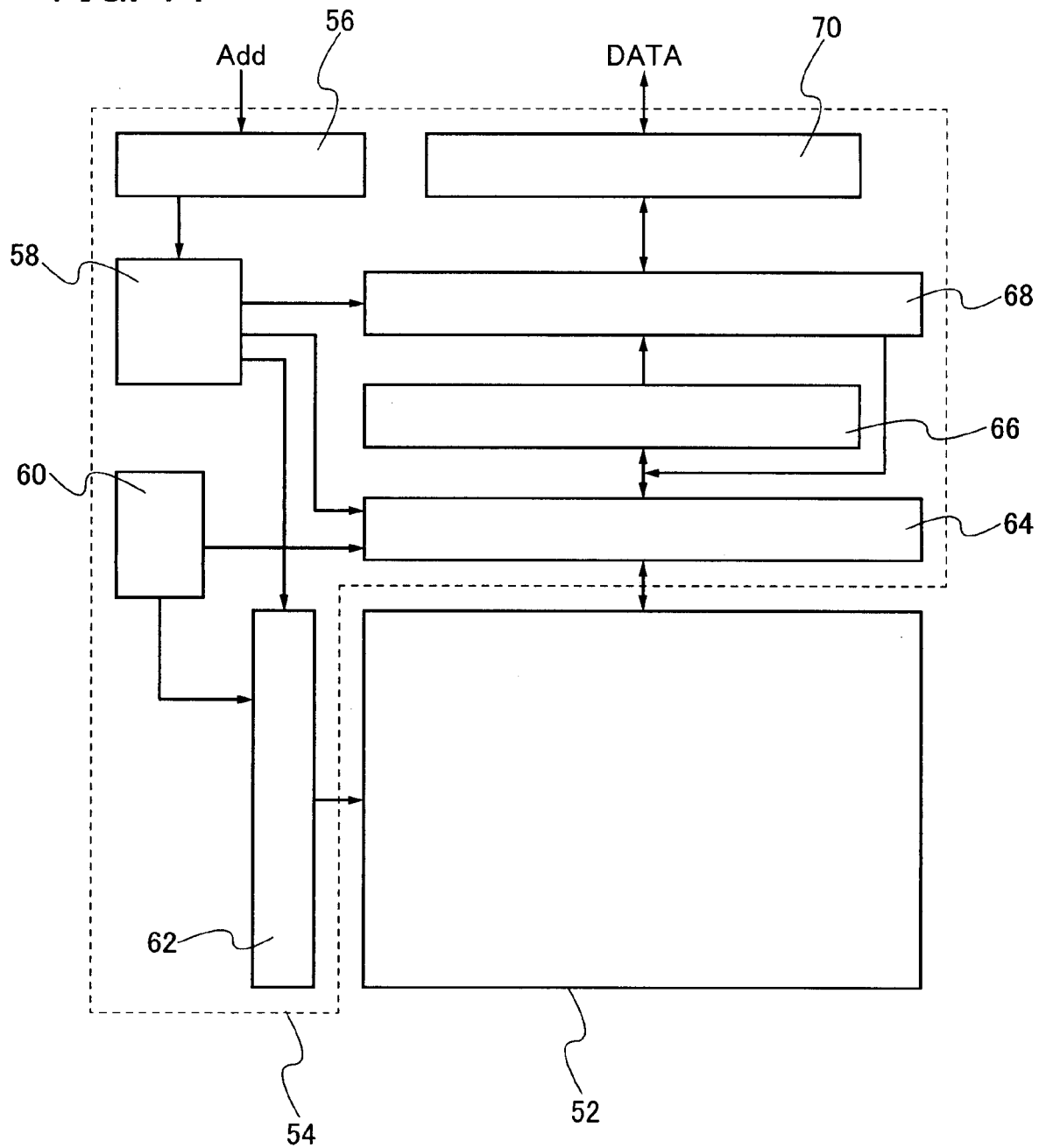
FIG. 14 is a diagram showing one example of a circuit block diagram of a nonvolatile semiconductor memory device.

FIG. 14 is one example of a circuit block diagram of a nonvolatile semiconductor memory device. The nonvolatile semiconductor memory device includes a memory cell array 52 and a peripheral circuitry 54 over the same substrate. The memory cell array 52 has the structure shown in FIG. 8, 9, or 10. A structure of the peripheral circuitry 54 is as follows.

A low decoder 62 for selecting a word line and a column decoder 64 for selecting a bit line are provided around the memory cell array 52. An address is sent to a control circuit 58 through an address buffer 56, and an internal row address signal and an internal column address signal are transferred to the low decoder 62 and the column decoder 64 respectively.

When data is written or erased, a potential obtained by boosting a power source potential is used. For this, a boosting circuit 60 controlled in accordance with an operating mode by the control circuit 58 is provided. Outputs of the boosting circuit 60 are supplied to the word lines WL and the bit lines BL through the low decoder 62 and the column decoder 64. Data outputted from the column decoder 64 is inputted to a sense amplifier 66. Data read from the sense amplifier 66 is stored in a data buffer 68, is accessed in random manner by control of the control circuit 58, and is outputted through a data input/output buffer 70. Writing data is stored in the data buffer 68 through the data input/output buffer 70 once, and is transferred to the column decoder 64 by control of the control circuit 58.

Hereinafter, the above-described nonvolatile semiconductor memory device will be described in detail with reference to Embodiments. In each structure of the present invention described below, the same ones are denoted by the same reference symbols throughout the drawings, and repeat description of this case may be omitted.

Embodiment 1

This embodiment will describe one example of a nonvolatile semiconductor memory device with reference to the drawings. A description is made below on the case where a nonvolatile memory element for forming a memory portion is formed at the same time as an element such as a transistor for forming a logic portion that is provided over the same substrate as the memory portion and performs control of the memory portion or the like in a nonvolatile semiconductor memory device.

First, an equivalent circuit of a memory portion in the nonvolatile semiconductor memory device is shown in FIG. 8.

In the memory portion described in this embodiment, a plurality of memory cells each including a selecting transistor and a nonvolatile memory element is provided. In FIG. 8, one memory cell includes a selecting transistor S01 and a nonvolatile memory element M01. Similarly, each memory cell includes a selecting transistor S02 and a nonvolatile memory element M02, a selecting transistor S03 and a nonvolatile memory element M03, a selecting transistor S11 and a nonvolatile memory element M11, a selecting transistor S12 and a nonvolatile memory element M12, or a selecting transistor S13 and a nonvolatile memory element M13.

A gate electrode of the selecting transistor S01 is connected to a word line WL1, one of a source and a drain thereof is connected to a bit line BL0, and the other one of the source and the drain is connected to a source or a drain of the nonvolatile memory element M01. A gate electrode of the nonvolatile memory element M01 is connected to a word line WL11, the one of the source and the drain is connected to the source or the drain of the selecting transistor S01, and the other one of the source and the drain thereof is connected to a source line SL.

Note that since a driving voltage of the selecting transistor provided in the memory portion is higher than that of a transistor provided in a logic portion, gate insulating layers or the like of the transistor provided in the memory portion and the transistor provided in the logic portion are preferably formed with different thicknesses. For example, when the driving voltage is low and variations of the threshold voltage are required to be small, a transistor including a gate insulating layer with a small thickness is preferably provided; whereas when the driving voltage is high and a high withstanding capability is required, a transistor including a gate insulating layer with a large thickness is preferably provided.

Therefore, in this embodiment, described will be the case where an insulating layer with a small thickness is formed for the transistor in the logic portion where the driving voltage is low and variations of the threshold voltage are required to be small whereas an insulating layer with a large thickness is formed for the transistor in the memory portion where the driving voltage is high and a high withstanding capability is required, with reference to the drawings. Note that in FIGS. 17A to 17C, 18A to 18C, 19A to 19C, and 20A to 20C, portions between A and B and between C and D illustrate transistors provided in the logic portion, a portion between E and F illustrates a nonvolatile memory element provided in the memory portion, and a portion between G and H illustrates a transistor provided in the memory portion. In addition, although description in this embodiment is made on the case where the transistor provided in the portion between A and B is of a p-channel type, the transistors provided in the portions between C and D and between G and H are of an n-channel type, and carrier movement of the nonvolatile memory element provided in the portion between E and F is performed by electrons, the nonvolatile semiconductor device of the present invention is not limited to this.

First, element isolation regions 104, 106, 108, and 110 (hereinafter also referred to as regions 104, 106, 108, and 110) are formed in a semiconductor substrate 100, and first insulating films 112, 114, 116, and 118 are formed on respective surfaces of the regions 104, 106, 108, and 110. Then, a floating gate electrode 120 (a film containing germanium (Ge) as a main component) is formed so as to cover the first insulating films 112, 114, 116, and 118 (see FIG. 17A). The regions 104, 106, 108, and 110 provided in the semiconductor substrate 100 are separated by an insulating film 102 (also called a field oxide film). In addition, in the example described in this embodiment mode, a single crystalline silicon substrate having n-type conductivity is used as the semiconductor substrate 100, and p-wells 107 are provided in the regions 106, 108, and 110 in the semiconductor substrate 100.

In addition, any semiconductor substrate can be used as the substrate 100. For example, a single crystalline silicon substrate having n-type or p-type conductivity, a compound semiconductor substrate (e.g., GaAs substrate, InP substrate, GaN substrate, SiC substrate, sapphire substrate, or ZnSe substrate), or an SOI (Silicon On Insulator) substrate manufactured by a bonding method or a SIMOX (Separation by Implanted Oxygen) method can be used.

For forming the element isolation regions 104, 106, 108, and 110, a LOCOS (Local Oxidation of Silicon) method, a trench isolation method, or the like can be arbitrarily used.

The p-wells in the regions 106, 108, and 110 in the semiconductor substrate 100 can be formed by selectively adding an impurity element having p-type conductivity into the semiconductor substrate 100. As the p-type impurity element, boron (B), aluminum (Al), gallium (Ga), or the like can be used.

Note that although an impurity element is not added into the region 104 since the semiconductor substrate having n-type conductivity is used as the semiconductor substrate 100 in this embodiment, an n-well may be formed in the region 104 by adding an impurity element having n-type conductivity. As the n-type impurity element, phosphorus (P), arsenic (As), or the like can be used. In the case where a semiconductor substrate having p-type conductivity is used, a structure may be employed in which an n-well is formed in the region 104 by adding an impurity element having n-type conductivity and an impurity element is not added into the regions 106, 108, and 110.

Each of the first insulating films 112, 114, 116, and 118 can be formed of a silicon oxide film by oxidizing each surface of the regions 104, 106, 108, and 110 in the semiconductor substrate 100 with heat treatment. Alternatively, each of the first insulating films 112, 114, 116, and 118 can be formed with a stacked-layer structure of a silicon oxide film and a film containing oxygen and nitrogen (silicon oxynitride film) by forming the silicon oxide film with a thermal oxidation method and then nitriding a surface of the silicon oxide film with nitridation treatment.

Further alternatively, the first insulating films 112, 114, 116, and 118 can be formed using plasma treatment. For example, by performing oxidation treatment or nitridation treatment with high-density plasma treatment to the surfaces of the regions 104, 106, 108, and 110 in the semiconductor substrate 100, silicon oxide ($SiO_x$) films or silicon nitride ($SiN_x$) films can be formed as the first insulating films 112, 114, 116, and 118. Further, after oxidation treatment is performed to the surfaces of the regions 104, 106, 108, and 110 with high-density plasma treatment, nitridation treatment may be performed by performing high-density plasma treatment again. In this case, silicon oxide films are formed on the surfaces of the regions 104, 106, 108, and 110, and silicon oxynitride films are formed on the silicon oxide films, so that each of the first insulating films 112, 114, 116, and 118 is formed with the stacked-layer film of the silicon oxide film and the silicon oxynitride film. Further alternatively, after silicon oxide films are formed on the surfaces of the regions 104, 106, 108, and 110 by a thermal oxidation method, oxidation treatment or nitridation treatment may be performed by high-density plasma treatment.

In this embodiment, the first insulating films 112, 114, 116, and 118 are formed with a thickness of 1 nm to 10 nm inclusive, preferably 1 nm to 5 nm inclusive. For example, silicon oxide films with a thickness of about 5 nm are formed on the surfaces of the regions 104, 106, 108, and 110 by performing oxidation treatment to the regions 104, 106, 108, and 110 with heat treatment, and after that, silicon oxynitride films with a thickness of about 2 nm are formed on surfaces of the silicon oxide films by performing nitridation treatment with high-density plasma treatment. In addition, in this case, the heat treatment and the nitridation treatment with high-density plasma treatment are preferably performed consecutively without exposure to air. By consecutively performing the heat treatment and the high-density plasma treatment, contaminant incorporation can be prevented and the production efficiency can be improved.

Note that when an object to be processed (the semiconductor substrate 100 in this embodiment) is oxidized by high-density plasma treatment, it is performed in an atmosphere containing oxygen (e.g., in an atmosphere containing oxygen ($O_2$) or dinitrogen monoxide ($N_2O$) and a rare gas (containing at least one of He, Ne, Ar, Kr, and Xe) or in an atmosphere containing oxygen or dinitrogen monoxide and hydrogen ($H_2$) and a rare gas). When the object to be processed is nitrided by high-density plasma treatment, it is performed in an atmosphere containing nitrogen (e.g., in an atmosphere containing nitrogen ($N_2$) and a rare gas (containing at least one of He, Ne, Ar, Kr, and Xe), in an atmosphere containing nitrogen, hydrogen, and a rare gas, or in an atmosphere containing $NH_3$ and a rare gas).

As the rare gas, Ar can be used for example. Further, a gas in which Ar and Kr are mixed may also be used. In the case where the high-density plasma treatment is performed in a rare gas atmosphere, the first insulating films 112, 114, 116, and 118 may contain the rare gas (containing at least one of He, Ne, Ar, Kr, and Xe) used in the plasma treatment; in the case of using Ar, the first insulating films 112, 114, 116, and 118 may contain Ar.

The high-density plasma treatment is performed with an electron density of $1 \times 10^{11}$ cm$^{-3}$ or more and at a plasma electron temperature of 1.5 eV or less in the above-described gas atmosphere. Specifically, it is performed with an electron density of $1 \times 10^{11}$ cm$^{-3}$ to $1 \times 10^{13}$ cm$^{-3}$ inclusive and at a plasma electron temperature of 0.5 eV to 1.5 eV inclusive. Since the electron density of plasma is high and the electron temperature near the object to be processed formed on the semiconductor substrate 100 (the semiconductor substrate 100 in this embodiment) is low, plasma damage to the object to be processed can be prevented. In addition, since the electron density of plasma is as high as $1 \times 10^{11}$ cm$^{-3}$ or more, an oxide layer or a nitride layer formed by oxidizing or nitriding the object to be processed with the plasma treatment is superior in uniformity of thickness or the like and is denser than a film formed by CVD, sputtering, or the like. In addition, since the plasma electron temperature is as low as 1.5 eV or less, oxidation or nitridation treatment can be performed at a lower temperature than that of conventional plasma treatment or a thermal oxidation method. As a frequency for generating plasma, a high frequency wave such as a microwave (e.g., 2.45 GHz) can be used.

In this embodiment, when oxidation treatment of the object to be processed is performed with high-density plasma treatment, a mixed gas of oxygen ($O_2$), hydrogen ($H_2$), and argon (Ar) is introduced. As for the mixed gas used here, oxygen, hydrogen, and argon may be introduced at rates of 0.1 sccm to 100 sccm, 0.1 sccm to 100 sccm, and 100 sccm to 5000 sccm, respectively. Note that the mixed gas may be introduced at the ratio of oxygen:hydrogen:argon=1:1:100. For example, it is preferable that oxygen, hydrogen, and argon be introduced at rates of 5 sccm, 5 sccm, and 500 sccm respectively.

When nitridation treatment of the object to be processed is performed with high-density plasma treatment, a mixed gas of nitrogen ($N_2$) and argon (Ar) is introduced. As for the mixed gas used here, nitrogen and argon may be introduced at rates of 20 sccm to 2000 sccm and 100 sccm to 10000 sccm, respectively. For example, it is preferable that nitrogen and argon be introduced at rates of 200 sccm and 1000 sccm respectively.

In this embodiment, in the semiconductor substrate 100, the first insulating layer 116 which is formed over the region 108 provided in the memory portion functions as a tunnel oxide film in a nonvolatile memory element completed later. Therefore, as the thickness of the first insulating layer 116 is smaller, a larger amount of tunnel current flows so that a high-speed operation as a memory can be realized. In addition, as the thickness of the first insulating layer 116 is smaller, charge accumulation in a floating gate electrode formed later can be performed at a lower voltage so that power consumption of a nonvolatile semiconductor memory device can be reduced. Therefore, the first insulating films 112, 114, 116, and 118 are preferably formed thin.

The floating gate electrode 120 can be formed of a film containing germanium (Ge) such as germanium or a silicon-germanium alloy. In this embodiment, by performing plasma CVD in an atmosphere containing a germanium element (e.g., GeH$_4$), a film containing germanium as a main component is formed with a thickness of 1 nm to 20 nm inclusive, preferably 5 nm to 10 nm inclusive as the floating gate electrode 120. In such a case where the single crystalline silicon substrate is used as the semiconductor substrate 100 and the film containing germanium which has a smaller energy gap than that of silicon is provided as the floating gate electrode over the certain region of the silicon substrate with the first insulating layer functioning as the tunnel oxide film interposed therebetween, a second barrier formed by the insulating layer with respect to electrons in the floating gate electrode becomes energetically higher than a first barrier formed by the insulating layer with respect to electrons in the certain region of the silicon substrate. Consequently, charges can be injected easily from the certain region of the silicon substrate into the floating gate electrode and charges can be prevented from being vanished from the floating gate electrode. That is, in the case of operating as a memory, highly efficient writing at a low voltage can be performed and the charge holding property can be improved.

Next, the first insulating films 112, 114, and 118, and the floating gate electrode 120 formed over the regions 104, 106, and 110 in the semiconductor substrate 100 are selectively removed so as to leave the first insulating film 116 and the floating gate electrode 120 formed over the region 108. In this embodiment, the selective removing is performed by etching the first insulating films 112, 114, and 118, and the floating gate electrode 120 formed over the regions 104, 106, and 110 after selectively covering the region 108, the first insulating film 116, and the floating gate electrode 120 provided in the memory portion with a resist mask in the semiconductor substrate 100 (see FIG. 17B).

Figure 17A:
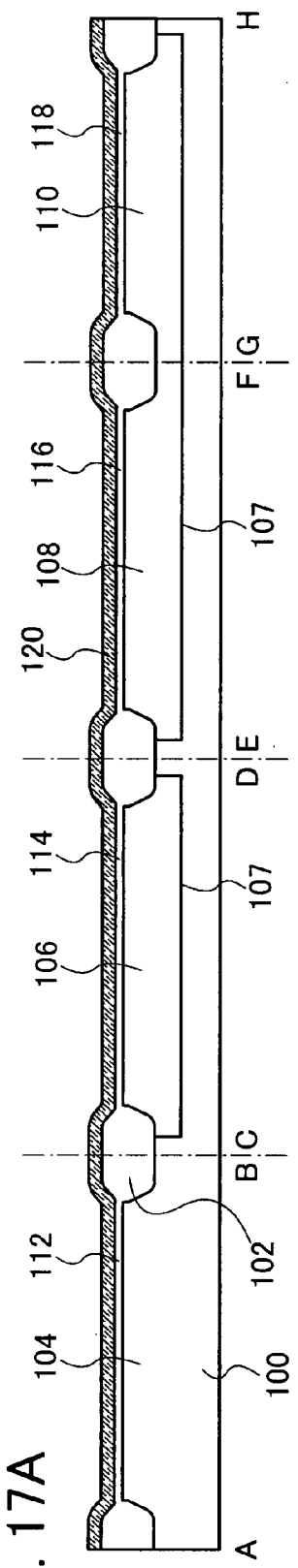
FIGS. 17A to 17C are diagrams showing one example of a manufacturing method of a nonvolatile semiconductor memory device of the present invention.
Figure 17B:
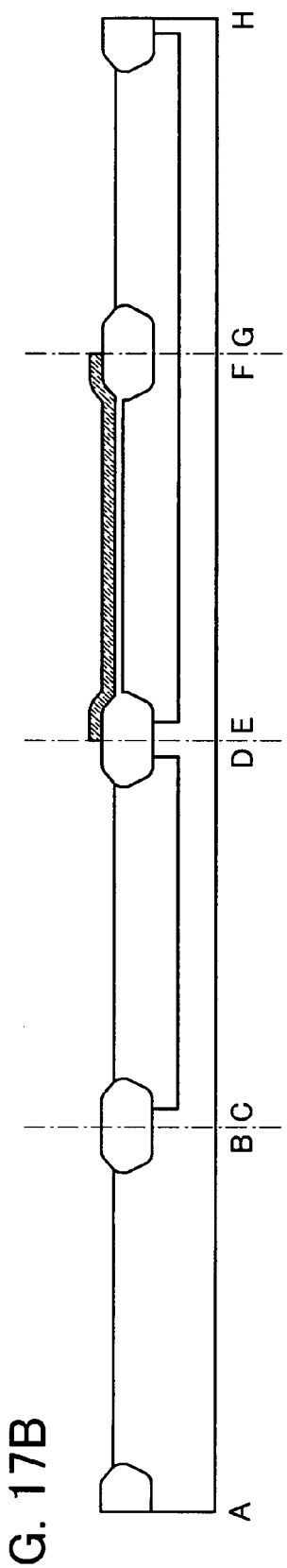
Figure 17C:
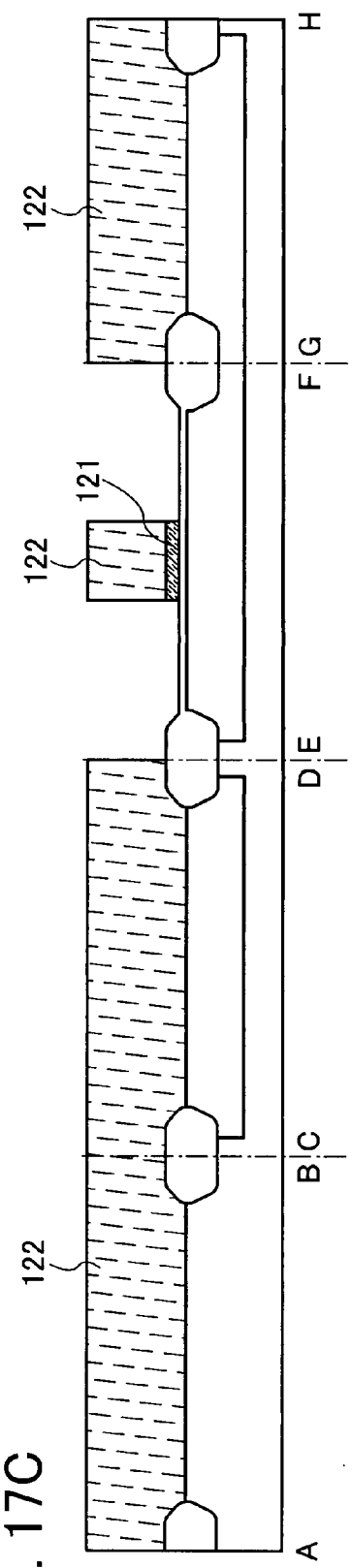

Next, a resist mask 122 is formed so as to selectively cover the regions 104, 106, and 110 in the semiconductor substrate 100 and a part of the floating gate electrode 120 formed over the region 108, and the other part of the floating gate electrode 120 which is not covered with the resist mask 122 is etched to be selectively removed, so that the part of the floating gate electrode 120 is left to form a floating gate electrode 121 (see FIG. 17C).

Next, an impurity region is formed in a certain region of the region 110 in the semiconductor substrate 100. In this embodiment, impurity regions 126 are formed by forming a resist mask 124 so as to selectively cover the regions 104, 106, and 108 and a part of the region 110 after the resist mask 122 is removed, and introducing an impurity element into the other part of the region 110 which is not covered with the resist mask 124 (see FIG. 18A). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, phosphorus (P) is introduced as the impurity element into the region 110.

Figure 18A:
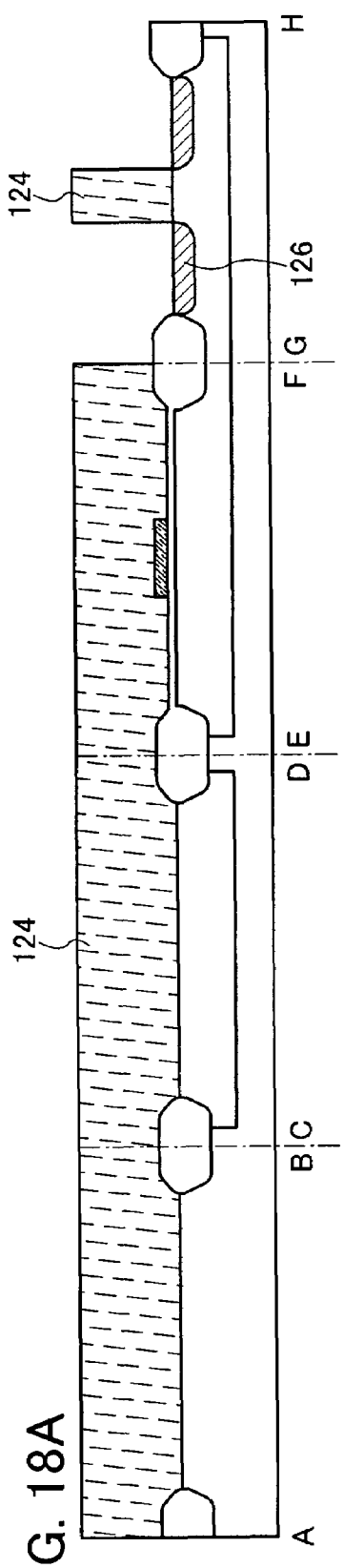
FIGS. 18A to 18C are diagrams showing one example of a manufacturing method of a nonvolatile semiconductor memory device of the present invention.
Figure 18B:
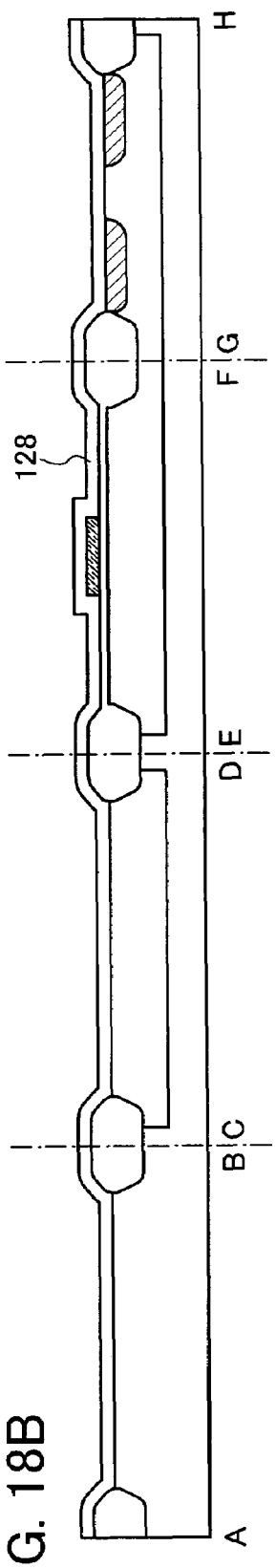

Next, a second insulating film 128 is formed so as to cover the regions 104, 106, and 110 in the semiconductor substrate 100 and the first insulating film 116 and the floating gate electrode 121 which are formed over the region 108 (see FIG. 18B).

The second insulating film 128 is formed of a single layer or a plurality of layers using an insulating material such as silicon oxide, silicon nitride, silicon oxynitride ($SiO_xN_y$ (x>y)), or silicon nitride oxide ($SiN_xO_y$ (x>y)) by CVD, sputtering, or the like. For example, when forming the second insulating film 128 of a single layer, a silicon oxynitride film or a silicon nitride oxide film is formed with a thickness of 5 nm to 50 nm inclusive by CVD. Further, when forming the second insulating film 128 with a three-layer structure, a silicon oxynitride film is formed as the first-layer insulating film, a silicon nitride film is formed as the second-layer insulating film, and a silicon oxynitride film is formed as the third-layer insulating film. Further alternatively, oxide or nitride of germanium may be used for the second insulating film 128.

Note that the second insulating film 128 formed over the region 108 functions as a control insulating film in a nonvolatile memory element completed later, and the second insulating film 128 formed over the region 110 functions as a gate insulating film in a transistor completed later.

Figure 18C:
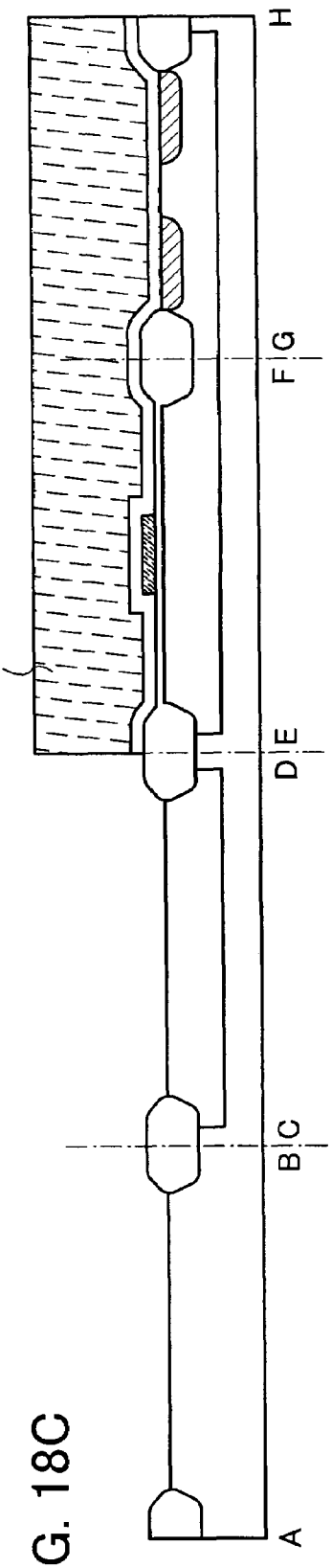

Next, a resist mask 130 is selectively formed so as to cover the second insulating film 128 formed over the regions 108 and 110, and the second insulating film 128 formed over the regions 104 and 106 is selectively removed (see FIG. 18C).

Next, third insulating films 132 and 134 are formed so as to cover the regions 104 and 106 respectively (see FIG. 19A).

The third insulating films 132 and 134 are formed by any method described as the method of forming the above-described first insulating films 112, 114, 116, and 118. For example, each of the third insulating films 132 and 134 can be formed of a silicon oxide film by oxidizing each surface of the regions 104 and 106 in the semiconductor substrate 100 with heat treatment. Alternatively, each of the first insulating films 112 and 114 can be formed with a stacked-layer structure of a silicon oxide film and a film containing oxygen and nitrogen (silicon oxynitride film) by forming the silicon oxide film with a thermal oxidation method and then nitriding a surface of the silicon oxide film with nitridation treatment.

Further alternatively, as described above, the third insulating films 132 and 134 can be formed using plasma treatment. For example, by performing oxidation treatment or nitridation treatment with high-density plasma treatment to the surfaces of the regions 104 and 106 in the semiconductor substrate 100, silicon oxide ($SiO_x$) films or silicon nitride ($SiN_x$) films can be formed as the third insulating films 132 and 134. Further, after oxidation treatment is performed to the surfaces of the regions 104 and 106 with high-density plasma treatment, nitridation treatment may be performed by performing high-density plasma treatment again. In this case, silicon oxide films are formed on the surfaces of the regions 104 and 106, and silicon oxynitride films are formed on the silicon oxide films, so that each of the third insulating films 132 and 134 is formed with the stacked-layer film of the silicon oxide film and the silicon oxynitride film. Further alternatively, after silicon oxide films are formed on the surfaces of the regions 104 and 106 by a thermal oxidation method, oxidation treatment or nitridation treatment may be performed by high-density plasma treatment.

Note that in forming the third insulating films 132 and 134 by a thermal oxidation method or high-density plasma treatment, the oxide film or the silicon oxide film may also be formed on the second insulating film 128 formed over the regions 108 and 110 in the semiconductor substrate 100. The third insulating films 132 and 134 formed over the regions 104 and 106 in the semiconductor substrate 100 function as gate insulating films in transistors completed later.

Next, a conductive film is formed so as to cover the third insulating films 132 and 134 formed over the regions 104 and 106 and the second insulating film 128 formed over the regions 108 and 110 (see FIG. 19B). In the example described in this embodiment, a conductive film 136 and a conductive film 138 are stacked sequentially as the conductive film. It is needless to say that the conductive film may also be formed with a single-layer structure or a staked-layer structure including three or more layers.

The conductive films 136 and 138 can be formed of an element selected from tantalum (Ta), tungsten (W), titanium (Ti), molybdenum (Mo), aluminum (Al), copper (Cu), chromium (Cr), silicon (Si), or the like, or an alloy material or a compound material containing the element as a main component. Further, a metal nitride film obtained by nitriding the element can also be used. Further alternatively, a semiconductor material typified by polycrystalline silicon added with an impurity element such as phosphorus can also be used.

In this embodiment, a stacked-layer structure is formed by forming the conductive film 136 of tantalum nitride and the conductive film 138 of tungsten sequentially. Alternatively, a single-layer film or a plural-layer film of tungsten nitride, molybdenum nitride, or titanium nitride can be used as the conductive film 136, and a single-layer film or a plural-layer film of tantalum, molybdenum, or titanium can be used as the conductive film 138.

Next, by selectively etching away the conductive films 136 and 138 which are stacked, the conductive films 136 and 138 are partially left over the regions 104, 106, 108, and 110 to form gate electrodes 140, 142, and 146, and a control gate electrode 144 (see FIG. 19C). Note that the control gate electrode 144 which is formed over the region 108 provided in the memory portion in the semiconductor substrate 100 functions as a control gate in a nonvolatile memory element completed later.

Next, a resist mask 148 is selectively formed so as to cover the region 104, and an impurity element is added into the regions 106, 108, and 110 by using the resist mask 148, the gate electrodes 142 and 146, and the control gate electrode 144 as masks, thereby forming impurity regions (see FIG. 20A). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, phosphorus (P) is used as the impurity element.

In FIG. 20A, by introducing the impurity element, impurity regions 152 forming source and drain regions and a channel formation region 150 are formed in the region 106. In the region 108, impurity regions 156 forming source and drain regions, low-concentration impurity regions 158 forming LDD regions, and a channel formation region 154 are formed. In the region 110, impurity regions 162 forming source and drain regions, low-concentration impurity regions 164 forming LDD regions, and a channel formation region 160 are formed.

The low-concentration impurity regions 158 in the region 108 are formed by the introduction of the impurity element shown in FIG. 20A passed through the floating gate electrode 121. Therefore, in the region 108, the channel formation region 154 is formed in a region overlapped with both the control gate electrode 144 and the floating gate electrode 121, each of the low-concentration impurity regions 158 is formed in a region overlapped with the floating gate electrode 121 while not overlapped with the control gate electrode 144, and each of the high-concentration impurity regions 156 is formed in a region overlapped with neither the floating gate electrode 121 nor the control gate electrode 144.

Next, a resist mask 166 is selectively formed so as to cover the regions 106, 108, and 110, and an impurity element is introduced into the region 104 by using the resist mask 166 and the gate electrode 140 as masks, thereby forming impurity regions (see FIG. 20B). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, an impurity element having a conductivity type which is different from that of the impurity element introduced into the regions 106, 108, and 110, (e.g., boron (B)) is introduced. In this manner, impurity regions 170 forming source and drain regions, and a channel formation region 168 are formed in the region 104.

Next, an insulating film 172 is formed so as to cover the second insulating film 128, the third insulating films 132 and 134, the gate electrodes 140, 142, and 146, and the control gate electrode 144, and over the insulating film 172, a conductive film 174 is formed so as to electrically connect to the impurity regions 170, 152, 156, and 162 formed in the regions 104, 106, 108, and 110 respectively (see FIG. 20C).

The insulating film 172 can be formed with a single-layer structure or a plural-layer structure of an insulating film containing oxygen or nitrogen of silicon oxide ($SiO_x$), silicon nitride ($SiN_x$), silicon oxynitride ($SiO_xN_y$ (x>y)), or silicon nitride oxide ($SiN_xO_y$ (x>y)); a film containing carbon of DLC (Diamond Like Carbon) or the like; an organic material such as epoxy, polyimide, polyamide, polyvinyl phenol, benzocyclobutene, or acrylic; or a siloxane material such as a siloxane resin by CVD, sputtering, or the like. Note that the siloxane material is a material having a Si—O—Si bond. Siloxane has a skeleton structure containing a bond of silicon (Si) and oxygen (0). As a substituent, an organic group containing at least hydrogen (e.g., an alkyl group or aromatic hydrocarbon) can be used. As a substituent, a fluoro group may also be used. Alternatively, as a substituent, an organic group containing at least hydrogen and a fluoro group may be used.

The conductive film 174 is formed of a single layer or a plurality of layers of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like, or an alloy material or a compound material containing the element as a main component by CVD, sputtering, or the like. The alloy material containing aluminum as a main component corresponds, for example, to a material containing aluminum as a main component and nickel or a material containing aluminum as a main component, nickel and one or both of carbon and silicon. The conductive film 174 may be, for example, formed with a stacked-layer structure of a barrier film, an aluminum-silicon (Al—Si) film, and a barrier film or a stacked-layer structure of a barrier film, an aluminum-silicon (Al—Si) film, a titanium nitride (TiN) film, and a barrier film. Note that the barrier film corresponds to a thin film of titanium, nitride of titanium, molybdenum, or nitride of molybdenum. Aluminum or aluminum-silicon which is low in resistance value and cost is preferable as the material of the conductive film 174. In addition, by providing barrier layers as an upper layer and a lower layer, hillock generation of aluminum or aluminum-silicon can be prevented. Further, by forming a barrier film of titanium which is a highly-reducible element, a thin natural oxide film which may be formed on a crystalline semiconductor film can be reduced so that good contact with the crystalline semiconductor film can be obtained.

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied at writing and erasing operations of a nonvolatile memory element. In the nonvolatile memory element, it becomes easy to inject charges from the semiconductor substrate into the floating gate electrode and charges are prevented from being vanished from the floating gate electrode. That is, in the case of operating as a memory, highly efficient writing at a low voltage can be performed and the charge holding property can be improved. This embodiment enables such a nonvolatile semiconductor memory device having such superior effects to be manufactured by consecutive steps.

This embodiment can be implemented combining with the other embodiment mode and embodiments described in this specification.

Embodiment 2

This embodiment will describe a manufacturing method of a nonvolatile semiconductor memory device, which is different from Embodiment 1, with reference to the drawings. The same ones as those in Embodiment 1 are denoted by the same reference symbols, and repeat description thereof is omitted. Note that in FIGS. 21A to 21C, 22A to 22C, and 23A and 23B, portions between A and B and between C and D illustrate transistors provided in a logic portion, a portion between E and F illustrates a nonvolatile memory element provided in a memory portion, and a portion between G and H illustrates a transistor provided in the memory portion. In addition, although description in this embodiment is made on the case where the transistor provided in the portion between A and B is of a p-channel type, the transistors provided in the portions between C and D and between G and H are of an n-channel type, and carrier movement of the nonvolatile memory element provided in the portion between E and F is performed by electrons, the nonvolatile semiconductor device of the present invention is not limited to this.

First, after the state of FIG. 17C is obtained by forming similarly, the resist mask 122 is removed, and the second insulating film 128 is formed so as to cover the regions 104, 106, and 110, and the first insulating film 116 and the floating gate electrode 121 which are formed over the region 108 (see FIG. 21A).

Next, the resist mask 130 is selectively formed so as to cover the second insulating film 128 formed over the regions 108 and 110, and the second insulating film 128 formed over the regions 104 and 106 is selectively removed (see FIG. 21B).

Next, the third insulating films 132 and 134 are formed so as to cover the regions 104 and 106 respectively (see FIG. 21C).

Next, a conductive film is formed so as to cover the third insulating films 132 and 134 formed over the regions 104 and 106 and the second insulating film 128 formed over the regions 108 and 110 (see FIG. 22A). In the example described in this embodiment, the conductive film 136 and the conductive film 138 are stacked sequentially as the conductive film. It is needless to say that the conductive film may also be formed with a single-layer structure or a staked-layer structure including three or more layers.

Next, by selectively etching away the conductive films 136 and 138 which are stacked, the conductive films 136 and 138 are partially left over the regions 104, 106, 108, and 110 to form the gate electrodes 140, 142, and 146, and the control gate electrode 144 (see FIG. 22B). Note that the gate electrode 140 includes conductive films 182$a$ and 184$a$ which are provided by stacking the left conductive films 136 and 138. Further, in accordance with this embodiment, in the gate electrode 140, the width (width in a about parallel direction to a direction of carrier flow in the channel formation region (direction connecting the source region to the drain region) of the conductive film 182$a$ formed lower is larger than the width of the conductive film 184$a$. Similarly, the gate electrode 142 is formed by stacking a conductive film 182$b$ and a conductive film 184$b$ having a smaller width than that of the conductive film 182$b$ sequentially, the control gate electrode 144 is formed by stacking a conductive film 182$c$ and a conductive film 184$c$ having a smaller width than that of the conductive film 182$c$ sequentially, and the gate electrode 146 is formed by stacking a conductive film 182$d$ and a conductive film 184$d$ having a smaller width than that of the conductive film 182$d$ sequentially.

Next, the resist mask 148 is selectively formed so as to cover the region 104, and an impurity element is introduced into the regions 106, 108, and 110 by using the resist mask 148, the gate electrodes 142 and 146, and the control gate electrode 144 as masks, thereby forming impurity regions (see FIG. 22C). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, phosphorus (P) is used as the impurity element.

In FIG. 22C, by introducing the impurity element, the high-concentration impurity regions 152 forming source and drain regions, low-concentration impurity regions 186 forming LDD regions, and the channel formation region 150 are formed in the region 106. In the region 108, the impurity regions 156 forming source and drain regions, the low-concentration impurity regions 158 forming LDD regions, and the channel formation region 154 are formed. In the region 110, the high-concentration impurity regions 162 forming source and drain regions, the low-concentration impurity regions 164 forming LDD regions, and the channel formation region 160 are formed.

The low-concentration impurity regions 186 in the region 106 are formed by the introduction of the impurity element shown in FIG. 22C passed through the conductive film 182$b$. Therefore, in the region 106, the channel formation region 150 is formed in a region overlapped with both the conductive film 182$b$ and the conductive film 184$b$, each of the low-concentration impurity regions 186 is formed in a region overlapped with the conductive film 182$b$ while not overlapped with the conductive film 184$b$, and each of the high-concentration impurity regions 152 is formed in a region overlapped with neither the conductive film 182b nor the conductive film 184b.

The low-concentration impurity regions 158 in the region 108 are formed by the introduction of the impurity element shown in FIG. 22C passed through the floating gate electrode 121. Therefore, in the region 108, the channel formation region 154 is formed in a region overlapped with both the conductive film 182c and the floating gate electrode 121, each of the low-concentration impurity regions 158 is formed in a region overlapped with the floating gate electrode 121 while not overlapped with the conductive film 182c, and each of the high-concentration impurity regions 156 is formed in a region overlapped with neither the floating gate electrode 121 nor the conductive film 182c. Note that in the case where the conductive film 182c is formed with a small thickness, in the region 108, a low-concentration impurity region with a concentration which is equal to or lower than that of the low-concentration impurity regions 158 may be formed in a region overlapped with both the conductive film 182c and the floating gate electrode 121 while not overlapped with the conductive film 184c.

The low-concentration impurity regions 164 in the region 110 are formed by the introduction of the impurity element shown in FIG. 22C passed through the conductive film 182d. Therefore, in the region 110, the channel formation region 160 is formed in a region overlapped with both the conductive film 182d and the conductive film 184d, each of the low-concentration impurity regions 164 is formed in a region overlapped with the conductive film 182d while not overlapped with the conductive film 184d, and each of the high-concentration impurity regions 162 is formed in a region overlapped with neither the conductive film 182d nor the conductive film 184d.

Next, the resist mask 166 is selectively formed so as to cover the regions 106, 108, and 110, and an impurity element is introduced into the region 104 by using the resist mask 166 and the gate electrode 140 as masks, thereby forming impurity regions (see FIG. 23B). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, an impurity element having a conductivity type which is different from that of the impurity element introduced into the regions 106, 108, and 110, (e.g., boron (B)) is introduced. In this manner, the high-concentration impurity regions 170 forming source and drain regions, low-concentration impurity regions 188 forming LDD regions, and the channel formation region 168 are formed in the region 104.

The low-concentration impurity regions 188 in the region 104 are formed by the introduction of the impurity element shown in FIG. 23A passed through the conductive film 182a. Therefore, in the region 104, the channel formation region 168 is formed in a region overlapped with both the conductive film 182a and the conductive film 184a, each of the low-concentration impurity regions 188 is formed in a region overlapped with the conductive film 182a while not overlapped with the conductive film 184a, and each of the high-concentration impurity regions 170 is formed in a region overlapped with neither the conductive film 182a nor the conductive film 184a.

Next, the insulating film 172 is formed so as to cover the second insulating film 128, the third insulating films 132 and 134, the gate electrodes 140, 142, and 146, and the control gate electrode 144, and over the insulating film 172, the conductive film 174 is formed so as to electrically connect to the impurity regions 170, 152, 156, and 162 formed in the regions 104, 106, 108, and 110 respectively (see FIG. 23B).

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied at writing and erasing operations of a nonvolatile memory element. In the nonvolatile memory element, charge injection from the semiconductor substrate into the floating gate is made easy and charges are prevented from being vanished from the floating gate electrode. That is, in the case of operating as a memory, highly efficient writing at a low voltage can be performed and the charge holding property can be improved. This embodiment enables such a nonvolatile semiconductor memory device having such superior effects to be manufactured by consecutive steps.

This embodiment can be implemented combining with the other embodiment mode and embodiments described in this specification.

Embodiment 3

This embodiment will describe a manufacturing method of a nonvolatile semiconductor memory device, which is different from Embodiments 1 and 2, with reference to the drawings. The same ones as those in Embodiments 1 and 2 are denoted by the same reference symbols, and repeat description thereof is omitted. Note that in FIGS. 27A to 27C, 28A to 28C, and 29A to 29C, portions between A and B and between C and D illustrate transistors provided in a logic portion, a portion between E and F illustrates a nonvolatile memory element provided in a memory portion, and a portion between G and H illustrates a transistor provided in the memory portion. In addition, although description in this embodiment is made on the case where the transistor provided in the portion between A and B is of a p-channel type, the transistors provided in the portions between C and D and between G and H are of an n-channel type, and carrier movement of the nonvolatile memory element provided in the portion between E and F is performed by electrons, the nonvolatile semiconductor device of the present invention is not limited to this.

Figure 27A:
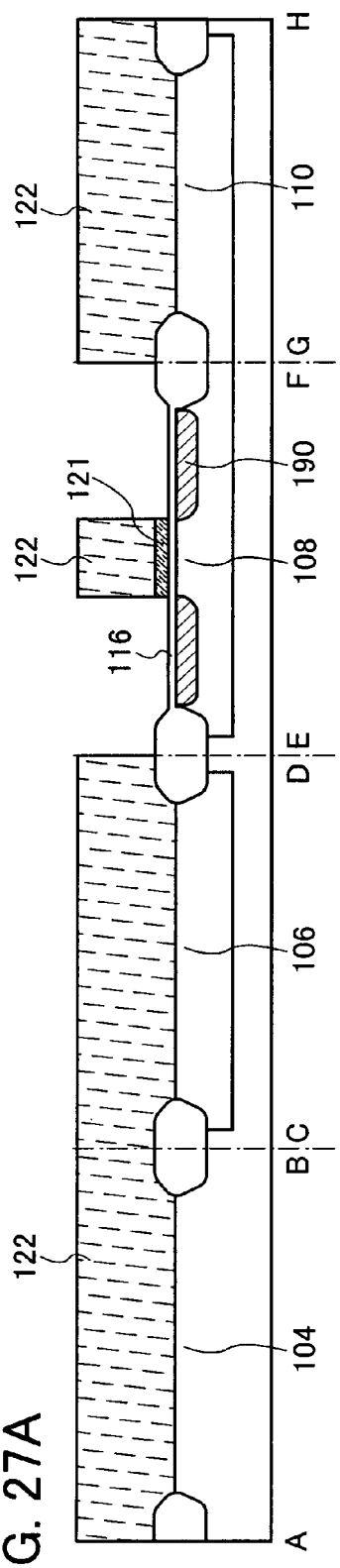
FIGS. 27A to 27C are diagrams showing one example of a manufacturing method of a nonvolatile semiconductor memory device of the present invention.

First, after the state of FIG. 17C is obtained by forming similarly, an impurity element is introduced into the region 108 by using the resist mask 122 as a mask, thereby forming impurity regions 190 (see FIG. 27A). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, phosphorus (P) is introduced into the region 108.

Figure 27B:
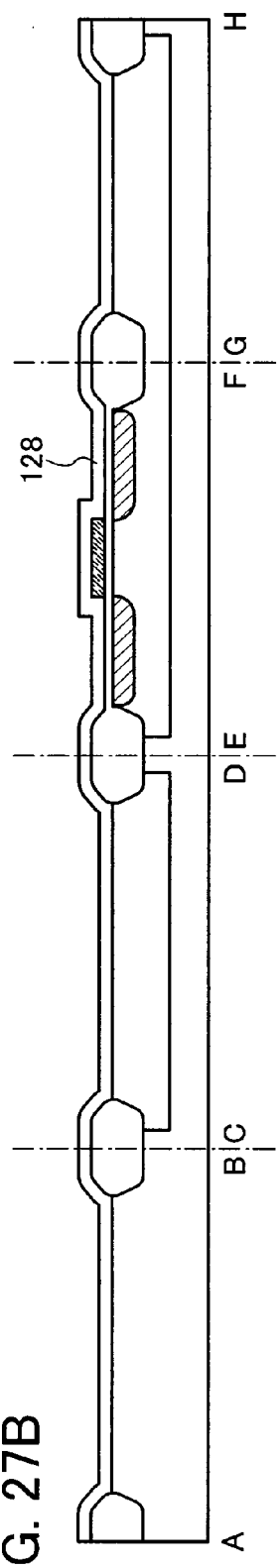

Next, the second insulating film 128 is formed so as to cover the regions 104, 106, and 110, and the first insulating film 116 and the floating gate electrode 121 which are formed over the region 108 (see FIG. 27B).

Figure 27C:
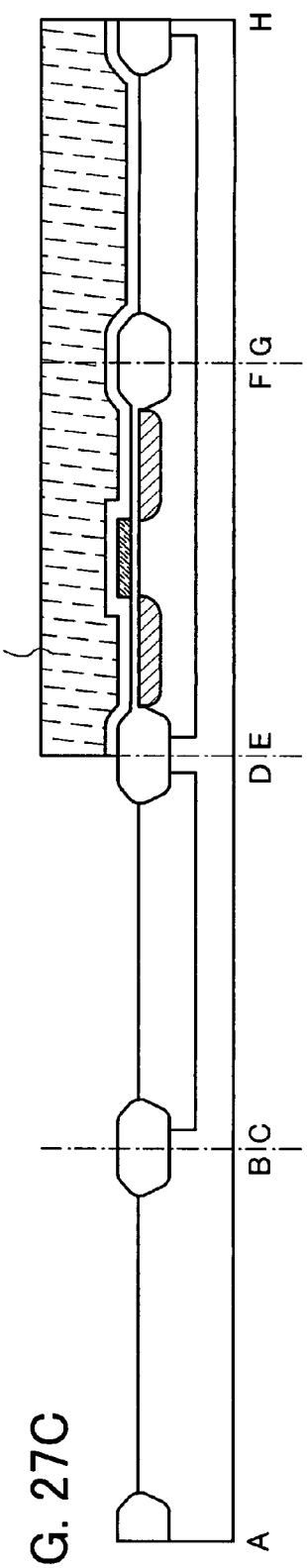

Next, the resist mask 130 is selectively formed so as to cover the second insulating film 128 formed over the regions 108 and 110, and the second insulating film 128 formed over the regions 104 and 106 is selectively removed (see FIG. 27C).

Next, the third insulating films 132 and 134 are formed so as to cover the regions 104 and 106 respectively (see FIG. 28A).

Next, the conductive film is formed so as to cover the third insulating films 132 and 134 formed over the regions 104 and 106 and the second insulating film 128 formed over the regions 108 and 110 (see FIG. 28B). In the example described in this embodiment, the conductive film 136 and the conductive film 138 are stacked sequentially as the conductive film. It is needless to say that the conductive film may also be formed with a single-layer structure or a staked-layer structure including three or more layers.

Next, by selectively etching away the conductive films 136 and 138 which are stacked, the conductive films 136 and 138 are partially left over the regions 104, 106, 108, and 110 to form the gate electrodes 140, 142, and 146, and the control gate electrode 144 (see FIG. 28C).

Note that, in accordance with this embodiment, the width of the control gate electrode 144 formed over the region 108 is larger than the width (width in a about parallel direction to a direction of carrier flow in the channel) of the floating gate electrode 121.

Next, the resist mask 148 is selectively formed so as to cover the region 104, and an impurity element is introduced into the regions 106, 108, and 110 by using the resist mask 148, the gate electrodes 142 and 146, and the control gate electrode 144 as masks, thereby forming impurity regions (see FIG. 29A). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, phosphorus (P) is used as the impurity element.

In FIG. 29A, by introducing the impurity element, the high-concentration impurity regions 152 forming source and drain regions and the channel formation region 150 are formed in the region 106. In the region 108, the impurity regions 156 forming source and drain regions, the low-concentration impurity regions 158 forming LDD regions, and the channel formation region 154 are formed. In the region 110, the high-concentration impurity regions 162 forming source and drain regions and the channel formation region 160 are formed.

Next, the resist mask 166 is selectively formed so as to cover the regions 106, 108, and 110, and an impurity element is introduced into the region 104 by using the resist mask 166 and the gate electrode 140 as masks, thereby forming impurity regions (see FIG. 29B). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, an impurity element having a conductivity type which is different from that of the impurity element introduced into the regions 106, 108, and 110 in FIG. 29A, (e.g., boron (B)) is introduced. In this manner, the high-concentration impurity regions 170 forming source and drain regions and the channel formation region 168 are formed in the region 104.

Next, the insulating film 172 is formed so as to cover the second insulating film 128, the third insulating films 132 and 134, the gate electrodes 140, 142, and 146, and the control gate electrode 144, and over the insulating film 172, the conductive film 174 is formed so as to electrically connect to the impurity regions 170, 152, 156, and 162 formed in the regions 104, 106, 108, and 110 respectively (see FIG. 29C).

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied at writing and erasing operations of a nonvolatile memory element. In the nonvolatile memory element, charge injection from the semiconductor substrate into the floating gate is made easy and charges are prevented from being vanished from the floating gate electrode. That is, in the case of operating as a memory, highly efficient writing at a low voltage can be performed and the charge holding property can be improved. This embodiment enables such a nonvolatile semiconductor memory device having such superior effects to be manufactured by consecutive steps.

This embodiment can be implemented combining with the other embodiment mode and embodiments described in this specification.

Embodiment 4

This embodiment will describe a manufacturing method of a nonvolatile semiconductor memory device, which is different from Embodiments 1 to 3, with reference to the drawings. The same ones as those in Embodiments 1 to 3 are denoted by the same reference symbols, and repeat description thereof is omitted. Note that in FIGS. 24A to 24C, 25A to 25C, and 26A to 26C, portions between A and B, and between C and D illustrate transistors provided in a logic portion, a portion between E and F illustrates a nonvolatile memory element provided in a memory portion, and a portion between G and H illustrates a transistor provided in the memory portion. In addition, although description in this embodiment is made on the case where the transistor provided in the portion between A and B is of a p-channel type, the transistors provided in the portions between C and D and between G and H are of an n-channel type, and carrier movement of the nonvolatile memory element provided in the portion between E and F is performed by electrons, the nonvolatile semiconductor device of the present invention is not limited to this.

First, after the state of FIG. 17B is obtained by forming similarly, a resist mask is formed so as to cover the regions 104, 106, and 108 and a part of the region 110, and an impurity element is introduced into the other part of the region 110 which is not covered with the resist mask, thereby forming the impurity regions 126 as shown in FIG. 18A. Then, the resist mask is removed, and the second insulating film 128 is formed so as to cover the regions 104, 106, and 110, and the first insulating film 116 and the floating gate electrode 120 which are formed over the region 108 (see FIG. 24A).

Figure 24A:
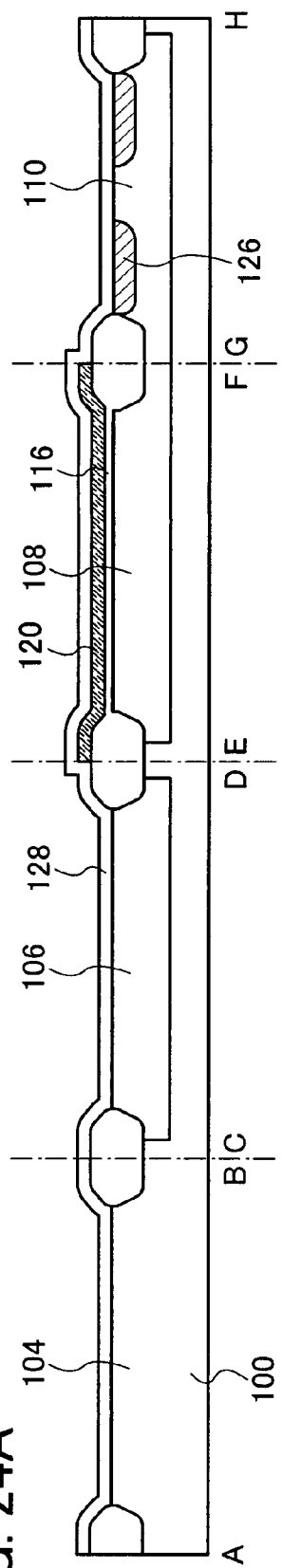
FIGS. 24A to 24C are diagrams showing one example of a manufacturing method of a nonvolatile semiconductor memory device of the present invention.
Figure 24B:
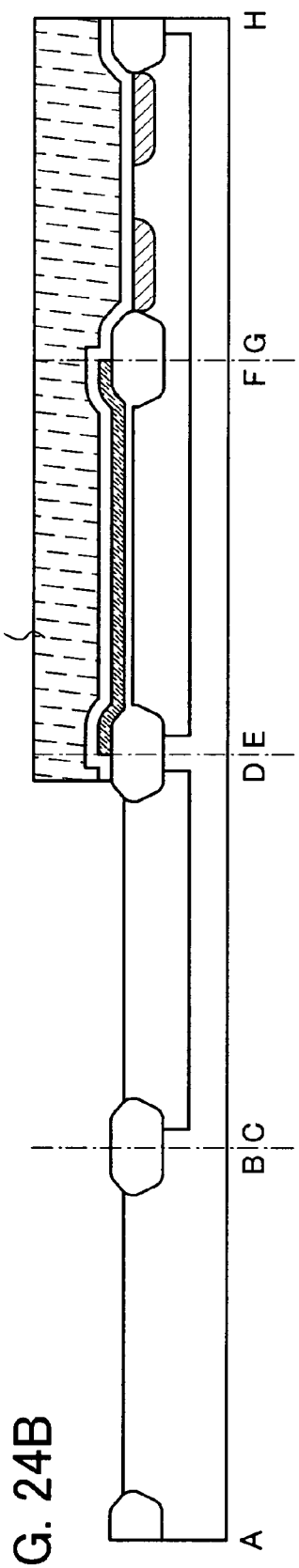

Next, the resist mask 130 is selectively formed so as to cover the second insulating film 128 formed over the regions 108 and 110, and the second insulating film 128 formed over the regions 104 and 106 is selectively removed (see FIG. 24B).

Figure 24C:
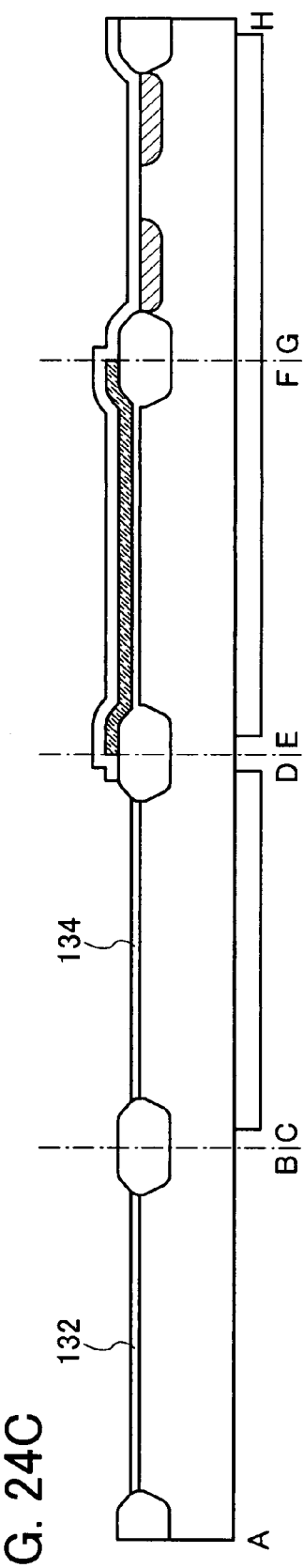

Next, the third insulating films 132 and 134 are formed so as to cover the regions 104 and 106 respectively (see FIG. 24C).

Next, the conductive film is formed so as to cover the third insulating films 132 and 134 formed over the regions 104 and 106 and the second insulating film 128 formed over the regions 108 and 110 (see FIG. 25A). In the example described in this embodiment, the conductive film 136 and the conductive film 138 are stacked sequentially as the conductive film. It is needless to say that the conductive film may also be formed with a single-layer structure or a staked-layer structure including three or more layers.

Next, by selectively etching away the conductive films 136 and 138 which are stacked, the conductive films 136 and 138 are partially left over the regions 104, 106, 108, and 110 to form the gate electrodes 140, 142, and 146, and the control gate electrode 144 (see FIG. 25B). In addition, in this embodiment, parts of surfaces of the regions 104, 106, 108, and 110, which are not overlapped with the gate electrodes 140, 142, and 146, and the control gate electrode 144 are exposed.

Specifically, in the region 104, a part of the third insulating film 132 formed under the gate electrode 140, which is not overlapped with the gate electrode 140 is selectively removed so that ends of the gate electrode 140 and the third insulating film 132 substantially align with each other. In the region 106, a part of the third insulating film 134 formed under the gate electrode 142, which is not overlapped with the gate electrode 142 is selectively removed so that ends of the gate electrode 142 and the third insulating film 134 substantially align with each other. In the region 108, parts of the second insulating film 128, the floating gate electrode 120, and the first insulating film 116 formed under the control gate electrode 144, which are not overlapped with the control gate electrode 144 are selectively removed so that ends of the control gate electrode 144, the second insulating film 128, the floating gate electrode 120, and the first insulating film 116 substantially align with one another. In the region 110, a part of the second insulating film 128 formed under the gate electrode 146, which is not overlapped with the gate electrode 146 is selectively removed so that ends of the gate electrode 146 and the second insulating film 128 substantially align with each other.

In this case, the insulating films and the like at the non-overlapped portions may be removed at the same time as the formation of the gate electrodes 140, 142, and 146, and the control gate electrode 144, or may be removed, after forming the gate electrodes 140, 142, and 146, and the control gate electrode 144, by using the left resist mask or the gate electrodes 140, 142, and 146, and the control gate electrode 144 as masks.

Next, the resist mask 148 is selectively formed so as to cover the region 104, and an impurity element is introduced into the regions 106, 108, and 110 by using the resist mask 148, the gate electrodes 142 and 146, and the control gate electrode 144 as masks, thereby forming impurity regions (see FIG. 25C). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, phosphorus (P) is used as the impurity element.

In FIG. 25C, by introducing the impurity element, the high-concentration impurity regions 152 forming source and drain regions and the channel formation region 150 are formed in the region 106. In the region 108, the impurity regions 156 forming source and drain regions and the channel formation region 154 are formed. In the region 110, the high-concentration impurity regions 162 forming source and drain regions, the low-concentration impurity regions 164 forming LDD regions, and the channel formation region 160 are formed.

Figure 26A:
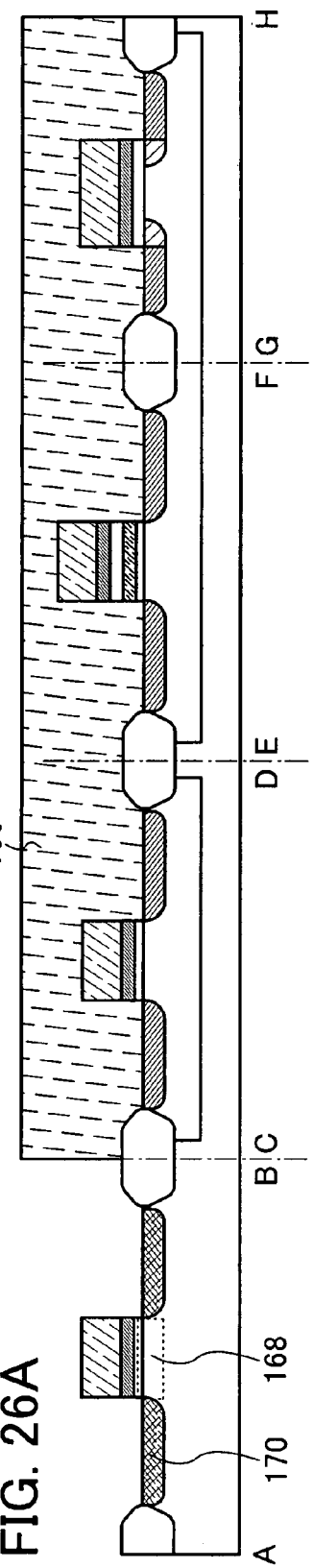
FIGS. 26A to 26C are diagrams showing one example of a manufacturing method of a nonvolatile semiconductor memory device of the present invention.

Next, the resist mask 166 is selectively formed so as to cover the regions 106, 108, and 110, and an impurity element is introduced into the region 104 by using the resist mask 166 and the gate electrode 140 as masks, thereby forming impurity regions (see FIG. 26A). As the impurity element, an impurity element having n-type conductivity or an impurity element having p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. In this embodiment, an impurity element having a conductivity type which is different from that of the impurity element introduced into the regions 106, 108, and 110 in FIG. 25C, (e.g., boron (B)) is introduced. In this manner, the impurity regions 170 forming source and drain regions and the channel formation region 168 are formed in the region 104.

Note that in this embodiment, the introduction of the impurity element is performed while exposing the parts of the regions 104, 106, 108, and 110 which are not overlapped with the gate electrodes 140, 142, and 146, and the control gate electrode 144 in FIGS. 25C and 26A. Therefore, the channel formation regions 168, 150, 154, 160 respectively formed in the regions 104, 106, 108, and 110 can be formed in a self-aligned manner with the gate electrodes 140, 142, and 146, and the control gate electrode 144.

Figure 26B:
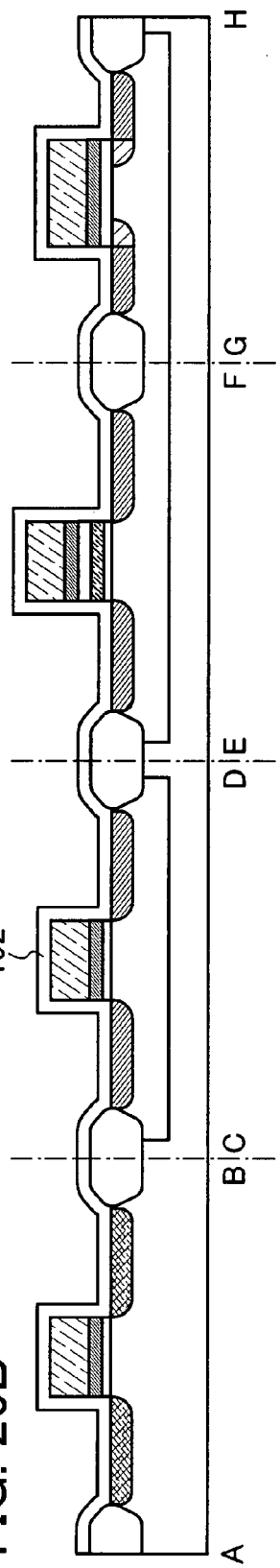

Next, an insulating film 192 is formed so as to cover the exposed regions 104, 106, 108, and 110, the gate electrodes 140, 142, and 146, and the control gate electrode 144 (see FIG. 26B).

The insulating film 192 can be formed with a single-layer structure or a plural-layer structure of an insulating film containing oxygen or nitrogen of silicon oxide ($SiO_x$), silicon nitride ($SiN_x$), silicon oxynitride ($SiO_xN_y$ (x>y)), or silicon nitride oxide ($SiN_xO_y$ (x>y)); DLC (Diamond Like Carbon); or the like by CVD, sputtering, or the like.

Figure 26C:
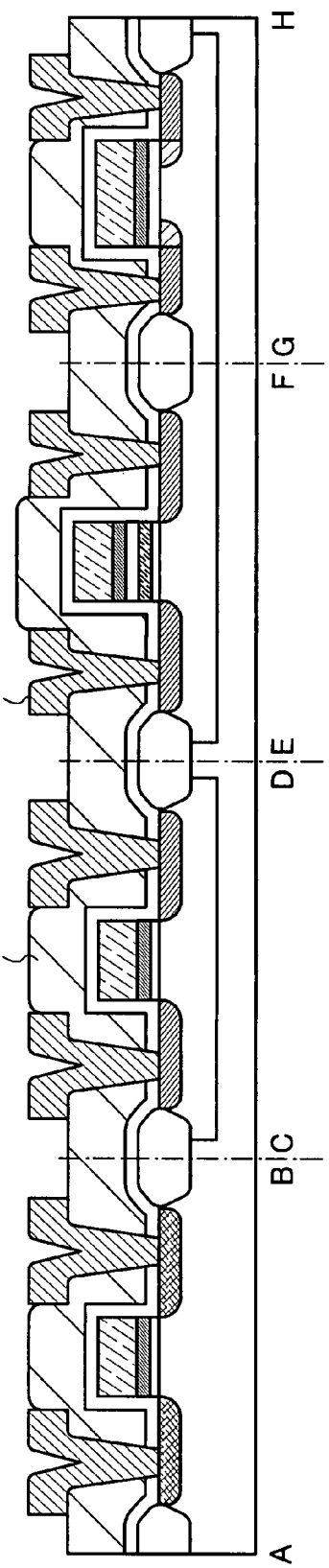

Next, the insulating film 172 is formed so as to cover the second insulating film 128, the third insulating films 132 and 134, the gate electrodes 140, 142, and 146, and the control gate electrode 144, and over the insulating film 172, the conductive film 174 is formed so as to electrically connect to the impurity regions 170, 152, 156, and 162 formed in the regions 104, 106, 108, and 110 respectively (see FIG. 26C).

The insulating film 172 can be formed using any material described in Embodiment 1. For example, an insulating film having an inorganic material containing oxygen or nitrogen of silicon oxide ($SiO_x$), silicon nitride ($SiN_x$), silicon oxynitride ($SiO_xN_y$ (x>y)), or silicon nitride oxide ($SiN_xO_y$ (x>y)) can be used as the insulating film 192, and the insulating film 172 can be formed of an organic material such as epoxy, polyimide, polyamide, polyvinyl phenol, benzocyclobutene, or acrylic. It is needless to say that both of the insulating film 192 and the insulating film 172 can also be formed of an insulating film having an inorganic material.

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied at writing and erasing operations of a nonvolatile memory element. In the nonvolatile memory element, charge injection from the semiconductor substrate into the floating gate is made easy and charges are prevented from being vanished from the floating gate electrode. That is, in the case of operating as a memory, highly efficient writing at a low voltage can be performed and the charge holding property can be improved. This embodiment enables such a nonvolatile semiconductor memory device having such superior effects to be manufactured by consecutive steps.

This embodiment can be implemented combining with the other embodiment mode and embodiments described in this specification.

Embodiment 5

This embodiment will describe a manufacturing method of a nonvolatile semiconductor memory device, which is different from the over embodiments, with reference to the drawings. Note that FIGS. 36A and 36B, 38A and 38B, and 39A and 39B are top-plan diagrams, FIGS. 30A to 30C, 31A to 31C, 32A to 32C, 33A to 33C, 34A and 34B, and 35 are cross-sectional diagrams taken along a line A-B or E-F in FIGS. 36A and 36B, 38A and 38B, and 39A and 39B, and FIGS. 37A to 37C are cross-sectional diagrams taken along a line C-D in FIGS. 36A and 36B, 38A and 38B, and 39A and 39B. The portion between A and B illustrates a transistor and a nonvolatile memory element provided in a memory portion, the portion between C and D illustrates a nonvolatile memory element provided in the memory portion, and the portion between E and F illustrates a transistor provided in a logic portion. In addition, although description in this embodiment is made on the case where the transistor provided in a region 212 in a substrate 200 between E and F is of a p-channel type and the transistor provided in a region 213 is of an n-channel type, the transistor provided in a region 214 in the substrate 200 between A and B is of an n-channel type, and carrier movement of the nonvolatile memory element is performed by electrons, the nonvolatile semiconductor device of the present invention is not limited to this.

First, an insulating film is formed over the substrate 200. In this embodiment, single crystalline silicon having n-type conductivity is used for the substrate 200, and an insulating film 202 and an insulating film 204 are formed over the substrate 200 (see FIG. 30A). For example, silicon oxide ($SiO_x$) is formed for the insulating film 202 by performing heat treatment to the substrate 200, and a film of silicon nitride ($SiN_x$) is formed over the insulating film 202 by CVD.

Any semiconductor substrate can be used as the substrate 200. For example, a single crystalline silicon substrate having n-type or p-type conductivity, a compound semiconductor substrate (e.g., GaAs substrate, InP substrate, GaN substrate, SiC substrate, sapphire substrate, or ZnSe substrate), or an SOI (Silicon On Insulator) substrate manufactured by a bonding method or a SIMOX (Separation by Implanted Oxygen) method can be used.

Further, the insulating film 204 may also be provided by nitriding the insulating film 202 with high-density plasma treatment after the insulating film 202 is formed. Note that such an insulating film over the substrate 200 may also be formed with a single-layer structure or a staked-layer structure including three or more layers.

Figure 30A:
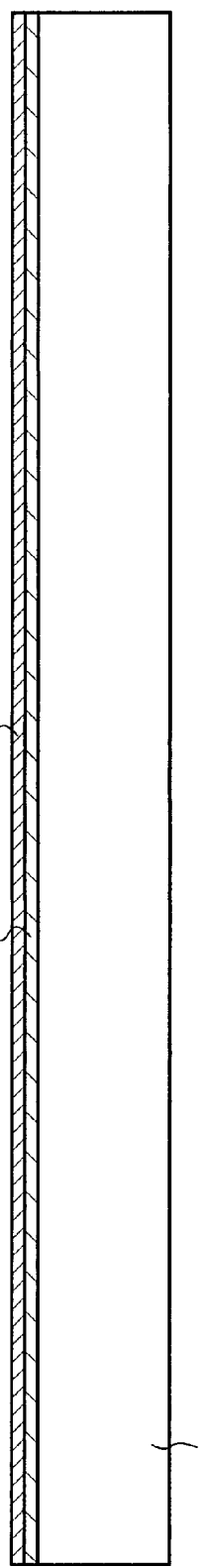
FIGS. 30A to 30C are diagrams showing one example of a manufacturing method of a nonvolatile semiconductor memory device of the present invention.
Figure 30B:
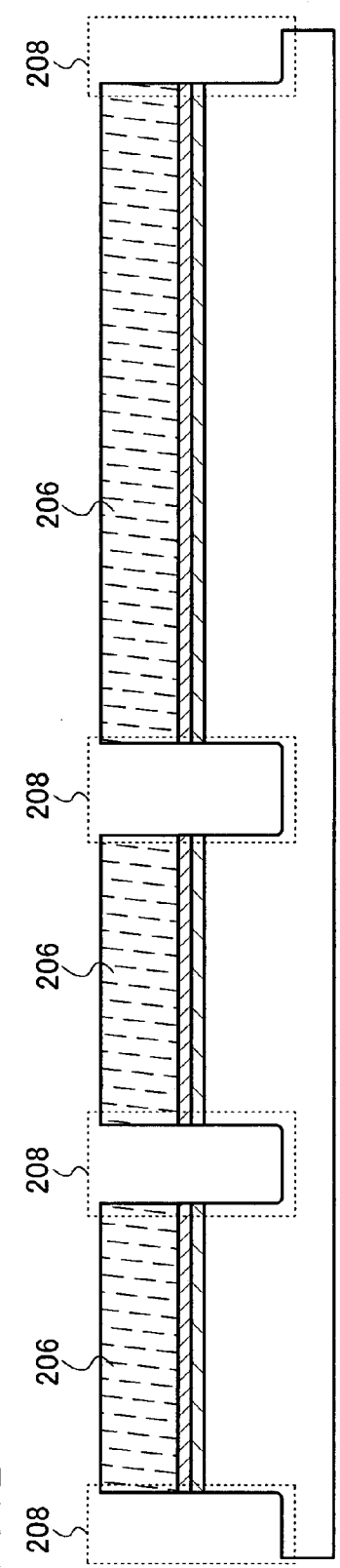

Next, a pattern of a resist mask 206 is selectively formed over the insulating film 204, and etching is selectively performed using the resist mask 206 as a mask, thereby forming recesses 208 selectively in the substrate 200 (see FIG. 30B). The etching of the substrate 200 and the insulating films 202 and 204 can be performed by dry etching utilizing plasma.

Figure 30C:
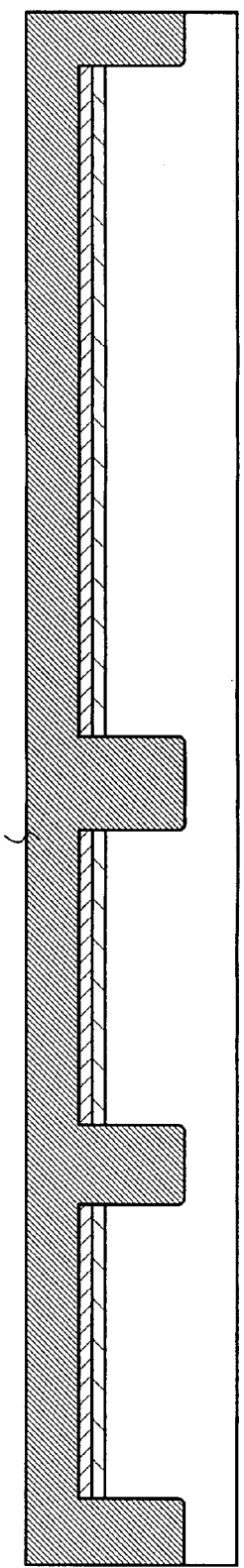

Next, after the pattern of the resist mask 206 is removed, an insulating film 210 is formed so as to fill the recesses 208 formed in the substrate 200 (see FIG. 30C).

The insulating film 210 is formed using an insulating material such as silicon oxide, silicon nitride, silicon oxynitride ($SiO_xN_y$ (x>y)), or silicon nitride oxide ($SiN_xO_y$ (x>y)) by CVD, sputtering, or the like. In this embodiment, a silicon oxide film is formed as the insulating film 210 by using a TEOS (Tetra-Ethyl-Ortho Silicate) gas by normal-pressure CVD or low-pressure CVD.

Next, a surface of the substrate 200 is exposed by performing grinding treatment, polishing treatment, or CMP (Chemical Mechanical Polishing) treatment. In this embodiment, by exposing the surface of the substrate 200, the regions 212 and 213 and a region 214 are each provided between insulating films 211 formed in the recesses 208 in the substrate 200. Note that the insulating films 211 are formed by removing the insulating film 210 formed on the surface of the substrate 200, by grinding treatment, polishing treatment, or CMP treatment. Then, an impurity element having p-type conductivity is selectively introduced, thereby forming p-wells 215 in the regions 213 and 214 in the substrate 200 (see FIGS. 31A, 36A and 36B, and 37A).

As the impurity element having p-type conductivity, boron (B), aluminum (Al), gallium (Ga), or the like can be used. In this embodiment, boron (B) is introduced as the impurity element into the regions 213 and 214.

Note that although an impurity element is not introduced into the region 212 since the semiconductor substrate having n-type conductivity is used as the semiconductor substrate 200 in this embodiment, an n-well may be formed in the region 212 by introducing an impurity element having n-type conductivity. As the n-type impurity element having n-type conductivity, phosphorus (P), arsenic (As), or the like can be used.

In the case where a semiconductor substrate having p-type conductivity is used, a structure may be employed in which an n-well is formed in the region 212 by introducing an impurity element having n-type conductivity and an impurity element is not introduced into the regions 213 and 214.

Next, first insulating films 216, 218, and 220 are formed over the regions 212, 213, and 214 respectively formed in the substrate 200. Then, a floating gate electrode 222 (a film containing germanium (Ge) as a main component) is formed so as to cover the first insulating films 216, 218, and 220 (see FIG. 31B).

Each of the first insulating films 216, 218, and 220 can be formed of a silicon oxide film by oxidizing each surface of the regions 212, 213, and 214 in the substrate 200 with heat treatment. Alternatively, each of the first insulating films 216, 218, and 220 can be formed with a stacked-layer structure of a silicon oxide film and a film containing oxygen and nitrogen (silicon oxynitride film) by forming the silicon oxide film with a thermal oxidation method and then nitriding a surface of the silicon oxide film with nitridation treatment.

Further alternatively, as described above, the first insulating films 216, 218, and 220 can be formed using plasma treatment. For example, by performing oxidation treatment or nitridation treatment with high-density plasma treatment to the surfaces of the regions 212, 213, and 214 in the substrate 200, silicon oxide ($SiO_x$) films or silicon nitride ($SiN_x$) films are formed as the first insulating films 216, 218, and 220. Further, after oxidation treatment is performed to the surfaces of the regions 212, 213, and 214 with high-density plasma treatment, nitridation treatment may be performed by performing high-density plasma treatment again. In this case, silicon oxide films are formed on the surfaces of the regions 212, 213, and 214, and silicon oxynitride films are formed on the silicon oxide films, so that each of the first insulating films 216, 218, and 220 is formed with the stacked-layer film of the silicon oxide film and the silicon oxynitride film. Further alternatively, after silicon oxide films are formed on the surfaces of the regions 212, 213, and 214 by a thermal oxidation method, oxidation treatment or nitridation treatment may be performed by high-density plasma treatment.

In this embodiment, the first insulating film 220 which is formed over the region 214 provided in the memory portion in the substrate 200 functions as a tunnel oxide film in a nonvolatile memory element completed later. Therefore, as the thickness of the first insulating film 220 is smaller, a larger amount of tunnel current flows so that a high-speed operation as a memory can be realized. In addition, as the thickness of the first insulating film 220 is smaller, charge accumulation in the floating gate electrode 222 can be performed at a lower voltage so that power consumption of a nonvolatile semiconductor memory device can be reduced. Therefore, the first insulating film 220 is preferably formed at a small thickness.

The floating gate electrode 222 can be formed of a film containing germanium (Ge) such as germanium or a silicon-germanium alloy. In this embodiment, by performing plasma CVD in an atmosphere containing a germanium element (e.g., $GeH_4$), a film containing germanium as a main component is formed as the floating gate electrode 222. In such a case where the single crystalline silicon substrate is used as the substrate 200 and the film containing germanium which has a smaller energy gap than that of silicon is provided as the floating gate electrode over the certain region of the silicon substrate with the first insulating layer functioning as the tunnel oxide film interposed therebetween, a second barrier formed by the insulating layer with respect to electrons in the floating gate electrode becomes energetically higher than a first barrier formed by the insulating layer with respect to electrons in the certain region of the silicon substrate. Consequently, charges can be injected easily from the certain region of the silicon substrate into the floating gate electrode and charges can be prevented from being vanished from the floating gate electrode. That is, in the case of operating as a memory, highly efficient writing at a low voltage can be performed and the charge holding property can be improved. Note also that the floating gate electrode 222 formed over the region 214 provided in the memory portion in the substrate 200 functions as a floating gate in a nonvolatile memory element completed later.

Next, a resist mask 223 is formed over the floating gate electrode 222, and the floating gate electrode 222 and the first insulating films 216, 218, and 220 are selectively removed by using the resist mask 223 as a mask. In this embodiment, the resist mask 223 is formed so as to cover a part of the region 214 in the substrate 200, and the other parts of the floating gate electrode 222 and the first insulating films 216, 218, and 220 which are not covered with the resist mask 223 are removed, so that the first insulating film 220 and the floating gate electrode 222 are partially left to form a first insulating film 224 and a floating gate electrode 226 (see FIG. 31C). Specifically, the first insulating film 220 and the floating gate electrode 222 provided in a region for forming a nonvolatile memory element later in the region 214 are left. In addition, surfaces of the regions 212 and 213 in the substrate 200 and a part of the region 214 are exposed.

Figure 32A:
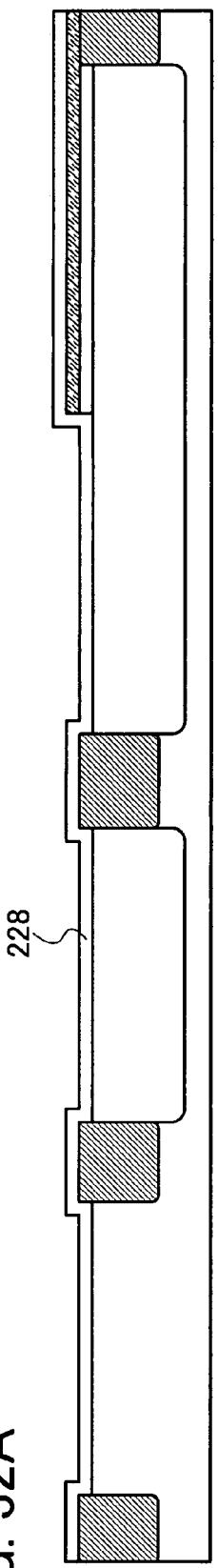
FIGS. 32A to 32C are diagrams showing one example of a manufacturing method of a nonvolatile semiconductor memory device of the present invention.

Next, a second insulating film 228 is formed so as to cover the regions 212, 213, and 214 in the substrate 200 and the floating gate electrode 222 (see FIG. 32A).

The second insulating film 228 is formed of a single layer or a plurality of layers using an insulating material such as silicon oxide, silicon nitride, silicon oxynitride ($SiO_xN_y$ (x>y)), or silicon nitride oxide ($SiN_xO_y$ (x>y)) by CVD, sputtering, or the like. For example, when forming the second insulating film 228 of a single layer, a silicon oxynitride film or a silicon nitride oxide film is formed with a thickness of 5 nm to 50 nm inclusive by CVD. Further, when forming the second insulating film 228 with a three-layer structure, a silicon oxynitride film is formed as the first-layer insulating film, a silicon nitride film is formed as the second-layer insulating film, and a silicon oxynitride film is formed as the third-layer insulating film.

Note that the second insulating film 228 formed over the floating gate electrode 222 in the region 214 in the substrate 200 functions as a control insulating film in a nonvolatile memory element completed later, and the second insulating film 228 formed over the exposed region 214 functions as a gate insulating film in a transistor completed later.

Figure 32B:
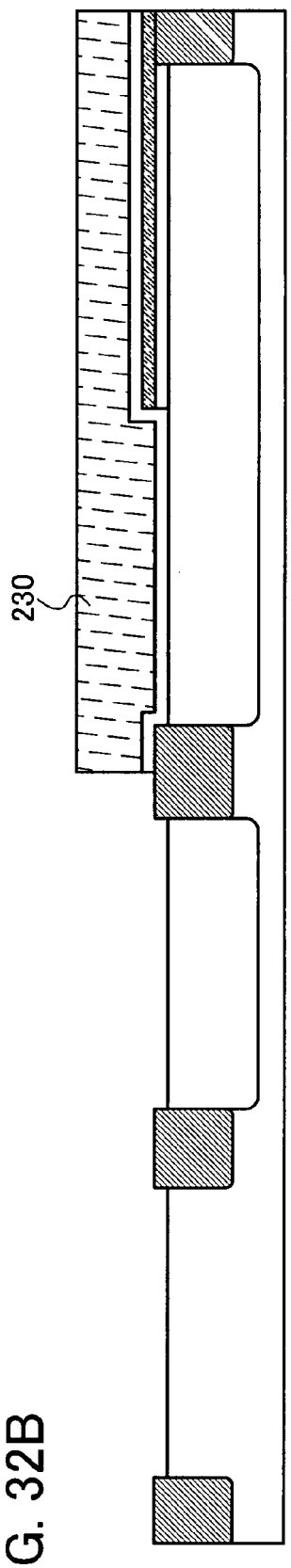

Next, a resist mask 230 is selectively formed so as to cover the second insulating film 228 formed over the region 214 in the substrate 200, and the second insulating film 228 formed over the regions 212 and 213 in the substrate 200 is selectively removed (see FIG. 32B).

Figure 32C:
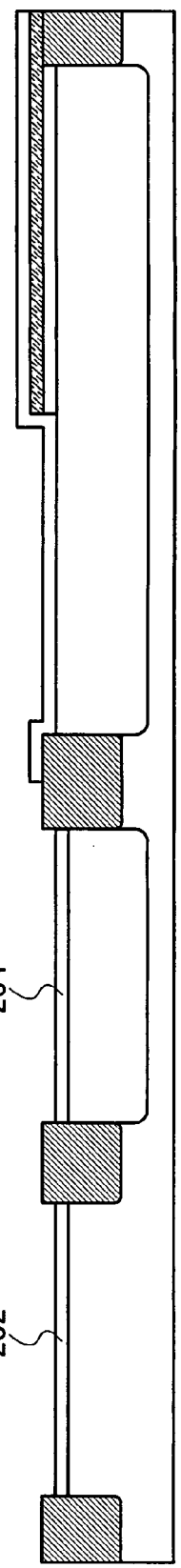

Next, third insulating films 232 and 234 are formed on surfaces of the regions 212 and 213 in the substrate 200 respectively (see FIG. 32C).

The third insulating films 232 and 234 are formed by any method described as the method of forming the above-described first insulating films 216, 218, and 220. For example, each of the third insulating films 232 and 234 can be formed of a silicon oxide film by oxidizing each surface of the regions 212 and 213 in the substrate 200 with heat treatment. Alternatively, each of the third insulating films 232 and 234 can be formed with a stacked-layer structure of a silicon oxide film and a film containing oxygen and nitrogen (silicon oxynitride film) by forming the silicon oxide film with a thermal oxidation method and then nitriding a surface of the silicon oxide film with nitridation treatment.

Further alternatively, as described above, the third insulating films 232 and 234 may be formed using plasma treatment. For example, by performing oxidation treatment or nitridation treatment with high-density plasma treatment to the surfaces of the regions 212 and 213 in the substrate 200, silicon oxide ($SiO_x$) films or silicon nitride ($SiN_x$) films can be formed as the third insulating films 232 and 234. Further, after oxidation treatment is performed to the surfaces of the regions 212 and 213 with high-density plasma treatment, nitridation treatment may be performed by performing high-density plasma treatment again. In this case, silicon oxide films are formed on the surfaces of the regions 212 and 213, and silicon oxynitride films are formed on the silicon oxide films, so that each of the third insulating films 232 and 234 is formed with the stacked-layer film of the silicon oxide film and the silicon oxynitride film. Further alternatively, after silicon oxide films are formed on the surfaces of the regions 212 and 213 by a thermal oxidation method, oxidation treatment or nitridation treatment may be performed by high-density plasma treatment.

Note that in forming the third insulating films 232 and 234 by a thermal oxidation method or high-density plasma treatment, the oxide film or the silicon oxide film may also be formed on the second insulating film 228 formed over the region 214 in the substrate 200. The third insulating films 232 and 234 formed over the regions 212 and 213 in the substrate 200 function as gate insulating films in transistors completed later.

Next, a conductive film is formed so as to cover the third insulating films 232 and 234 formed over the regions 212 and 213 in the substrate 200 and the second insulating film 228 formed over the region 214 (see FIG. 33A). In the example described in this embodiment, a conductive film 236 and a conductive film 238 are stacked sequentially as the conductive film. It is needless to say that the conductive film may also be formed with a single-layer structure or a staked-layer structure including three or more layers.

The conductive films 236 and 238 can be formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing the element as a main component. Further, a metal nitride film obtained by nitriding the element can also be used. Further alternatively, a semiconductor material typified by polycrystalline silicon added with an impurity element such as phosphorus can be used.

In this embodiment, a stacked-layer structure is formed by forming the conductive film 236 of tantalum nitride and the conductive film 238 of tungsten sequentially. Alternatively, a single-layer film or a plural-layer film of tantalum nitride, tungsten nitride, molybdenum nitride, or titanium nitride can be used as the conductive film 236, and a single-layer film or a plural-layer film of tungsten, tantalum, molybdenum, or titanium can be used as the conductive film 238.

Figure 37A:
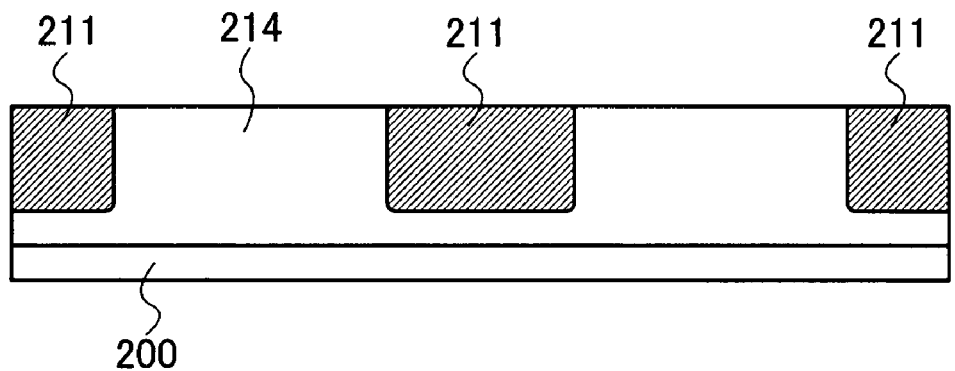
FIGS. 37A to 37C are diagrams each showing one example of a top surface of a nonvolatile semiconductor memory device of the present invention.
Figure 37B:
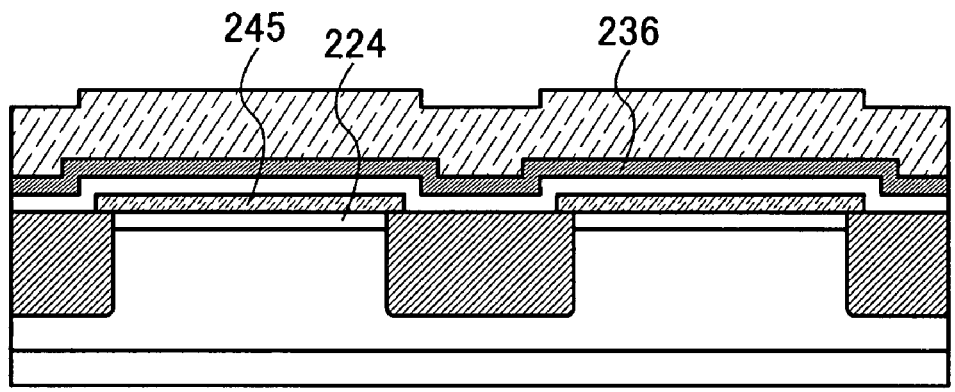
Figure 37C:
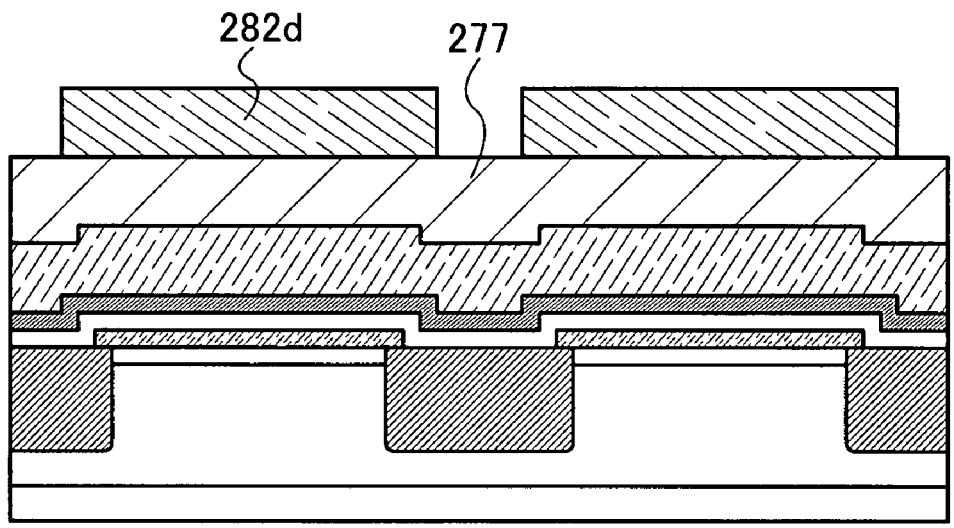

Next, by selectively etching away the conductive films 236 and 238 which are stacked, the conductive films 236 and 238 are partially left over the regions 212, 213, and 214 in the substrate 200 to form conductive films 240, 242, 244, and 246 each functioning as a gate electrode (see FIGS. 33B and 37B). In addition, in this embodiment, surfaces of parts of the regions 212, 213, and 214 which are not overlapped with the conductive films 240, 242, 244, and 246 are exposed in the substrate 200. Note that the control gate electrode 244 functions as a control gate in a nonvolatile memory element completed later.

Specifically, in the region 212 in the substrate 200, a part of the third insulating film 232 formed under the conductive film 240, which is not overlapped with the conductive film 240 is selectively removed so that ends of the conductive film 240 and the third insulating film 232 substantially align with each other. In the region 213 in the substrate 200, a part of the third insulating film 234 formed under the conductive film 242, which is not overlapped with the conductive film 242 is selectively removed so that ends of the conductive film 242 and the third insulating film 234 substantially align with each other. In the region 214 in the substrate 200, a part of the second insulating film 228 formed under the conductive film 244, which is not overlapped with the conductive film 244 is selectively removed so that ends of the conductive film 244 and the second insulating film 228 substantially align with each other. Further, also in the region 214 in the substrate 200, parts of the second insulating film 228, the floating gate electrode 226, and the first insulating film 224 formed under the conductive film 246, which are not overlapped with the conductive film 246 are selectively removed so that ends of the conductive film 246, the second insulating film 228, the floating gate electrode 226, and the first insulating film 224 substantially align with one another.

In this case, the insulating films and the like at the non-overlapped portions may be removed at the same time as the formation of the conductive films 240, 242, 244, and 246, or may be removed, after forming the conductive films 240, 242, 244, and 246, by using the left resist mask or the conductive films 240, 242, 244, and 246 as masks.

Next, an impurity element is selectively introduced into the regions 212, 213, and 214 in the substrate 200 (see FIG. 33C). In this embodiment, an impurity element having n-type conductivity is selectively introduced into the regions 213 and 214 at a low concentration by using the conductive films 242, 244, and 246 as masks, while an impurity element having p-type conductivity is selectively introduced into the region 212 at a low concentration by using the conductive film 240 as a mask. As the impurity element having n-type conductivity, phosphorus (P), arsenic (As), or the like can be used. As the impurity element having p-type conductivity, boron (B), aluminum (Al), gallium (Ga), or the like can be used.

Next, insulating films (also called sidewalls) 254 are formed in contact with side surfaces of the conductive films 240, 242, 244, and 246. Specifically, a single layer or a plurality of layers of a layer containing an inorganic material such as silicon, oxide of silicon, or nitride of silicon, or a layer containing an organic material such as an organic resin is formed by plasma CVD, sputtering, or the like. Then, the insulating film is selectively etched by anisotropic etching mainly in the perpendicular direction, so as to be formed in contact with the side surfaces of the conductive films 240, 242, 244, and 246. Note that the insulating films 254 are used as masks for doping when an LDD (Lightly Doped Drain) region is formed. Further, in this embodiment, the insulating films 254 are also formed in contact with side surfaces of the insulating films or the floating gate electrode formed under the conductive films 240, 242, 244, and 246.

Figure 34A:
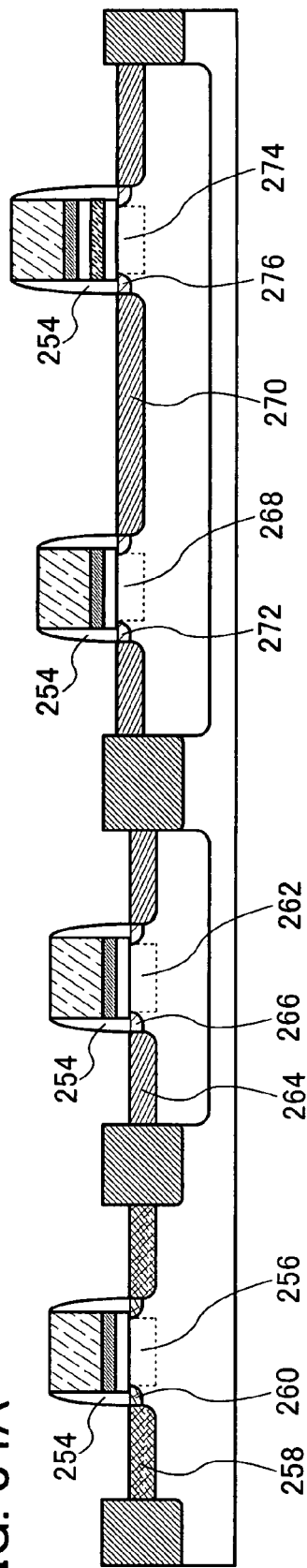
FIGS. 34A and 34B are diagrams showing one example of a manufacturing method of a nonvolatile semiconductor memory device of the present invention.
Figure 38A:
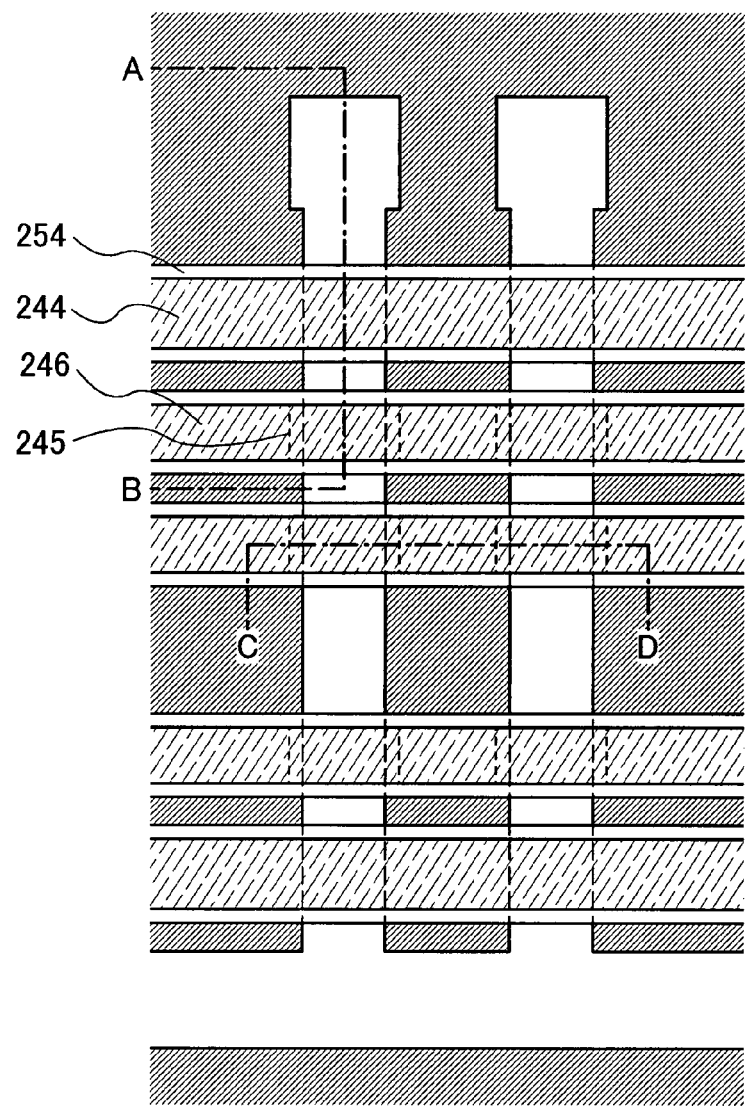
FIGS. 38A and 38B are diagrams each showing one example of a top surface of a nonvolatile semiconductor memory device of the present invention.
Figure 38B:
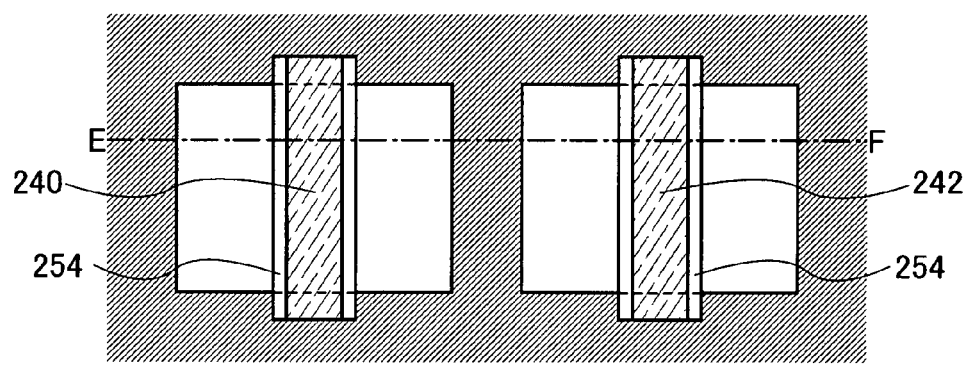
Figure 39A:
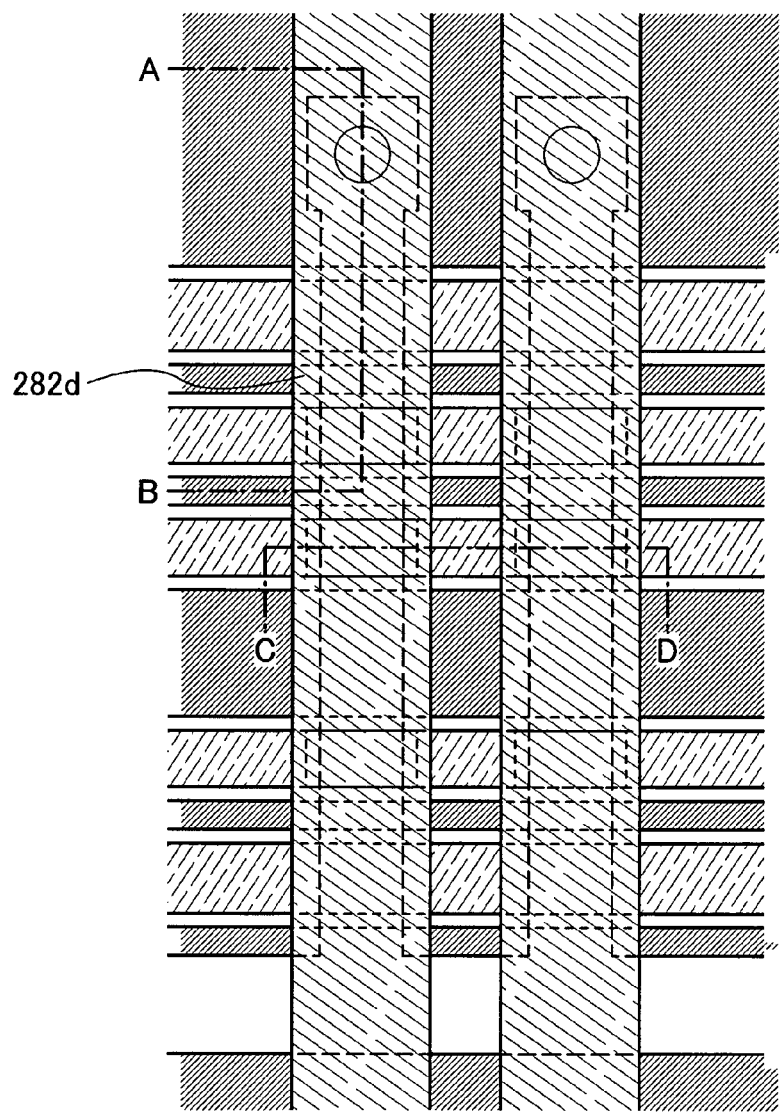
FIGS. 39A and 39B are diagrams each showing one example of a top surface of a nonvolatile semiconductor memory device of the present invention.
Figure 39B:
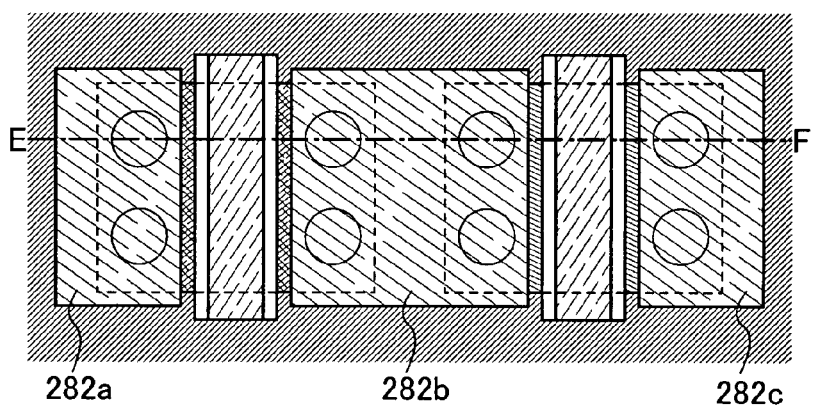

Next, an impurity element is introduced into the regions 212, 213, and 214 in the substrate 200 by using the insulating films 254 and the conductive films 240, 242, 244, and 246 as masks, thereby forming impurity regions functioning as source regions and drain regions (see FIGS. 34A, 38A and 38B). In this embodiment, an impurity element having n-type conductivity is introduced at a high concentration into the regions 213 and 214 in the substrate 200 by using the insulating films 254 and the conductive films 242, 244, and 246 as masks, while an impurity element having p-type conductivity is introduced at a high concentration into the region 212 by using the insulating films 254 and the conductive film 240 as masks.

As a result, in the region 212 in the substrate 200, impurity regions 258 forming source and drain regions, low-concentration impurity regions 260 forming LDD regions, and a channel formation region 256 are formed. In the region 213 in the substrate 200, impurity regions 264 forming source and drain regions, low-concentration impurity regions 266 forming LDD regions, and a channel formation region 262 are formed. In the region 214 in the substrate 200, impurity regions 270 forming source and drain regions, low-concentration impurity regions 272 and 276 forming LDD regions, and channel formation regions 268 and 274 are formed.

Note that in this embodiment, the introduction of the impurity element is performed while exposing the parts of the regions 212, 213, and 214 which are not overlapped with the conductive films 240, 242, 244, and 246. Therefore, the channel formation regions 256, 262, 268, and 274 formed in the regions 212, 213, and 214 in the substrate 200 can be formed in a self-aligned manner with the conductive films 240, 242, 244, and 246.

Figure 34B:
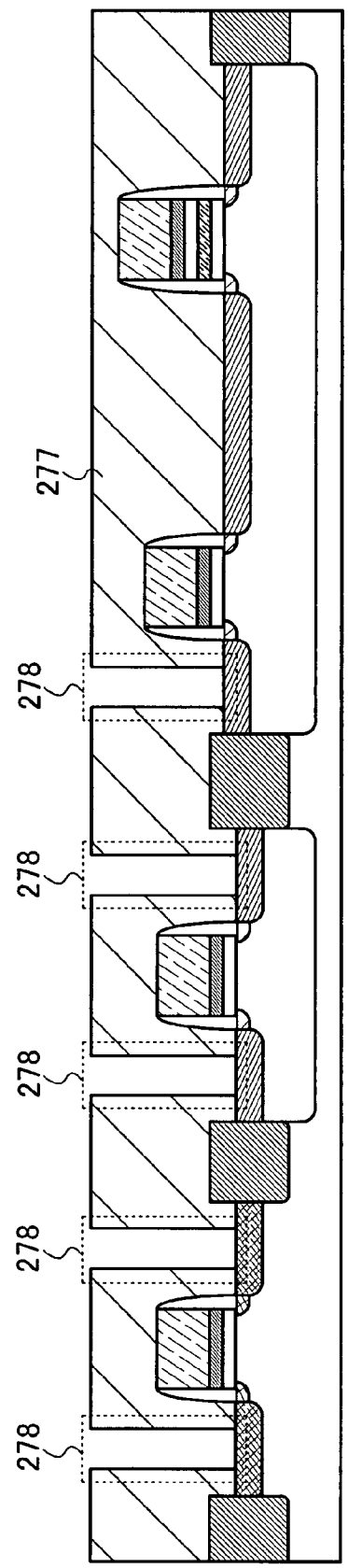
Figure 35:
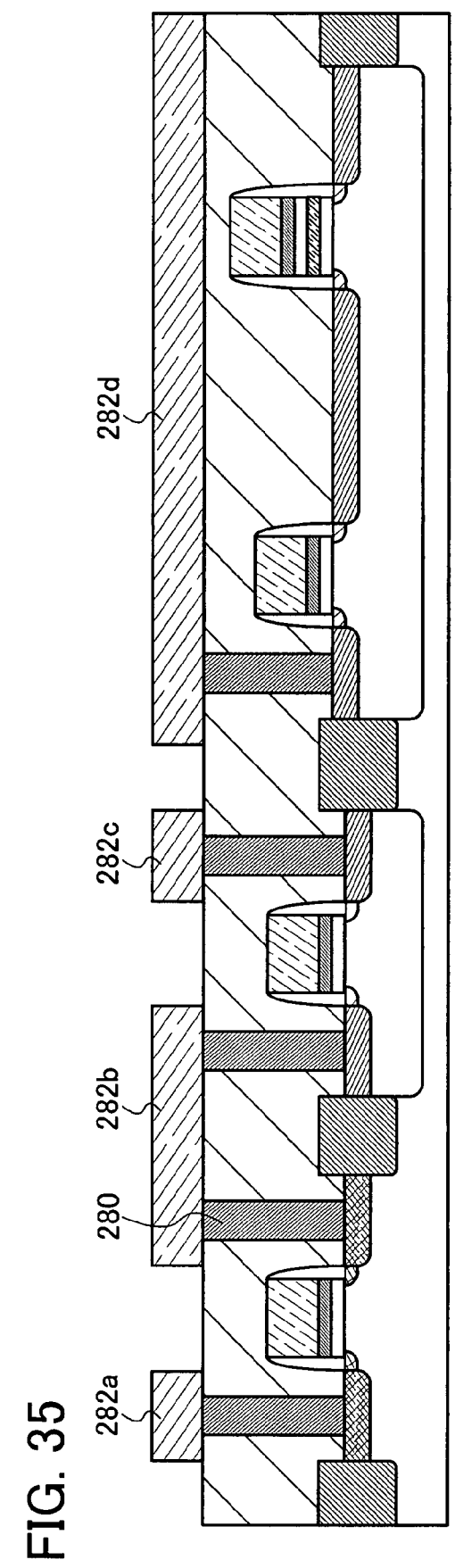
FIG. 35 is a diagram showing one example of a manufacturing method of a nonvolatile semiconductor memory device of the present invention.
Figure 36A:
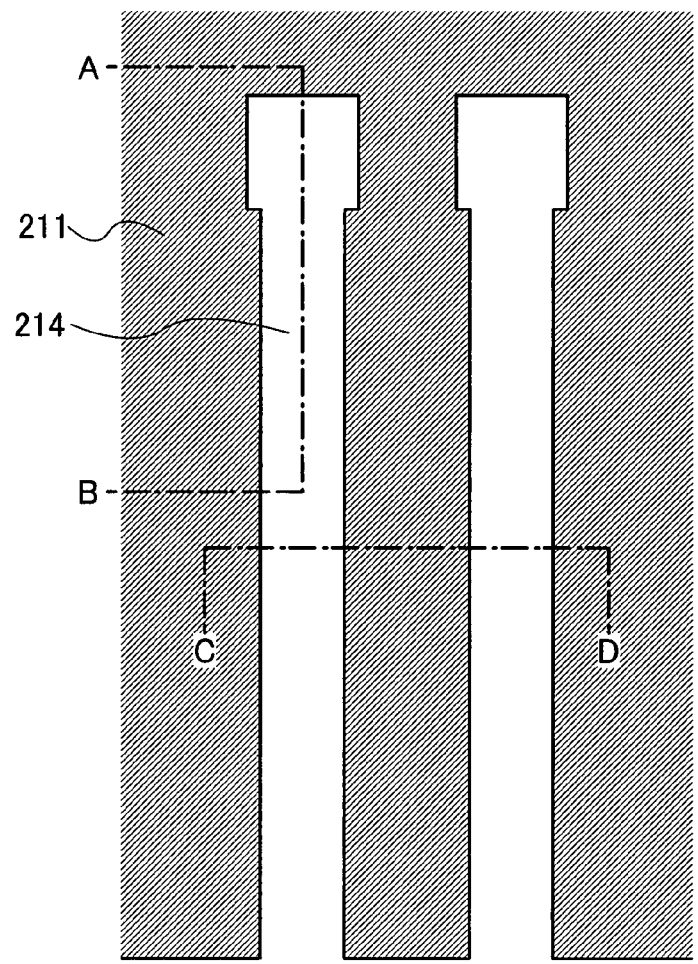
FIGS. 36A and 36B are diagrams each showing one example of a top surface of a nonvolatile semiconductor memory device of the present invention.
Figure 36B:
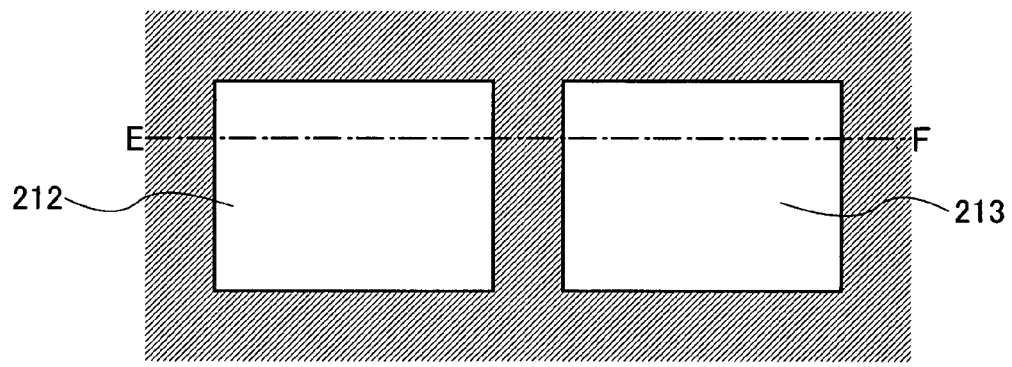

Next, an insulating film 277 is formed so as to cover the insulating films, the conductive films, or the like provided over the regions 212, 213, and 214 in the substrate 200, and openings 278 are formed in the insulating film 277 (see FIG. 34B).

The insulating film 277 can be formed with a single-layer structure or a plural-layer structure of an insulating film containing oxygen or nitrogen of silicon oxide ($SiO_x$), silicon nitride ($SiN_x$), silicon oxynitride ($SiO_xN_y$ (x>y)), or silicon nitride oxide ($SiN_xO_y$ (x>y)); a film containing carbon of DLC (Diamond Like Carbon) or the like; an organic material such as epoxy, polyimide, polyamide, polyvinyl phenol, benzocyclobutene, or acrylic; or a siloxane material such as a siloxane resin by CVD, sputtering, or the like. Note that the siloxane material is a material having a Si—O—Si bond. Siloxane has a skeleton structure containing a bond of silicon (Si) and oxygen (O). As a substituent, an organic group containing at least hydrogen (e.g., an alkyl group or aromatic hydrocarbon) can be used. As a substituent, a fluoro group may also be used. Alternatively, as a substituent, an organic group containing at least hydrogen and a fluoro group may be used.

Next, conductive films 280 are formed in the openings 278 by CVD, and conductive films 282a to 282d are selectively formed over the insulating film 277 so as to electrically connect to the conductive films 280 (see FIGS. 35A, 39A and 39B, and 37C).

Each of the conductive films 280, and 282a to 282d is formed of a single layer or a plurality of layers of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as a main component by CVD, sputtering, or the like. The alloy material containing aluminum as a main component corresponds, for example, to a material containing aluminum as a main component and nickel or a material containing aluminum as a main component, nickel and one or both of carbon and silicon. Each of the conductive films 280, and 282a to 282d preferably employs, for example, a stacked-layer structure of a barrier film, an aluminum-silicon (Al—Si) film, and a barrier film or a stacked-layer structure of a barrier film, an aluminum-silicon (Al—Si) film, a titanium nitride (TiN) film, and a barrier film. Note that the barrier film corresponds to a thin film of titanium, nitride of titanium, molybdenum, or nitride of molybdenum. Aluminum or aluminum-silicon which is low in resistance value and cost is preferable as the material of the conductive films 280, and 282a to 282d. In addition, by providing barrier layers as an upper layer and a lower layer, hillock generation of aluminum or aluminum-silicon can be prevented. Further, by forming a barrier film of titanium which is a highly-reducible element, a thin natural oxide film which may be formed on a crystalline semiconductor film can be reduced so that good contact with the crystalline semiconductor film can be obtained. In this embodiment, each of the conductive films 280, and 282a to 282d can be formed by selective growth of tungsten (W) using CVD.

Through the above-described steps, a nonvolatile semiconductor memory device provided with a p-channel transistor formed in the region 212 in the substrate 200, an n-channel transistor formed in the region 213, and an n-channel transistor and a nonvolatile memory element formed in the region 214 can be obtained.

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied at writing and erasing operations of a nonvolatile memory element. In the nonvolatile memory element, charge injection from the semiconductor substrate into the floating gate is made easy and charges are prevented from being vanished from the floating gate electrode. That is, in the case of operating as a memory, highly efficient writing at a low voltage can be performed and the charge holding property can be improved. This embodiment enables such a nonvolatile semiconductor memory device having such superior effects to be manufactured by consecutive steps.

This embodiment can be implemented combining with the other embodiment mode and embodiments described in this specification.

Embodiment 6

In this embodiment, application examples of a semiconductor device provided with the above-described nonvolatile semiconductor memory device of the present invention capable of data input and data output without contact will be described below with reference to drawings. A semiconductor device capable of data input and data output without contact is referred to as an RFID tag, an ID tag, an IC tag, an IC chip, an RF tag, a wireless tag, an electronic tag, or a wireless chip.

Figure 40A:
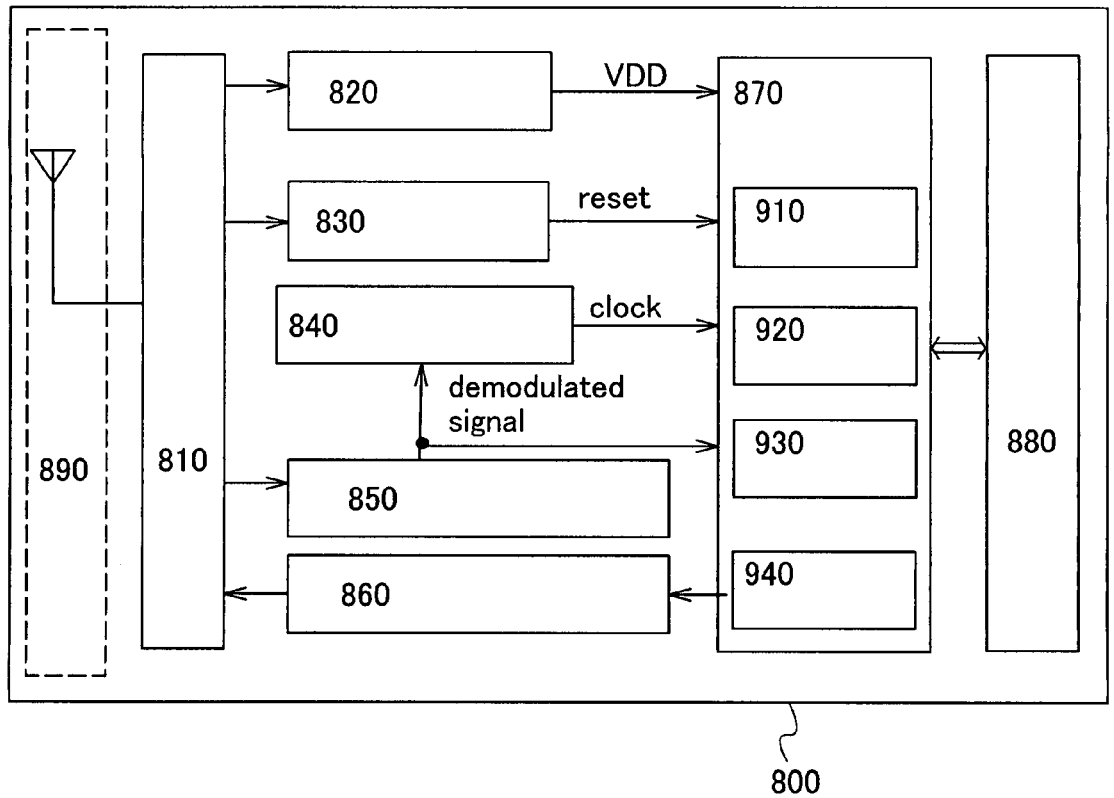
FIGS. 40A to 40C are diagrams for showing examples of a usage mode of a nonvolatile semiconductor memory device of the present invention.

A semiconductor device 800 has a function of communicating data without contact, and includes a high frequency circuit 810, a power supply circuit 820, a reset circuit 830, a clock generation circuit 840, a data demodulation circuit 850, a data modulation circuit 860, a control circuit 870 of controlling other circuits, a memory circuit 880, and an antenna 890 (FIG. 40A). The high frequency circuit 810 is a circuit which receives a signal from the antenna 890. The high frequency circuit 810 outputs a signal received from the data modulation circuit 860 to the antenna 890. The power supply circuit 820 is a circuit which generates a power supply potential from a received signal. The reset circuit 830 is a circuit which generates a reset signal. The clock generation circuit 840 is a circuit which generates various clock signals based on the received signal input from the antenna 890. The data demodulation circuit 850 is a circuit which demodulates a received signal and outputs to the control circuit 870. The data modulation circuit 860 is a circuit which modulates a signal received from the control circuit 870. As the control circuit 870, a code extraction circuit 910, a code determination circuit 920, a CRC determination circuit 930, and an output unit circuit 940 are provided, for example. Note that the code extraction circuit 910 is a circuit which separately extracts a plurality of codes included in an instruction transmitted to the control circuit 870, the code determination circuit 920 is a circuit which compares an extracted code with a code corresponding to a reference so as to determine the content of an instruction, and the CRC circuit 930 is a circuit which detects the presence or absence of a transmission error or the like based on a determined code.

Next, an example of operation of the above-described semiconductor device will be described. First, a radio signal is received by the antenna 890. The radio signal is transmitted to the power supply circuit 820 via the high frequency circuit 810, and a high power supply potential (hereinafter referred to as VDD) is generated. The VDD is supplied to each circuit included in the semiconductor device 800. In addition, a signal transmitted to the data demodulation circuit 850 via the high frequency circuit 810 is demodulated (hereinafter, a demodulated signal). Further, a signal transmitted through the reset circuit 830 and the clock generation circuit 840 via the high frequency circuit 810 and a demodulated signal are transmitted to the control circuit 870. The signals transmitted to the control circuit 870 is analyzed by the code extraction circuit 910, the code determination circuit 920, the CRC determination circuit 930, and the like. Then, in accordance with an analyzed signal, information of the semiconductor device stored in the memory circuit 880 is outputted. The outputted information of the semiconductor device is encoded through the output unit circuit 940. Furthermore, the encoded information of the semiconductor device 800 is transmitted by the antenna 890 as a radio signal through the data modulation circuit 860. Note that a low power supply potential (hereinafter, VSS) is common in the plurality of circuits included in the semiconductor device 800, and VSS can be set to GND. In addition, the nonvolatile semiconductor memory device of the present invention can be applied to the memory circuit 880. Since the driving voltage can be lowered in the nonvolatile semiconductor memory device of the present invention, data communication without contact can be performed at a longer distance.

Thus, data of the semiconductor device can be read by transmitting a signal from a reader/writer to the semiconductor device 800 and receiving a signal transmitted from the semiconductor device 800 by the reader/writer.

In addition, the semiconductor device 800 may supply a power supply voltage to each circuit by an electromagnetic wave without a power source (battery) mounted, or by an electromagnetic wave and a power source (battery) mounted.

Figure 40B:
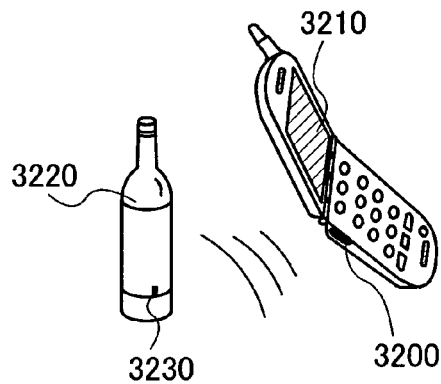
Figure 40C:
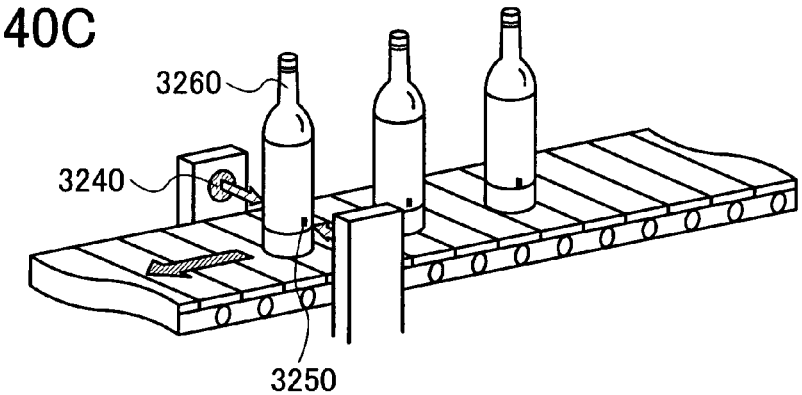

Next, an example of usage of a semiconductor device capable of data input and data output without contact will be described. A side surface of a portable terminal including a display portion 3210 is provided with a reader/writer 3200, and a side surface of an article 3220 is provided with a semiconductor device 3230 (FIG. 40B). When the reader/writer 3200 is held over the semiconductor device 3230 included in the article 3220, information on the article such as a raw material, the place of origin, an inspection result in each production process, the history of distribution, or an explanation of the article is displayed on the display portion 3210. Further, when a product 3260 is transported by a conveyor belt, the product 3260 can be inspected using a reader/writer 3240 and a semiconductor device 3250 provided over the product 3260 (FIG. 40C). Thus, by utilizing the semiconductor device for a system, information can be acquired easily, and improvements in functionality and added value of the system can be achieved.

Furthermore, the nonvolatile semiconductor memory device of the present invention can be used in electronic devices with memories in all fields. As electronic devices to which the nonvolatile semiconductor memory device of the present invention is applied, video cameras, digital cameras, goggle type displays (head-mounted displays), navigation systems, sound reproducing devices (such as car audios or audio components), computers, game machines, mobile information terminals (such as mobile computers, mobile phones, mobile game machines, or electronic books), image reproducing devices equipped with a recording medium (specifically, a device for reproducing a recording medium such as DVD (digital versatile disk), which is equipped with a display for displaying the reproduced image), or the like are given, for example. Specific examples of the electronic devices are shown in FIGS. 41A to 41E.

Figure 41A:
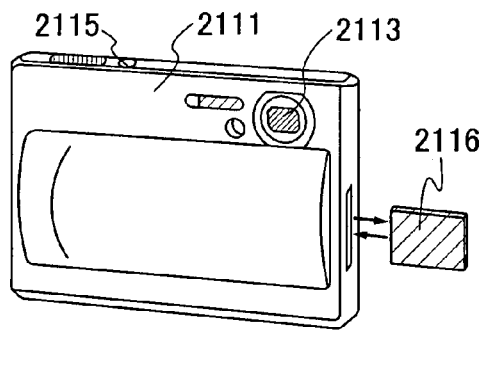
FIGS. 41A to 41E are diagrams each showing one example of a usage mode of a nonvolatile semiconductor memory device of the present invention.
Figure 41B:
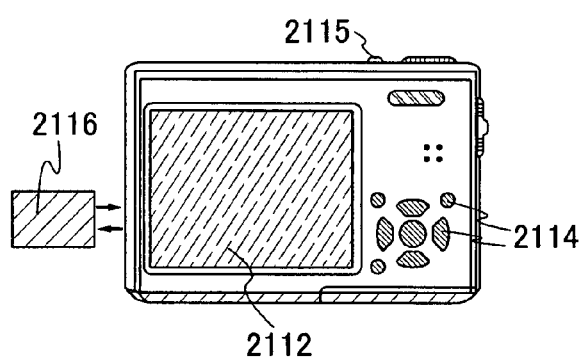

FIGS. 41A and 41B each show a digital camera. FIG. 41B shows the back of the digital camera shown in FIG. 41A. This digital camera includes a chassis 2111, a display portion 2112, a lens 2113, operation keys 2114, a shutter 2115, and the like. In addition, the digital camera includes a removable nonvolatile memory 2116, and the nonvolatile memory 2116 stores data taken by the digital camera. A nonvolatile semiconductor memory device which is formed by using the present invention can be applied to the nonvolatile memory 2116.

Figure 41C:
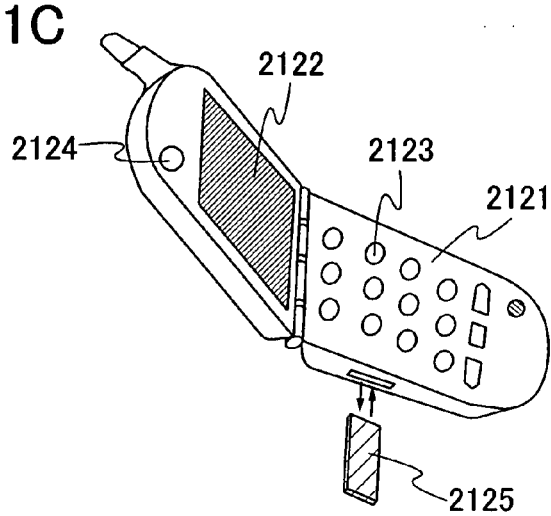

FIG. 41C shows a mobile phone, which is a representative example of a portable terminal. This mobile phone includes a chassis 2121, a display portion 2122, an operation key 2123, and the like. In addition, the mobile phone includes a removable nonvolatile memory 2125, and data such as telephone numbers of the mobile phone, images music data, and the like can be stored in the nonvolatile memory 2125 and reproduced. A nonvolatile semiconductor memory device which is formed by using the present invention can be applied to the nonvolatile memory 2125.

Figure 41D:
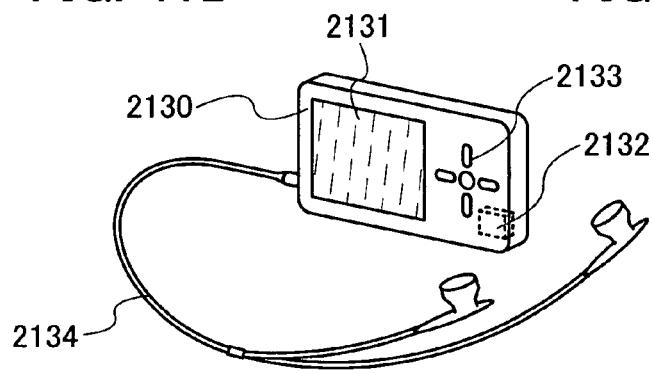

FIG. 41D shows a digital player, which is a representative example of an audio device. The digital player shown in FIG. 41 includes a main body 2130, a display portion 2131, a memory portion 2132, an operating portion 2133, an earphone 2134, and the like. A headphone or a wireless earphone may be used instead of the earphone 2134. For the memory portion 2132, a nonvolatile semiconductor memory device which is formed by using the present invention can be used. For example, by using a NAND nonvolatile memory with a storage capacity of 20 to 200 GB and operating the operating portion 2133, images and sound (music) can be recorded and reproduced. It is to be noted that power consumption can be reduced by displaying white characters on a black background in the display portion 2131. This is particularly effective for a mobile audio device. The nonvolatile semiconductor memory device provided in the memory portion 2132 may be removable.

Figure 41E:
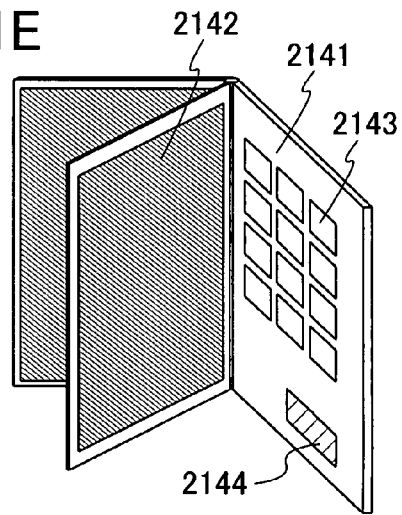

FIG. 41E shows an electronic book (also referred to as electronic paper). This electronic book includes a main body 2141, a display portion 2142, an operation key 2143, and a nonvolatile memory portion 2144. A modem may be incorporated in the main body 2141, or a structure in which information can be transmitted and received wirelessly may be employed. For the nonvolatile memory portion 2144, a nonvolatile semiconductor memory device which is formed by using the present invention can be used. For example, by using a NAND nonvolatile memory with a storage capacity of 20 to 200 GB and operating the operating key 2143, images and sound (music) can be recorded and reproduced. The nonvolatile semiconductor memory device provided in the memory portion 2144 may be removable.

As described above, an application range of the nonvolatile semiconductor memory device of the present invention is extremely wide, and it can be used for electronic devices in every fields as long as the electronic device includes a memory.

This application is based on Japanese Patent Application serial no. 2006077897 filed in Japan Patent Office on 21, Mar. 2006, the entire contents of which are hereby incorporated by reference.

What is claimed is:

1. A nonvolatile semiconductor memory device comprising:
   a semiconductor substrate in which a pair of impurity regions is formed with a channel formation region interposed therebetween; and
   a first insulating layer, a floating gate, a second insulating layer, and a control gate which are overlapped with the channel formation region in the semiconductor substrate,
   wherein the floating gate is a layer comprising germanium or a germanium compound with a thickness of 1 nm or more and 20 nm or less, and
   wherein a band gap of the layer of the floating gate is smaller than a band gap of the channel formation region in the semiconductor substrate.

2. The nonvolatile semiconductor memory device according to claim 1, wherein there is a difference of 0.1 eV or more between the band gap of the channel formation region in the semiconductor substrate and the band gap of the layer of the floating gate.

3. The nonvolatile semiconductor memory device according to claim 1, further comprising a spacer in contact with an upper surface of the semiconductor substrate and side surfaces of the first insulating layer, the floating gate, the second insulating layer, and the control gate.

4. A nonvolatile semiconductor memory device comprising:
   a semiconductor substrate in which a pair of impurity regions is formed with a channel formation region interposed therebetween; and
   a first insulating layer, a floating gate, a second insulating layer, and a control gate which are overlapped with the channel formation region in the semiconductor substrate,
   wherein the floating gate is a layer comprising germanium or a germanium compound with a thickness of 1 nm or more and 20 nm or less, and
   wherein the floating gate has a higher electron affinity than silicon.

5. The nonvolatile semiconductor memory device according to claim 4, further comprising a spacer in contact with an upper surface of the semiconductor substrate and side surfaces of the first insulating layer, the floating gate, the second insulating layer, and the control gate.

6. A nonvolatile semiconductor memory device comprising:
   a semiconductor substrate in which a pair of impurity regions is formed with a channel formation region interposed therebetween; and
   a first insulating layer, a floating gate, a second insulating layer, and a control gate which are overlapped with the channel formation region in the semiconductor substrate,
   wherein the floating gate is a layer comprising germanium or a germanium compound with a thickness of 1 nm or more and 20 nm or less, and
   wherein a barrier energy with respect to electrons of the floating gate, formed from the first insulating layer is higher than a barrier energy with respect to electrons of the channel formation region in the semiconductor substrate, formed from the first insulating layer.

7. The nonvolatile semiconductor memory device according to claim 6, further comprising a spacer in contact with an upper surface of the semiconductor substrate and side surfaces of the first insulating layer, the floating gate, the second insulating layer, and the control gate.

8. A nonvolatile semiconductor memory device comprising:
   a semiconductor substrate having a first conductivity type and including a second conductivity type well, wherein a pair of first conductivity type impurity regions is formed with a channel formation region interposed therebetween in the second conductivity type well; and
   a first insulating layer, a floating gate, a second insulating layer, and a control gate which are overlapped with the channel formation region in the semiconductor substrate,
   wherein the floating gate is a layer comprising germanium or a germanium, compound with a thickness of 1 nm or more and 20 nm or less.

9. The nonvolatile semiconductor memory device according to claim 8, wherein the germanium compound is germanium oxide or germanium nitride.

10. The nonvolatile semiconductor memory device according to claim 8, further comprising a spacer in contact with an upper surface of the semiconductor substrate and side surfaces of the first insulating layer, the floating gate, the second insulating layer, and the control gate.

11. A nonvolatile semiconductor memory device comprising:
   a semiconductor substrate in which a pair of impurity regions is formed with a channel formation region interposed therebetween; and
   a first insulating layer, a floating gate, a second insulating layer, and a control gate which are overlapped with the channel formation region in the semiconductor substrate,
   wherein the floating gate is a layer comprising germanium or a germanium compound with a thickness of 1 nm or more and 20 nm or less, and
   wherein the floating gate is sandwiched between a first silicon nitride layer of the first insulating layer and a second silicon nitride layer of the second insulating layer.

12. The nonvolatile semiconductor memory device according to claim 11, wherein the germanium compound is germanium oxide or germanium nitride.

13. The nonvolatile semiconductor memory device according to claim 11, wherein the floating gate is in contact with the first silicon nitride layer.

14. The nonvolatile semiconductor memory device according to claim 11, further comprising a spacer in contact with an upper surface of the semiconductor substrate and side surfaces of the first insulating layer, the floating gate, the second insulating layer, and the control gate.

15. A nonvolatile semiconductor memory device comprising:
   a semiconductor substrate in which a pair of impurity regions is formed with a channel formation region interposed therebetween; and
   a first insulating layer, a floating gate, a second insulating layer, and a control gate which are overlapped with the channel formation region in the semiconductor substrate,
   wherein the first insulating layer comprises a first silicon oxide layer and a first silicon nitride layer which are sequentially stacked from an upper surface of the semiconductor substrate;
   wherein the floating gate is a layer comprising germanium or a germanium compound with a thickness of 1 nm or more and 20 nm or less, and wherein a band gap of the layer of the floating gate is smaller than a band gap of the channel formation region in the semiconductor substrate.

16. The nonvolatile semiconductor memory device according to claim 15, wherein there is a difference of 0.1 eV or more between the band gap of the channel formation region in the semiconductor substrate and the band gap of the layer of the floating gate.

17. The nonvolatile semiconductor memory device according to claim 15, wherein the floating gate is in contact with the first silicon nitride layer.

18. The nonvolatile semiconductor memory device according to claim 15,
wherein the first silicon oxide layer is formed by oxidizing the semiconductor substrate with plasma treatment, and
wherein the first silicon nitride layer is formed by nitiriding the first silicon oxide layer with plasma treatment.

19. A nonvolatile semiconductor memory device comprising:
a semiconductor substrate in which a pair of impurity regions is formed with a channel formation region interposed therebetween; and
a first insulating layer, a floating gate, a second insulating layer, and a control gate which are overlapped with the channel formation region in the semiconductor substrate,
wherein the first insulating layer comprises a first silicon oxide layer and a first silicon nitride layer which are sequentially stacked from an upper surface of the semiconductor substrate;
wherein the floating gate is a layer comprising germanium or a germanium compound with a thickness of 1 nm or more and 20 nm or less, and
wherein the floating gate has a higher electron affinity than silicon.

20. The nonvolatile semiconductor memory device according to claim 19, wherein the floating gate is in contact with the first silicon nitride layer.

21. The nonvolatile semiconductor memory device according to claim 19,
wherein the first silicon oxide layer is formed by oxidizing the semiconductor substrate with plasma treatment, and
wherein the first silicon nitride layer is formed by nitiriding the first silicon oxide layer with plasma treatment.

22. A nonvolatile semiconductor memory device comprising:
a semiconductor substrate in which a pair of impurity regions is formed with a channel formation region interposed therebetween; and
a first insulating layer, a floating gate, a second insulating layer, and a control gate which are overlapped with the channel formation region in the semiconductor substrate,
wherein the first insulating layer comprises a first silicon oxide layer and a first silicon nitride layer which are sequentially stacked from an upper surface of the semiconductor substrate;
wherein the floating gate is a layer comprising germanium or a germanium compound with a thickness of 1 nm or more and 20 nm or less, and
wherein a barrier energy with respect to electrons of the floating gate, formed from the first silicon oxide layer is higher than a barrier energy with respect to electrons of the channel formation region in the semiconductor substrate, formed from the first silicon oxide layer.

23. The nonvolatile semiconductor memory device according to claim 22, wherein the floating gate is in contact with the first silicon nitride layer.

24. The nonvolatile semiconductor memory device according to claim 22,
wherein the first silicon oxide layer is formed by oxidizing the semiconductor substrate with plasma treatment, and
wherein the first silicon nitride layer is formed by nitiriding the first silicon oxide layer with plasma treatment.

25. A nonvolatile semiconductor memory device comprising:
a semiconductor substrate having a first conductivity type and including a second conductivity type well, wherein a pair of first conductivity type impurity regions is formed with a channel formation region interposed therebetween in the second conductivity type well; and
a first insulating layer, a floating gate, a second insulating layer, and a control gate which are overlapped with the channel formation region in the semiconductor substrate,
wherein the first insulating layer comprises a first silicon oxide layer and a first silicon nitride layer which are sequentially stacked from an upper surface of the semiconductor substrate; and
wherein the floating gate is a layer comprising germanium or a germanium compound with a thickness of 1 nm or more and 20 nm or less.

26. The nonvolatile semiconductor memory device according to claim 25, wherein the germanium compound is germanium oxide or germanium nitride.

27. The nonvolatile semiconductor memory device according to claim 25, wherein the floating gate is in contact with the first silicon nitride layer.

28. The nonvolatile semiconductor memory device according to claim 25,
wherein the first silicon oxide layer is formed by oxidizing the semiconductor substrate with plasma treatment, and
wherein the first silicon nitride layer is formed by nitiriding the first silicon oxide layer with plasma treatment.

29. A nonvolatile semiconductor memory device comprising:
a semiconductor substrate in which a pair of impurity regions is formed with a channel formation region interposed therebetween; and
a first insulating layer, a floating gate, a second insulating layer, and a control gate which are overlapped with the channel formation region in the semiconductor substrate,
wherein the first insulating layer comprises a first silicon oxide layer and a first silicon nitride layer which are sequentially stacked from an upper surface of the semiconductor substrate;
wherein the floating gate is a layer comprising germanium or a germanium compound with a thickness of 1 nm or more and 20 nm or less, and
wherein the floating gate is sandwiched between the first silicon nitride layer of the first insulating layer and a second silicon nitride layer of the second insulating layer.

30. The nonvolatile semiconductor memory device according to claim 29, wherein the germanium compound is germanium oxide or germanium nitride.

31. The nonvolatile semiconductor memory device according to claim 29, wherein the floating gate is in contact with the first silicon nitride layer.

32. The nonvolatile semiconductor memory device according to claim 29, wherein the first silicon oxide layer is formed by oxidizing the semiconductor substrate with plasma treatment, and wherein the first silicon nitride layer is formed by nitiriding the first silicon oxide layer with plasma treatment.

\* \* \* \* \*